(12) United States Patent
Nakagawa et al.

(10) Patent No.: US 7,583,901 B2
(45) Date of Patent: Sep. 1, 2009

(54) ILLUMINATIVE LIGHT COMMUNICATION DEVICE

(75) Inventors: Masao Nakagawa, Kanagawa (JP); Toshihiko Komine, Shizuoka (JP); Shinichiro Haruyama, Kanagawa (JP); Takaaki Ishigure, Kanagawa (JP); Yasuhiro Koike, Kanagawa (JP); Shogo Kitano, Tokyo (JP); Yasuo Sugawara, Kanagawa (JP)

(73) Assignee: Nakagawa Laboratories, Inc., Tokyo (JP)

( * ) Notice: Subject to any disclaimer, the term of this patent is extended or adjusted under 35 U.S.C. 154(b) by 641 days.

(21) Appl. No.: 10/532,250

(22) PCT Filed: Oct. 23, 2003

(86) PCT No.: PCT/JP03/13539

§ 371 (c)(1), (2), (4) Date: Sep. 29, 2005

(87) PCT Pub. No.: WO2004/038962

PCT Pub. Date: May 6, 2004

(65) Prior Publication Data

US 2006/0056855 A1 Mar. 16, 2006

(30) Foreign Application Priority Data

| Oct. 24, 2002 | (JP) | .................. 2002-309557 |
| Dec. 4, 2002 | (JP) | .................. 2002-352075 |
| Jan. 10, 2003 | (JP) | .................. 2003-004560 |
| Feb. 17, 2003 | (JP) | .................. 2003-037746 |
| Mar. 14, 2003 | (JP) | .................. 2003-070673 |
| Mar. 25, 2003 | (JP) | .................. 2003-082278 |
| Mar. 26, 2003 | (JP) | .................. 2003-084819 |
| Jun. 6, 2003 | (JP) | .................. 2003-161859 |
| Jun. 23, 2003 | (JP) | .................. 2003-177816 |
| Sep. 16, 2003 | (JP) | .................. 2003-323052 |

(51) Int. Cl.
*H04B 10/04* (2006.01)

(52) U.S. Cl. ........................................ 398/183
(58) Field of Classification Search .................. 398/183
See application file for complete search history.

(56) References Cited

U.S. PATENT DOCUMENTS

| 5,602,668 | A | 2/1997 | Kuchta |
| 2002/0167701 | A1 | 11/2002 | Hirata |
| 2003/0043972 | A1 | 3/2003 | Burnham et al. |

FOREIGN PATENT DOCUMENTS

DE 41 37 032 A1 5/1993

(Continued)

OTHER PUBLICATIONS

Komine et al., Integrated System of White LED Visible-Light Communication and Electrical Power-Line Communication: Dept. of Information and Computer Science, Faculty of Science and Technology, Keio University, The Institute of Electronics, Information and Communication Engineers, Technical Report of IEICE, pp. 1-6.

(Continued)

*Primary Examiner*—Leslie Pascal
(74) *Attorney, Agent, or Firm*—Rader, Fishman & Grauer, PLLC

(57) ABSTRACT

The present invention has been developed considering the above-described problems and aims to provide various structures and applications for illuminative light communication. According to the first aspect of the prevent invention, a broadcast system includes an LED light source 115 for lighting, a power line 103 that supplies electric power to the LED light source 115, a data modulator 102 that modulates and multiplexes a plurality of pieces of data, superimposes the resulting signal on an electric power waveform, and then transmits the resulting superimposed signal waveform to the power line 103, and a filter 112 that selectively separates one or more of a plurality of pieces of modulated data on the power line so as to control light intensity or blinking of the LED light source. Data is transmitted through changes in light intensity or blinking of the LED light source.

8 Claims, 49 Drawing Sheets

FOREIGN PATENT DOCUMENTS

| | | |
|---|---|---|
| GB | 2 186 457 A | 8/1987 |
| GB | 2186457 A | 8/1987 |
| JP | 56-40334 A | 4/1981 |
| JP | 59-038253 A | 3/1984 |
| JP | 59-058406 A | 4/1984 |
| JP | 59-86971 A | 5/1984 |
| JP | 62-048139 A | 3/1987 |
| JP | 62-173895 A | 7/1987 |
| JP | 63-199303 A | 8/1988 |
| JP | 63-187102 U | 11/1988 |
| JP | 01-122220 A | 5/1989 |
| JP | 02-284533 A | 11/1990 |
| JP | 04-007159 B2 | 1/1992 |
| JP | 05-281393 A | 10/1993 |
| JP | 05-302006 A | 11/1993 |
| JP | 06-325264 A | 11/1994 |
| JP | 06-350534 A | 12/1994 |
| JP | 07-186955 A | 7/1995 |
| JP | 08-067203 A | 3/1996 |
| JP | 08-299475 A | 11/1996 |
| JP | 09-019084 A | 1/1997 |
| JP | 09-44627 A | 2/1997 |
| JP | 09-179512 A | 7/1997 |
| JP | 10-157621 A | 6/1998 |
| JP | 11-088264 A | 3/1999 |
| JP | 11-127170 A | 5/1999 |
| JP | 11-234210 A | 8/1999 |
| JP | 11-266190 A | 9/1999 |
| JP | 2000-029400 A | 1/2000 |
| JP | 2000-67377 A | 3/2000 |
| JP | 2000-081516 A | 3/2000 |
| JP | 2001-036592 A | 2/2001 |
| JP | 2001-052501 A | 2/2001 |
| JP | 2001036592 A * | 2/2001 |
| JP | 2001-243807 A | 9/2001 |
| JP | 2002-508608 A | 3/2002 |
| JP | 2002-144984 A | 5/2002 |
| JP | 2002-190776 A | 7/2002 |
| JP | 2002-261334 A | 9/2002 |
| JP | 2002-274860 A | 9/2002 |
| JP | 2002-290335 A | 10/2002 |
| JP | 2002-344478 A | 11/2002 |
| JP | 2004-265774 A | 9/2004 |
| WO | WO 0163788 A2 * | 8/2001 |
| WO | WO 0215413 A2 * | 2/2002 |
| WO | WO 02/25842 A2 | 3/2002 |

OTHER PUBLICATIONS

T. Komine and M. Nakagawa, "Integrated System of White LED Visible-Light Communication and Power-Line Communication," IEEE Trans. on Consumer Electronics, vol. 49, No. 1, pp. 71-79, Feb. 2003.

European Search Report dated Mar. 14, 2006.

Komine et al.: "Integrated System of White LED Visible-light Communication and Power-line Communication," Personal, Indoor and Mobile Radio Communications, 2002, The 13$^{th}$ IEEE International Symposium on Sep. 15-18, 2002, Piscataway, NJ, USA, IEEE, vol. 4, pp. 1762-1766 (Sep. 2002).

Communication from European Patent Office for application No. 07016825.7 dated Oct. 10, 2007.

Communication from European Patent Office for application No. 07017127.7 dated Oct. 11, 2007.

Communication from European Patent Office for application No. 07017123.6 dated Nov. 6, 2007.

Communication from European Patent Office for application No. 07017125.1 dated Oct. 25, 2007.

Notice of Rejection mailed Mar. 29, 2006.

International Search Report mailed on Feb. 24, 2004.

Communication from Japanese Patent Office for application No. 2003-004560 dated Sep. 17, 2008.

Communication from Japanese Patent Office for application No. 2003-037746 dated Sep. 17, 2008.

European Search Report mailed on Dec. 8, 2005.

PCT/ISA/210 (Jul. 1988).

PCT/ISA/206 (Jul. 1992).

Komine et al., Integrated System of White LED Visible-Light Communication and Electrical Power-Line Communication: Dept. of Information and Computer Science, Faculty of Science and Technology, Keio University, The Institute of Electronics, Information and Communication Engineers, Tecnical Report of IEICE, pp. 1-6, Feb. 2003.

* cited by examiner (A)

ILLUMINATIVE LIGHT

REFLECTED LIGHT (B)

ILLUMINATIVE LIGHT

REFLECTED LIGHT

|  | SWITCH 312 | SWITCH 313 | SWITCH 314 | OPERATION |
|---|---|---|---|---|
| ① | ON | OFF | ON | ILLUMINATION AND INFRARED LIGHT COMMUNICATION |
| ② | ON | OFF | OFF | ILLUMINATION |
| ③ | OFF | ON | ON | ILLUMINATIVE LIGHT COMMUNICATION AND INFRARED LIGHT COMMUNICATION |
| ④ | OFF | ON | OFF | ILLUMINATIVE LIGHT COMMUNICATION |
| ⑤ | OFF | OFF | ON | INFRARED LIGHT COMMUNICATION |
| ⑥ | OFF | OFF | OFF | — |

ILLUMINATIVE LIGHT

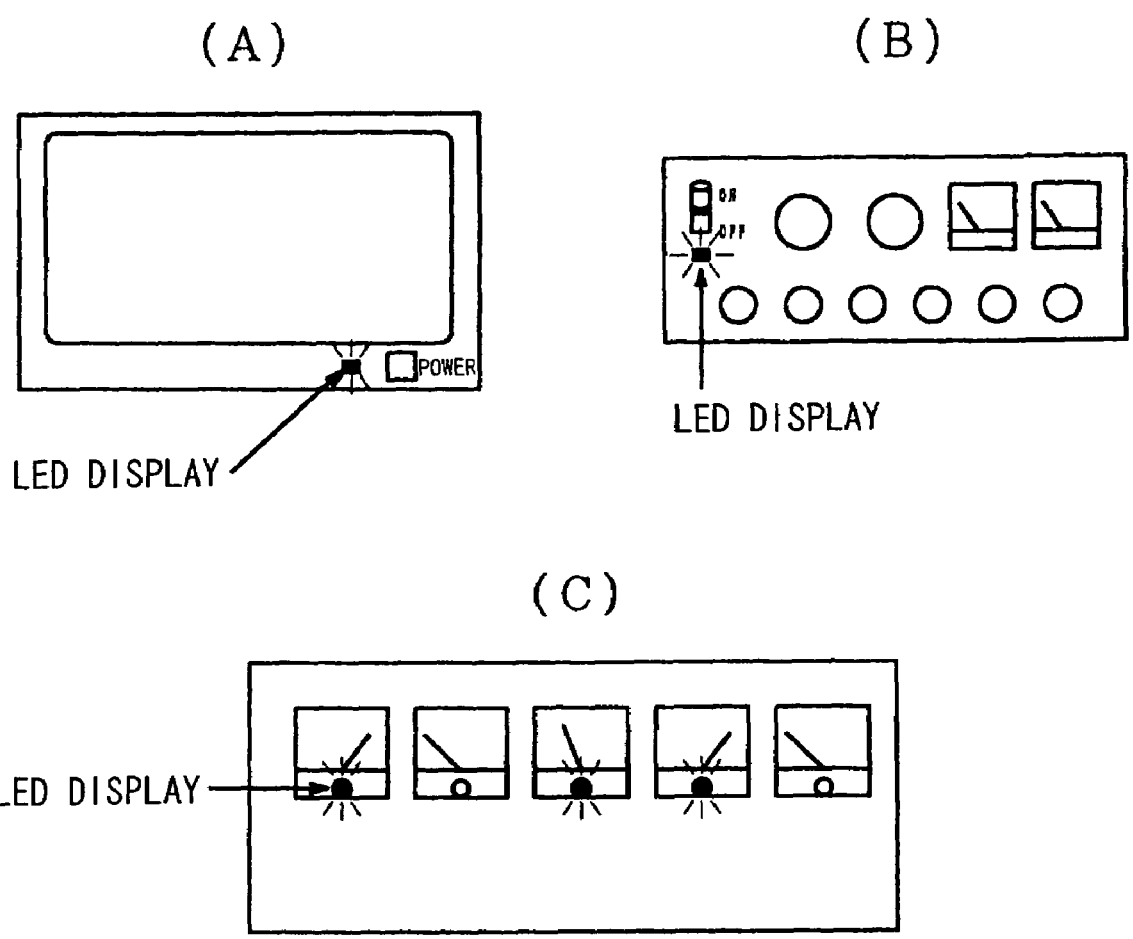
F I G. 53

(A)

LIQUID CRYSTAL PANEL
(LED IS USED AS BACKLIGHT)

(B)

(C)

LED FOR DECORATION

ILLUMINATIVE LIGHT COMMUNICATION DEVICE

TECHNICAL FIELD

The present invention relates to a technology that contributes to illuminative light communication.

BACKGROUND ART

In recent years, a radio wave communication system has become available along with portable terminals. Recently, shorter wavelength infrared rays have been widely used due to available frequency depletion. Other than available frequency depletion, radio waves may influence medical devices or various precision equipment. Moreover, there is fear that infrared rays may adversely influence the human body (e.g., eyes). As a result, optical communication is in the spotlight as a safe communication method.

Meanwhile, white LEDs are developed owing to the success of development of blue LEDs. The features of white LEDs are: extremely lower power consumption than that of conventional incandescent lamps or fluorescent lamps, small size, and long life. Accordingly, use of white LEDs as a illuminative light source is considered. Another feature of white LEDs is a fast response speed relative to supplied power. Paying attention to these features, a study of electrically controlling blinking or light intensity and thereby transferring a signal has been conducted.

A study of integration of such signal transfer using white LED lights with the aforementioned power-line communication system has been conducted. For example, a proposal regarding that study has been disclosed in 'INTEGRATED SYSTEM OF WHITE LED VISIBLE-LIGHT COMMUNICATION AND POWER-LINE COMMUNICATION' written by inventors: T. Komine, Y Tanaka, and M. Nakagawa, Institute of Electronics, Information, and Communication Engineers Technical Research Report, The Institute of Electronics, Information, and Communication Engineers, Mar. 12, 2002, Vol. 101, No. 726, pp. 99-104. Since such system utilizes lights, there are no effects on the human body, allowing safe communication. In addition, other applications are expected.

DISCLOSURE OF THE INVENTION

The present invention has been developed considering the above-described problems and aims to provide various structures and applications for illuminative light communication.

A first aspect of the present invention aims to provide a broadcast system that broadcasts a great number of pieces of data through power line communication and illuminative light signal communication using LEDs, and to provide an electric bulb for lighting that is used for such broadcast system.

According to such objective, the broadcast system includes an LED light source for lighting, a power line that supplies electric power to the LED light source, a data modulator that modulates and multiplexes multiple pieces of data, superimposes the resulting signal on an electric power waveform, and then transmits the resulting superimposed signal waveform to the power line, and a filter unit that selectively separates one or more of multiple pieces of modulated data on the power line so as to control light intensity or blinking of the LED light source. Data is transmitted through changes in light intensity or blinking of the LED light source.

According to the first aspect of the present invention, multiple pieces of data are superimposed on a power line and then transmitted as described above. For example, control of light intensity or blinking of an LED source in accordance with data selected by a selector, which is provided for selecting data as a filter unit, allows selective optical data broadcast from the LED source. A structure such that data is selected using a physical switch or selected in conformity with instruction data on a power line, or selected by a receiver is possible.

More specifically, a structure such that a data modulator frequency division multiplexes multiple pieces of data, and transmits the resulting data via the power line and that the filter unit selects one of multiple band pass filters with different frequency bandwidths, which constitute a filter unit, and separates data is possible. Alternatively, a structure such that the data modulator time division multiplexes multiple pieces of data, adds tag data to the resulting divided data, and transmits the resulting data and that the filter unit identifies data based on the tag data and selectively separates data is possible.

An electric bulb, which is used for such broadcast system, receives supplied electric power, and emits light for lighting. This electric bulb includes an LED light source for lighting, and a filter unit that selectively separates one or more of multiple pieces of modulated data, which is superimposed on supplied electric power, and controls light intensity or blinking of the LED light source. Available electric power is AC power. In the case of using AC power, an AC-DC converter is provided converting AC power to DC power. Data component separated by the filter unit is then superimposed on the DC power, which is provided by the AC-DC converter, and the LED light source is driven by the resulting superimposed DC power. Data on the power line can be optically transmitted merely by replacing an available electric bulb with such electric bulb. Accordingly, data can be broadcast using existing lighting devices as is without any electrical work, such as replacement of a lighting device.

A second aspect of the present invention aims to provide an illuminative light communication device that establishes a downlink using illuminative light, and also allows uplink optical (including infrared rays) communication, or provides bi-directional optical communication.

According to such objective, an illuminative light communication device, which is positioned on the transmission side for a downlink and positioned on the reception side for an uplink, includes a lighting unit that emits light for lighting a modulator that controls blinking or light intensity of the lighting unit in accordance with data, thereby modulating the emitted light, and a light receiving unit that receives modulated light transmitted from the outside. Data is transmitted via the light emitted by the lighting unit, and the data is received by the light receiving unit. This structure allows establishment of a downlink using illuminative light and an optical uplink by the light receiving unit, thereby allowing bi-directional optical communication.

Note that the lighting unit can be made up of one or multiple LEDs, allowing establishment of a downlink using illuminative light based on the characteristics of the LEDs. In addition, the light receiving unit can receive infrared light or visible light as the modulated light. Furthermore, the light receiving unit may be a two-dimensional sensor. This allows effective removal of noise such as scattered light using received modulated light signals and the other signals. In addition, modulated light can be separated and received from multiple positions using an optical system such as a lens, and uplink data can be received from multiple light emitting sources.

An illuminative light communication device, which is positioned on the transmission side for a downlink and positioned on the reception side for an uplink, includes a light receiving unit that receives illuminative light modulated in accordance with data, thereby capturing the data, and a light emitting unit that emits light modulated in accordance with data to be transmitted. With such structure, the light receiving unit receives downlink illuminative light while the light emitting unit establishes an optical uplink. This allows bi-directional optical communication. A mobile terminal, for example, can carry out bi-directional communication.

Light emitted by the light emitting unit may be infrared light or visible light. In addition, the light emitting unit includes a tracking unit that guides the emitted light to an external light receiving unit, thereby allowing further reliable uplink communication.

An illuminative light communication device, which is positioned on the transmission side for a downlink and positioned on the reception side for an uplink, includes a light receiving unit that receives illuminative light modulated in accordance with data, thereby capturing the data, and a reflecting and modulating unit that reflects the illuminative light and transmits reflected light modulated in accordance with data to be transmitted. Even this structure can provide bi-directional optical communication, where a downlink can be established using illuminative light while an uplink can be established using illuminative reflected light. Furthermore, as described above, illuminative light has very large electric power, and when it is used for an uplink, further reliable communication is possible. In addition, since a new light emitting unit is unnecessary, power consumption can be suppressed to a degree of electric power provided for modulation, which considerably contributes to power saving.

The reflecting and modulating unit may include one or multiple corner cube reflectors (hereafter, referred to as CCR). The CCR is characterized in that incident light is reflected in the same incident direction, and transmits reflected light to a light source of the illuminative light used for a downlink. The reflected light is used for establishing an uplink. With such structure, a tracking unit for guiding light used for an uplink to a light receiving unit is unnecessary. In addition, since incident light from multiple light sources can be reflected in the same direction, respectively, when downlink data is received using illuminative light from multiple light sources, reflected light for an uplink can be transmitted to the respective light sources, thereby allowing reduction in communication error, and improvement in communication quality.

Note that an optical shutter can be used to carry out modulation through controlling reflected light to pass through or be shut off. Alternatively, modulation can be carried out through deforming a reflecting surface of the CCR to change the reflection characteristics of the CCR.

The reflecting and modulating unit may be made up of a corner cube modulation array is made up of multiple CCRs, a lens that is deployed to form an image on the corner cube modulation array, and a modulator that controls every one or every group of the CCRs in the corner cube modulation array to modulate reflected light. As described above, the CCR is characterized in that incident light is reflected in the same incident direction, the CCR on which an image is formed by a light source of illuminative light transmits reflected light to that light source. If there is multiple light sources, the CCRs on which images are formed by the respective light sources transmit reflected light to the corresponding light sources. Therefore, parallel transmission is possible through modulating reflected light for every one or every group of the CCRs corresponding to the respective light sources.

Note that a structure such that an optical shutter is used as a modulator that controls every one or every group of the CCRs to modulate reflected light, or a structure such that the modulator modulates through deforming a reflecting surface of the CCR is possible.

A third aspect of the present invention aims to provide an illuminative light communication device, which allows communication even without lighting and effectively utilizes infrared light data communication, and a lighting device preferable for such illuminative light communication device.

According to such objective, the illuminative light communication device includes a lighting unit that emits light for lighting, a modulator that controls blinking or light intensity of the lighting unit in accordance with data, thereby modulating the emitted light, a communicating unit that transmits the data through optical communication other than illuminative light communication, and a switch that changes over respective operations of the modulator and the communicating unit based on whether the lighting unit is on or off. The switch changes over such that the communicating unit can operate while the lighting unit is off. The communicating unit may be structured so as to transmit data through infrared light data communication.

As described above, in addition to illuminative light communication that is made possible by the lighting unit outputting illuminative light modulated by the modulator, illuminative light communication is carried out while the lighting unit is on, using a conventional communication unit such as infrared light communication unit. On the other hand, without lighting, communication is carried out using a communication unit such as infrared light data communication. This allows continuous communication even without lighting.

Note that when carrying out infrared light data communication, an infrared light emitting device that can selectively emit infrared light can be included in multiple LED devices in the lighting unit. As a result, it is unnecessary to separately provide another communicating unit to be used without lighting, and an indoor lighting unit that is deployed so as to prevent generation of a shadow can be used for infrared light data communication. This allows reduction in influences of shadowing, and stable infrared light data communication.

An illuminative light communication device includes a lighting unit that emits light for lighting and a modulator that controls blinking or light intensity of the lighting unit in accordance with data, thereby modulating the emitted light. In response to an on-switching instruction, the modulator modulates in accordance with the data while supplying sufficient electric power for lighting to the lighting unit while in response to an off-switching instruction, the modulator modulates in accordance with the data to allow the lighting unit to blink a number of times necessary for communication.

This structure allows communication with lighting with sufficient light intensity for lighting, and communication using emitted light only required for the communication when light intensity is unnecessary or without lighting. As a result, users can turn the lighting either on or off, and optical communication is possible even without lighting.

Furthermore, a lighting device for emitting illuminative light includes an illuminative light emitting device that emits white light for lighting and an infrared light emitting device that emits infrared light for infrared data communication. The illuminative light emitting device can be controlled for modulation to carry out illuminative light communication independently of the infrared light emitting device. This allows illuminative light communication with lighting by illuminative light emitted from the illuminative light emitting device, and infrared light data communication without lighting by infrared light emitted from the infrared light emitting device. As a result, communication is possible even without lighting, although communication could not be carried out through conventional illuminative light communication without lighting. In addition, an additional communicating unit is not needed for infrared light data communication, influences of shadowing can be reduced and stable infrared light data communication can be carried out, thereby increasing the possibility of infrared light data communication.

Note that the lighting device can be structured of a red, a blue, and a green light emitting device in line with the infrared light emitting devices. Alternatively, it may be structured of infrared light emitting devices in line with illuminative light emitting devices, which are made up of a blue or an ultraviolet light emitting device and fluorescer provided surrounding the light emitting devices.

A fourth aspect of the present invention aims to provide an illuminative light communication system that allows high-quality communication and increase in a communication rate using a lighting device with an optical fiber.

According to such objective, an illuminative light communication system for transmitting data using illuminative light includes a light source that emits light for lighting, a light source control unit that controls blinking or light intensity of the light source in accordance with data to be transmitted and controls the light source to emit modulated light, an optical fiber that transmits the modulated light emitted from the light source, and a light scatterer that is provided at an end of the optical fiber, scatters the modulated light transmitted through the optical fiber, and emits the scattered, modulated light. The scattered light emitted from the light scatterer is used for lighting and transmission of the data.

The optical fiber and the light scatterer can be made of a plastic material. The optical fiber and the light scatterer can be integrated into one.

The light source that emits an ultraviolet ray or a blue light can be used; and fluorescer can be mixed in the light scatterer to carry out lighting and communication by the fluorescer. Alternatively, multiple light sources that emit different color lights, respectively, can be provided. In this case, the light source control unit can control blinking or light intensity of at least one of the light sources.

A fifth aspect of the present invention aims to provide an illuminative light communication system that does not require electrical work for providing a cable or an optical fiber, and prevents problems such as restriction on bandwidths, radio wave radiation, and superimposition of noise from developing, which is different than power line communication, and a lighting device and an illuminative light source used for such illuminative light communication system.

According to such objective, an illuminative light communication system that carries out communication using illuminative light includes multiple lighting units that emit light for lighting and an optical communication unit that optically transmits data through the air to the lighting units. The lighting units receive light from the optical communication unit, thereby capturing data, and modulate emitted light in accordance with the data. According to such objective, an illuminative light communication system includes multiple lighting units that emit light for lighting; and an optical communication unit that optically transmits data through the air to one or more of the lighting units. The one or more of the lighting units receive light from the optical communication unit, thereby capturing data, and optically transmit the data through the air to another lighting unit. Each lighting unit modulates emitted light in accordance with the data received from the optical communication unit or another lighting unit and transmits the data via the modulated, emitted light.

With such structure, data to be transmitted to the lighting unit that allows communication through modulating illuminative light is transmitted through the air from the optical communication unit or another peripheral lighting unit. When using an optical fiber for optical communication, it is necessary to provide the optical fiber. On the other hand, it is unnecessary when carrying out optical communication via the air. As a result, the illuminative light communication system can be constructed very easily. In addition, different than power line communication, problems such as restriction on bandwidths and radio wave radiation do not develop.

Note that the plurality of lighting units allows optical bi-directional communication through the air with the optical communication unit or another lighting unit. In addition, since the plurality of lighting units includes a light receiving unit that receives light modulated in accordance with data emitted from a terminal device, which receives emitted light and thereby receives data, optical bi-directional communication between the terminal device and the plurality of lighting units is possible. Furthermore, the plurality of lighting units uses a semiconductor light emitting device such as an LED as an illuminative light source. The plurality of lighting units can be an indoor illumination lamp or a street lamp.

A lighting device used for such aforementioned illuminative light communication system includes one or multiple illuminative light emitting units that emits light for lighting, an optical transmitting/receiving unit for optically communicating through the air with a light emitting unit provided in a device, and a control unit that controls the illuminative light emitting unit in accordance with data received by the light transmitting/receiving unit, so as to modulate light emitted from the illuminative light emitting unit in accordance with the data, thereby transmitting the data.

With such structure, since there is no need to provide a cable or an optical fiber as described above, an illuminative light communication system can be constructed through simple electrical work such as replacement of an existing lighting device with a lighting device, according to the present invention.

Note that the optical transmitting/receiving unit is deployed in multiple positions in different communication directions, and data received by a certain light transmitting/receiving unit can be optically transmitted through the air from another light transmitting/receiving unit to the device. As a result, the lighting devices can be deployed freely, and data transmission is possible regardless of the positions of the lighting devices. In addition, the light transmitting/receiving unit allows bi-directional optical communication through the air with another device. Furthermore, since the plurality of lighting units includes a light receiving unit that receives light modulated in accordance with data emitted from a terminal device, which receives emitted light and thereby receives data, optical bi-directional communication among the terminal device and the plurality of lighting units is possible. The plurality of illuminative light emitting units uses a semiconductor light emitting device such as an LED as an illuminative light source. The plurality of lighting units can be an indoor illumination lamp or a street lamp.

Furthermore, an illuminative light source includes one or multiple illuminative light emitting devices that emits light for lighting, an optical transmitting/receiving unit for optically communicating through the air with a light emitting unit provided in another lighting unit, and a control unit that controls the illuminative light emitting device in accordance with data received by the optical transmitting/receiving unit, so as to modulate light emitted by the illuminative light emitting device in accordance with the data, thereby transmitting the data.

In this manner, by providing the optical transmitting/receiving unit and the control unit in the illuminative light source, construction of an illuminative light communication system using the existing lighting device, merely with simple electrical work such as replacement of a fluorescent lamp or an electric bulb with an illuminative light source according to the present invention becomes possible.

The optical transmitting/receiving unit is deployed in multiple positions in different communication directions. Data received by a certain light transmitting/receiving unit can be optically transmitted through the air from another light transmitting/receiving unit to another device. In addition, by structuring the optical transmitting/receiving unit so as to be able to change an optical transmission/reception direction, deployment of them on arbitrarily positioned lighting devices becomes possible. Furthermore, as with a lighting device using a fluorescent lamp, the optical transmitting/receiving unit is deployed in plural; one is used, in the case of the plurality of illuminative light emitting devices being arranged, to allow optical communication through the air with an adjacent illuminative light source, while the other is used to allow optical communication through the air with another illuminative light source provided in another lighting unit.

With such an illuminative light source, the optical transmitting/receiving unit can be structured allowing bi-directional optical communication through the air with another lighting unit. Furthermore, since the plurality of lighting units includes a light receiving unit that receives light modulated in accordance with data emitted from a terminal device, which receives emitted light and thereby receives data, optical bi-directional communication among the terminal device and the plurality of lighting units is possible. The illuminative light emitting device may be one or multiple semiconductor light emitting devices such as LEDs. Note that the illuminative light source may be an indoor illumination lamp or an outdoor street lamp.

A first exemplary application, according to a sixth aspect of the present invention, aims to use a semiconductor light emitting device, such as an LED, which is used as an indicator for directly showing light for a person, for communication among devices.

According to such an objective, an electrical apparatus having a semiconductor light emitting device for display includes a control unit that controls blinking or light intensity of the semiconductor light emitting device in accordance with data; wherein data is transmitted using the semiconductor light emitting device for display. For example, an LED light source for indicating a device status, and an LED light source for lighting a display unit have been provided based on their applications. Use of this semiconductor light emitting device for communication among devices allows data transmission without providing additional communicating unit. In addition, an electrical apparatus including an LED light source for decoration can transmit data in addition to decoration or original function. Furthermore, since there are no additional components, provision of the electrical apparatus with the same design as that of the conventional electrical apparatus in appearance is possible.

In the case of transmitting data using a semiconductor light emitting device for display, data can be transmitted from the main apparatus to another apparatus. In order to receive data, for example, an infrared light receiving unit widely used in a television set or a video cassette recorder may be used as is. Alternatively, a light receiving unit that receives light from the outside may be provided, receiving data transmitted from another apparatus through modulating the light. This allows optical communication for both transmitting and receiving data.

A controller for instructing the above-described electrical apparatus having infrared light receiving unit includes a light receiving unit that receives emitted light modulated in accordance with data transmitted from the electrical apparatus, thereby receiving the transmitted data, and an infrared light data communication unit for transmitting instruction data to the electrical apparatus. With such structure, data is received by light emitted from the semiconductor light emitting device for display provided in the electrical apparatus, and data is transmitted to the electrical apparatus via infrared rays, thereby instructing the electrical apparatus as described above.

A controller for instructing an electrical apparatus including the above-described light receiving unit further includes a semiconductor light emitting device, and a modulator that controls blinking or light intensity of the semiconductor light emitting device in conformity with instruction data to be transmitted to the electrical apparatus. In particular, when an optical system for collecting light emitted from the semiconductor light emitting device is provided, light for data transmission is transmitted as a spotlight to an electrical apparatus. Spotlight can be guided to an electrical apparatus to which data is to be transmitted as if turning the flash light toward a target, allowing reliable and selective optical data transmission to an electrical apparatus.

Note that in this case, provision of a light receiving unit that receives light emitted from an electrical apparatus and modulated in accordance with transmitted data allows optical data communication.

In addition, the controller with a light receiving unit may include an optical system for collecting light into a light receiving unit. With such configuration, even when there are multiple external light emitting sources, the data transmitted from an external light emitting source can be selectively received.

A second exemplary application, according to a seventh aspect of the present invention, aims to provide an emergency light including a light source having excellent electric power efficiency and long operating life, a wireless emergency light data transmission system that uses the emergency light as a data transmission source while in an emergency, and an emergency light that is used in the system.

To attain this objective, an emergency light, which is embedded with a battery and turns a light source on while in an emergency without electric power supplied from an external power source, is characterized by the light source made up of LEDs. The feature of LEDs or high electric power efficiency allows suppression of battery consumption. Reduced battery size allows reduction in device size. Moreover, extended operating life as to light emitting time is provided. Moreover, since LEDs have a long operating life, intervals between maintenance such as light source replacement intervals can be extended, which allows reduction in maintenance cost. Furthermore, since LEDs are highly crashproof, an available emergency light that will not be damaged due to a devastating disaster can be provided.

The emergency light further includes a storage unit that is stored with data to be transmitted while in an emergency and an optical modulator that controls electric power supplied to the LEDs in accordance with data stored in the storage unit, so as for the LEDs to change light intensity or blink. As described above, since LEDs have an excellent response speed characteristic, modulation based on such data is possible, and light for displaying can be used for data transmission as is. With such structure, the emergency light, which is conventionally used merely for indicating an emergency exit and an emergency staircase, can be used as a data source while in an emergency. At this time, since the light source, which functions as an emergency light, is used as is, it never consumes large electric power as opposed to the case of voice output. As a result, most of electric power consumption is expected to be an amount for only the light source. As a result, there is no need to provide an additional large-capacity battery for transmitting data, thereby allowing the light source to operate as a data source with a battery provided for display. Alternatively, a demodulator may be provided, so as to separate data, which is superimposed on a voltage of an external power source and then transmitted, while being driven by an external power source while not at a time other than in an emergency. Data provided from the modulator is then stored in a storage unit. Such a structure allows distribution of data, which is to be transmitted while in an emergency, to respective emergency lights via the power line while not in an emergency. As a result, data to be transmitted while in an emergency can be easily set and updated.

According to an aspect of the present invention, a wireless emergency light data transmission system for transmitting data to a terminal using an emergency light, which has a light source turned on while in an emergency without electric power supplied from an external power source, is provided. In the wireless emergency light data transmission system, the emergency light includes a battery, an LED that is used as a light source, a storage unit that is stored with data to be transmitted while in an emergency, and an optical modulator that controls electric power supplied to the LED in accordance with data stored in the storage unit, thereby controlling light intensity or blinking of the LED. The terminal includes a light receiving unit that receives light emitted from the LED in the emergency light and converts it to an electric signal, and a demodulator that demodulates the electric signal output from the light receiving unit, thereby capturing the data. This structure allows optical data transmission from an emergency light to a terminal while in an emergency. Various pieces of data such as escape routes for evacuees, informing destination, or a map and descriptive text data for floors can be displayed on the terminal, which allows smoothly guiding users to evacuate while in an emergency.

A third exemplary application according an the eighth aspect of the present invention is provided allowing usage of multiple lighting units deployed along the road for applications other than lighting so as to provide smooth traffic and various pieces of information to road users.

To attain that goal, a road lighting control system and a road lighting control method for lighting the road using multiple lighting units provided along the road are provided. With them, control of blinking, light intensity, or colors of lights emitted by respective lighting unit groups is carried out; where each of the lighting unit groups is made up of one or more of lighting units.

For example, when an abnormality such as a traffic accident occurs on the road, abnormality detecting units, which are provided along the road, detect occurrence of an abnormality on the road automatically or through a user's manual operation. A lighting unit group to be controlled to operate is then specified according to the abnormality detection results. The lighting unit group blinks or changes light intensity or color of light so as to notify of occurrence of an abnormality. The lighting units are deployed along the road at the intervals of several tens of meters, thereby notifying road users of detailed information as to occurrence of an abnormality. Since the lighting units are provided at a high position, they can be recognized from a distance. As a result, occurrence of an abnormality can be widely informed.

In addition, when the lighting units are made up of semiconductor light emitting devices, since the semiconductor light emitting devices have a fast response characteristic, data can be transmitted via illuminative light by controlling the respective semiconductor light emitting devices to emit light modulated in accordance with data. Since illuminative light has extremely large electric power, illuminative light data transmission allows reliable communication. In addition, in general, the lighting units are deployed such that the road cannot be dark. Therefore, communication can be normally carried out without interruption as long as the same data is transmitted from multiple lighting units. On the other hand, an area lit by a single lighting unit is not very large. Therefore, communication in every relatively narrow area is made possible by changing data to be transmitted for every lighting unit group, which is made up of one or more lighting units.

Furthermore, in the case of transmitting data from the lighting units using semiconductor light emitting devices as described above, multiple semiconductor light emitting devices should be provided on a bent substrate. This structure allows increase in light intensity for a distant area apart from the lighting units along the road, thereby providing high quality communication. More specifically, it is further effective to light a distant region using lighting units, each having a bent substrate, which has an end with narrowed directivity.

A fourth exemplary application, according to a ninth aspect of the present invention, aims to provide a mobile optical communication system and a mobile optical communication method allowing high-quality mobile communication and increase in a communication rate.

To attain the goal, the mobile optical communication system for transmitting data to a mobile unit has a leaky optical fiber, which is deployed along a movement route of the mobile unit and transmits an optical signal modulated in accordance with data with leakage thereof out of the surface. The mobile unit includes a light receiving unit that is deployed almost facing the leaky optical fiber and receives an optical signal leaked out of the leaky optical fiber, and a demodulator that demodulates an optical signal received by the light receiving unit, thereby capturing data. The data is optically transmitted to the mobile unit through the leaky optical fiber.

Furthermore, according a mobile optical communication method for transmitting data to a mobile unit, a leaky optical fiber that leaks an optical signal out of the surface is deployed along a movement route of the mobile unit. A light receiving unit that receives an optical signal leaked out of the leaky optical fiber is deployed in the mobile unit so as to almost face the leaky optical fiber. A demodulator that demodulates an optical signal received by the light receiving unit, thereby capturing data, is provided. With this structure, data is optically transmitted to the mobile unit via the leaky optical fiber by transmitting an optical signal modulated in accordance with data through the leaky optical fiber with leakage of the optical signal out of the surface of the leaky optical fiber, receiving the optical signal leaked out of the surface of the leaky optical fiber by the light receiving unit in the mobile unit, and demodulating the received optical signal by the demodulator, thereby capturing data. As a result, data is optically transmitted via the leaky optical fiber.

In the case of transmitting data to the mobile unit, leakage of an optical signal out of the leaky optical fiber deployed along the movement route of the mobile unit is allowed. The light receiving unit provided in the mobile unit then receives the leaked optical signal. Within a section where the leaky optical fiber extending continuously is deployed, the same optical signal leaks out of the leaky optical fiber. Therefore, the same optical signal can be received within the section even while the mobile unit is moving. In this case, since the mobile unit receives light leaked along a movement route other than light from a fixed point, almost the same distance between the leaky optical fiber and the mobile unit can be held, and transmission and reception of light is carried out within a short distance. This allows high-quality communication. In addition, since light is used, there is less adverse influence of multi-path phasing, which develops during radio wave communication. This allows high-quality communication even within a tunnel, and increase in a communication rate.

Furthermore, in a mobile optical communication system for transmitting data from a mobile unit, the mobile unit includes a modulator that modulates data, a light emitting unit that outputs an optical signal modulated according to data, and a leaky optical fiber that transmits an optical signal output from the light emitting unit with leakage thereof out of the surface. Moreover, light receiving units are deployed along a movement route of the mobile unit at certain intervals almost facing the leaky optical fiber in the mobile unit, and receive an optical signal leaked out of the leaky optical fiber and convert it to an electric signal. Data is optically transmitted from the mobile unit via the leaky optical fiber in the mobile unit.

Furthermore, according to a mobile optical communication method for transmitting data from a mobile unit, the mobile unit includes a modulator that modulates data, a light emitting unit that outputs an optical signal modulated according to data, a leaky optical fiber that transmits an optical signal output from the light emitting unit with leakage of the optical signal out of the surface. Moreover, light receiving units are deployed almost facing the leaky optical fiber along a movement route of the mobile unit at certain intervals, receive an optical signal leaked out of the leaky optical fiber in the mobile unit, and convert it to an electric signal. The mobile unit has the demodulator demodulate according to data, and the light emitting unit output the resulting optical signal to the leaky optical fiber. The light receiving unit then receives an optical signal leaked out of the surface of the leaky optical fiber and converts it to an electric signal. As a result, data from the mobile unit is transmitted.

In the case of transmitting data from the mobile unit in this manner, the optical signal leaks out of the surface of the leaky optical fiber deployed in the mobile unit. The light receiving unit, which is deployed along a movement route of the mobile unit at certain intervals, receives the leaked optical signal. Even while the mobile unit is moving and the leaky optical fiber is also moving, an optical signal leaks within a section corresponding to the length of the leaky optical fiber. Accordingly, reception of data from the mobile unit is possible as long as at least one of light receiving units receives an optical signal leaked from the leaky optical fiber in the mobile unit. In addition, since almost the same distance between the leaky optical fiber in the mobile unit and the light receiving units can be kept, high-quality communication is made possible. Furthermore, since light is used, there is less adverse influence of multi-path phasing, which develops during radio wave communication. Therefore, high-quality communication is made possible even within a tunnel, and an increased communication rate can be provided.

According to a ninth aspect of the present invention, data transmission to or from the mobile unit is possible. In this case, the light receiving units and the leaky optical fiber on the mobile unit side may be deployed under the floor of the mobile unit. Thus the leaky optical fiber and the light receiving units on the ground can be deployed between tracks. When carrying out communication, since the mobile unit covers the tracks, optical communication in a dark place is possible. Therefore, influence of disturbance light such as sunlight or street light decreases, thereby providing high quality communication and an increased communication rate.

BRIEF DESCRIPTION OF THE DRAWINGS

FIG. 13(A) is a diagram of a structure using an optical shutter; FIG. 13(B) is a diagram of a structure using a dielectric; and FIG. 13(C) is a diagram of a structure using an actuator;

FIG. 14(A) shows a case where a downlink data transfer rate is faster than an uplink data transfer rate; and FIG. 14(B) shows a case where the downlink data transfer rate is roughly equal to or less than the uplink data transfer rate;

FIG. 25(A) shows an exemplary structure using three color light emitting elements; and FIG. 25(B) shows an exemplary structure using fluorescer;

FIG. 36(A) is a cross-sectional view; and FIG. 36(B) is a perspective view;

FIG. 53 is a diagram describing an example of using LEDs for display in an electrical apparatus; FIG. 53(A) shows an example of a television set; FIG. 53(B) shows an example of an audio device; and FIG. 53(C) shows an example of indicators in a measuring instrument;

FIG. 54(A) shows an example of equipment having a liquid crystal panel; FIG. 54(B) shows an example of a notebook computer; and FIG. 54(C) shows an example of decorative illumination for a christmas tree;

FIG. 56(A) shows an appearance of an emergency light when a cover is removed; FIG. 56(B) shows an exemplary LED array to be used; and FIG. 56(C) shows an another example of a pictorial mark formed on the cover;

BEST MODE FOR CARRYING OUT THE INVENTION (First Aspect of the Present Invention)

To begin with, the first aspect of the present invention is described forthwith. The first aspect of the present invention relates to a broadcast system that optically broadcasts data, and an electric bulb preferable for the same.

A power-line communication system has been studied as one of communication systems. The power-line communication system transmits data using a power line, which is provided in a house or a building as a signal transmission medium. The power line is a very popular infrastructure, which basically allows communication among devices connected via the power line. Meanwhile, communication among devices, such as portable terminals, not connected via the power line is impossible. The first aspect of the present invention provides a broadcast system, which broadcasts data to many devices not connected via the power line.

Figure 1:
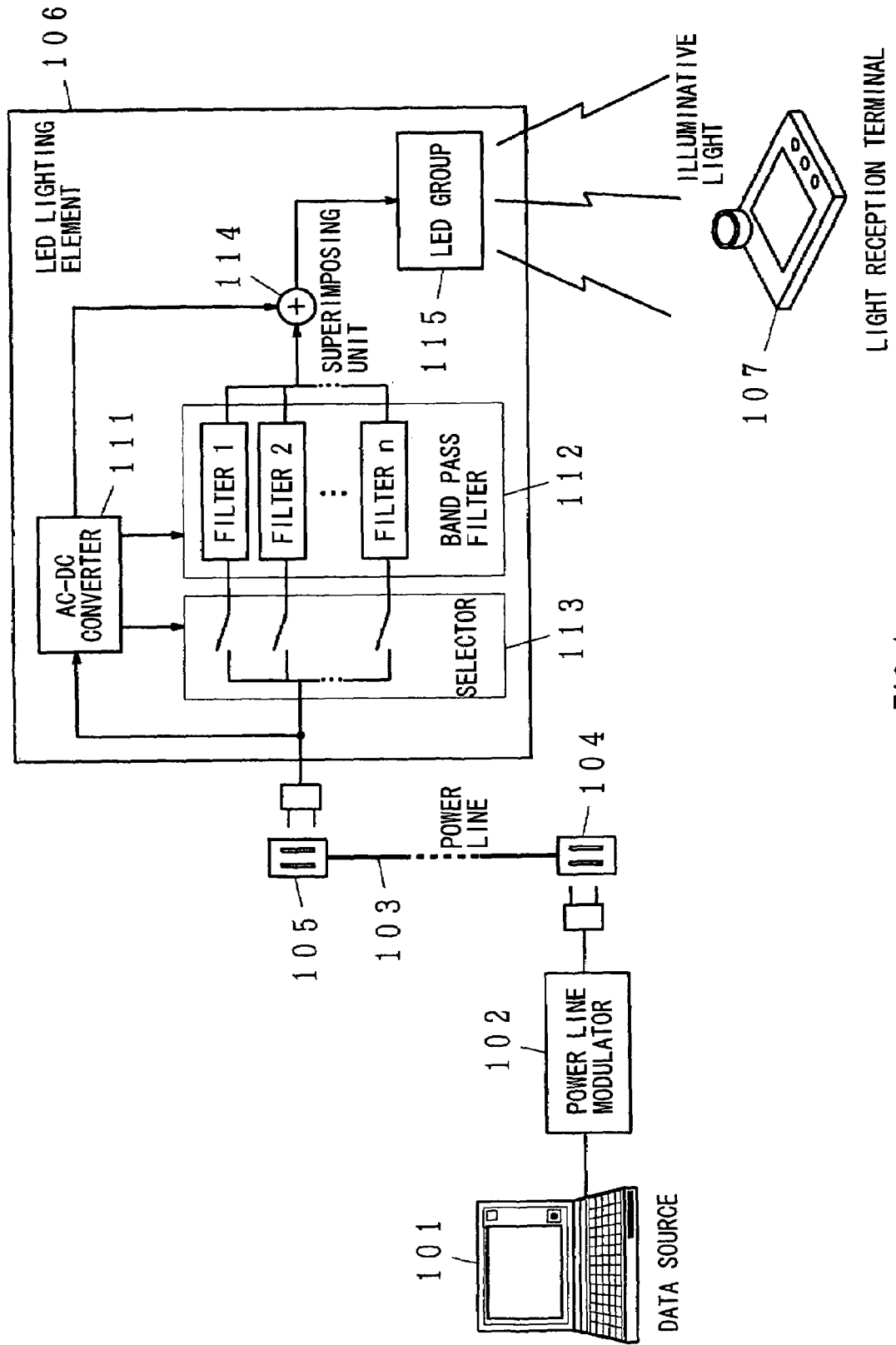
FIG. 1 is a block diagram of a broadcast system, according to a first embodiment of a first aspect of the present invention.

FIG. 1 is a block diagram of the broadcast system, according to the first embodiment of the first aspect of the present invention. In the drawing, 101 denotes a data source, 102 denotes a power-line modulator, 103 denotes a power line, 104 and 105 denote outlets, 106 denotes an LED lighting element, 107 denotes a light reception terminal, 111 denotes an AC-DC converter, 112 denotes a band pass filter, 113 denotes a selector, 114 denotes a superimposing unit, and 115 denotes an LED group. The data source 101 may be constituted by apparatus, such as a TV, a CATV, a radio, and a tuner or a receiver for the CATV, as well as a computer, which are capable of outputting various data. Accordingly, what is broadcast may be various data, such as picture data, music data, sound data, image data, and character data. Moreover, what is broadcast may be a single piece of data or multiple pieces of data; it is assumed here that multiple pieces of data are output.

The power-line modulator 102 modulates and multiplexes multiple pieces of data output from the data source 101, superimposes the resulting data on an electric power waveform, and then transmits the resulting superimposed data waveform to the power line 103. Note that ordinary power-line communication systems often include a demodulating means, which allows bi-directional communication; however, such a demodulating means is unnecessary for a broadcast system because the broadcast system allows only unidirectional communication. In addition, according to an exemplary data multiplexing method, frequency division is carried out for multiplexing.

Typically, the power line 103 is an electric wire, which is provided indoors or outdoors. An existing electric wire may be used as the power line 103. In addition, the outlets 104 and 105 are fixed to a wall surface in order to receive power from the power line 103. Existing outlets may be used as the outlets 104 and 105. In the exemplary structure shown in FIG. 1, the power-line modulator 102 is inserted into the outlet 104, and the LED lighting element 106 is inserted into the outlet 105. Needless to say, the power line 103 and the outlets 104 and 105 may be newly provided. Note that with this exemplary structure, it is assumed that AC electric power used as general commercial electric power is supplied.

The LED lighting element 106, which is connected to the power line 103, illuminates in the vicinity thereof. In the case of indoors, for example, it is fixed to the ceiling. Other various lighting elements, such as a spotlight, are available for various applications. In this exemplary structure, the LED lighting element 106 includes the AC-DC converter 111, the band pass filter 112, the selector 113, the superimposing unit 114, and the LED group 115.

The AC-DC converter 111 converts AC electric power supplied from the power line 103 to DC electric power, which is supplied to the LED group 115 to emit light. A conventional AC-DC converter may be used as the AC-DC converter 111. In addition, the AC-DC converter 111 also makes an adjustment to the operating voltage for the LED group 115. Furthermore, it supplies electric power needed for operation of the band pass filter 112. Note that since a modulated data waveform is superimposed on the power line 103 as described above, it is desirable that a smoothing circuit, for example, should be used for preventing development of the data waveform on a DC waveform.

The band pass filter 112 is provided for extracting a data signal superimposed on the power line 103. As described above, with this exemplary structure, since individual pieces of data are multiplexed through frequency division, the band pass filter 112, which allows only a specific frequency to pass through, can selectively isolate single data from multiple pieces of data. In the example shown in FIG. 1, multiple band pass filters, each allowing a different frequency to pass through, are arranged in parallel. Alternatively, a band pass filter, which is capable of changing frequency bandwidths passed therethrough, may be arranged. Note that a separated data waveform may be biased, trimmed, or amplified.

The selector 113 selects one or more out of multiple filters in the band pass filter 112, thereby allowing selection of data to be optically distributed. This selection may be manually made; alternatively, it may be made using another method or by selectively demodulating a transmitted control signal of a specific frequency and then making a selection of a filter based on that control signal. Alternatively, a structure capable of changing frequencies that pass through the band pass filter 112 may be used, and the selector 113 may set a frequency corresponding to data to be distributed to the band pass filter 112. In FIG. 1, the selector 113 is provided before the band pass filter 112; alternatively, it may be provided thereafter. In addition, in the case of that structure capable of changing a frequency band that the band pass filter 112 passes, the selector 113 may set a frequency bandwidth for the band pass filter 112 in conformity with a control signal of a specific frequency. Furthermore, when the LED lighting element 106 broadcasts only data of a fixed frequency, the selector 113 is unnecessary, and only the band pass filter 112 that passes signals of a fixed frequency bandwidth should be provided.

The superimposing unit 114 superimposes a data signal extracted by the band pass filter 112 on a converted DC electric power waveform, which is provided by the AC-DC converter 111. This allows change in voltage applied to the LED group 115 in conformity with the resulting data signal, and control of light intensity or blinking of the LED group 115. For example, in the case of making the LED group 115 blink, a structure such that electric power from the AC-DC converter 111 is controlled to turn on and off in conformity with a signal from the band pass filter 112 is possible.

The LED group 115 is basically an LED light source for lighting, which may be constituted by a great number of white LEDs, for example. Needless to say, a structure with a set of red LEDs, a set of blue LEDs, and a set of green LEDs is possible. Electric power from the superimposing unit 114 is supplied to the LED group 115, which then emits light. Since LEDs have excellent response characteristics, they can output optical data through changing light intensity and/or blinking in conformity with a data signal. In this case, since high-speed change in light intensity and/or high-speed blinking is unperceivable to the human eye, LEDs may be used for lighting as they are.

The light reception terminal 107 has a light reception means, receives light illuminated from the LED lighting element 106, extracts a data signal therefrom and demodulates it into data. An arbitrary device including a light reception means may be used as the light reception terminal 107, and it may be a variety of apparatus, such as a personal computer, a portable terminal, a cellular phone, an audio device having a light reception means, or a display apparatus such as a television.

An exemplary operation of the broadcast system, according to the first embodiment of the first aspect of the present invention, is briefly described forthwith. Various contents to be broadcasted are prepared as the data source 101. For example, in addition to data from a computer, various kinds of data from a TV, a CATV, and a radio are prepared for respective applications.

Figure 2:
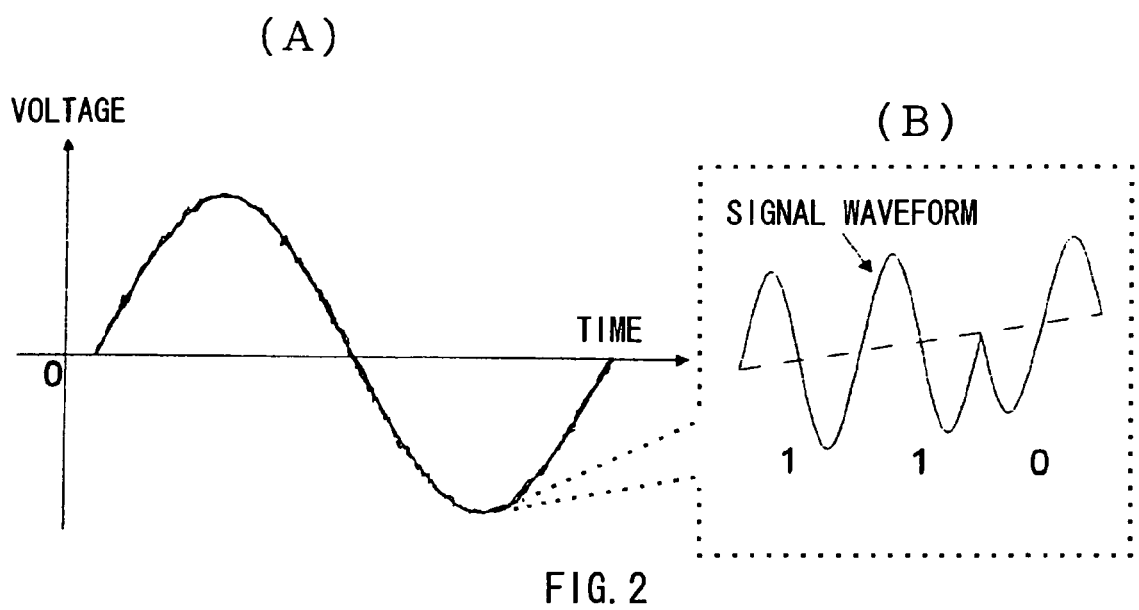
FIG. 2(A) is a diagram describing an exemplary signal waveform of an electric wire.
FIG. 2(B) is a partially magnified diagram thereof.

The power-line modulator 102 modulates and multiplexes multiple pieces of data output from the data source 101, superimposes the resulting data on an electric power waveform, and then transmits the resulting superimposed data waveform to the power line 103. FIG. 2 is a graph describing an exemplary signal waveform of an electric wire. In this example, a commercial AC electric power supply (50 Hz/60 Hz) is used, and a data signal waveform is superimposed on an electric power waveform. A data signal waveform, which is smaller than an electric power waveform, is superimposed so as to avoid adversely influencing other devices. A magnified view of FIG. 2(B) shows an example of data modulated using a method such as binary phase shift keying (BPSK) and then superimposed on the electric power waveform. Note that an existing electric wire may be used as the power line 103. In addition, receiving electric power from an outlet, separating and using data allows provision of data as with the case of using conventional power-line communication.

Electric power and data are transmitted to the LED lighting element 106 from the outlet 105 via the power line 103. The LED lighting element 106 receives from the outlet 105 electric power on which a signal waveform is superimposed. The AC-DC converter 111 rectifies and supplies DC electric power, which is then used to drive the LED group 115, and transmits it to the superimposing unit 114. On the other hand, a filter in the band pass filter 112 selected by the selector 113 passes and outputs only a predetermined frequency component. At this time, that component may be biased, trimmed, or amplified as necessary.

The superimposing unit 114 then combines DC electric power waveform, which is provided through conversion by the AC-DC converter 111, and a data signal extracted by the band pass filter 112, and then applies the resulting composite data signal waveform to the LED group 115. Voltage applied to the LED group 115 varies depending on the composite data signal waveform. As a result, light intensity of the LED group 115 changes depending on the data signal waveform, which allows transmission of data.

Light emitted from the LED group 115 is received by a light reception device on the light reception terminal 107 side. The light reception terminal 107 can receive data by detecting and demodulating changes in received light intensity. In this manner, of pieces of data provided from the data source 101, one selected by the LED lighting element 106 is transferred along with illuminative light; the light reception terminal 107 then receives that transferred data. In this case, the light reception unit in the light reception terminal 107 may not exactly face the LED lighting element 106 (LED group 115); however, it is possible to capture a data signal as long as a certain degree of illuminative light can be received since communication quality is excellent. This is because the LED illuminative light is used for lighting and apparent transmitted electric power is extremely large. When a signal with a similar signal intensity is transmitted using conventionally available infrared rays, influences on the human body (e.g., eyes) are unavoidable. In this regard, it is advantageous to optically transmit data.

Note that: only a single LED lighting element 106 is shown in the drawing; however, if multiple LED lighting elements 106 are arranged at a short distance, this arrangement is resistant to shadowing and can accommodate movement as long as the same data is selected and broadcast. On the other hand, even if an LED lighting element 106 for selecting and broadcasting data exists at a short distance, since light from another LED lighting element attenuates as long as reception is made near an LED lighting element 106, its influence becomes weak. In addition, if a problem of interference with other LED lighting elements develops, data from the data source 101 should be modulated using an interference resistant modulation method, such as on-off keying, return-to-zero (OOK-RZ) or orthogonal frequency division multiplexing (OFDM).

In addition, in the exemplary structure shown in FIG. 1, the AC-DC converter 111 and the band pass filter 112 are provided in the LED lighting element 106. However, this structure is not limited to this; alternatively, those circuits may be fixed in a light on/off wall switch, and DC electric power with a superimposed data waveform may be supplied between the switch and the LED lighting element 106. In this case, a switch to be used as the selector 113 may be fixed to a wall along with a light on/off switch. Needless to say, arrangement of respective units is not limited to those examples, and may arbitrarily be made.

Figure 3:
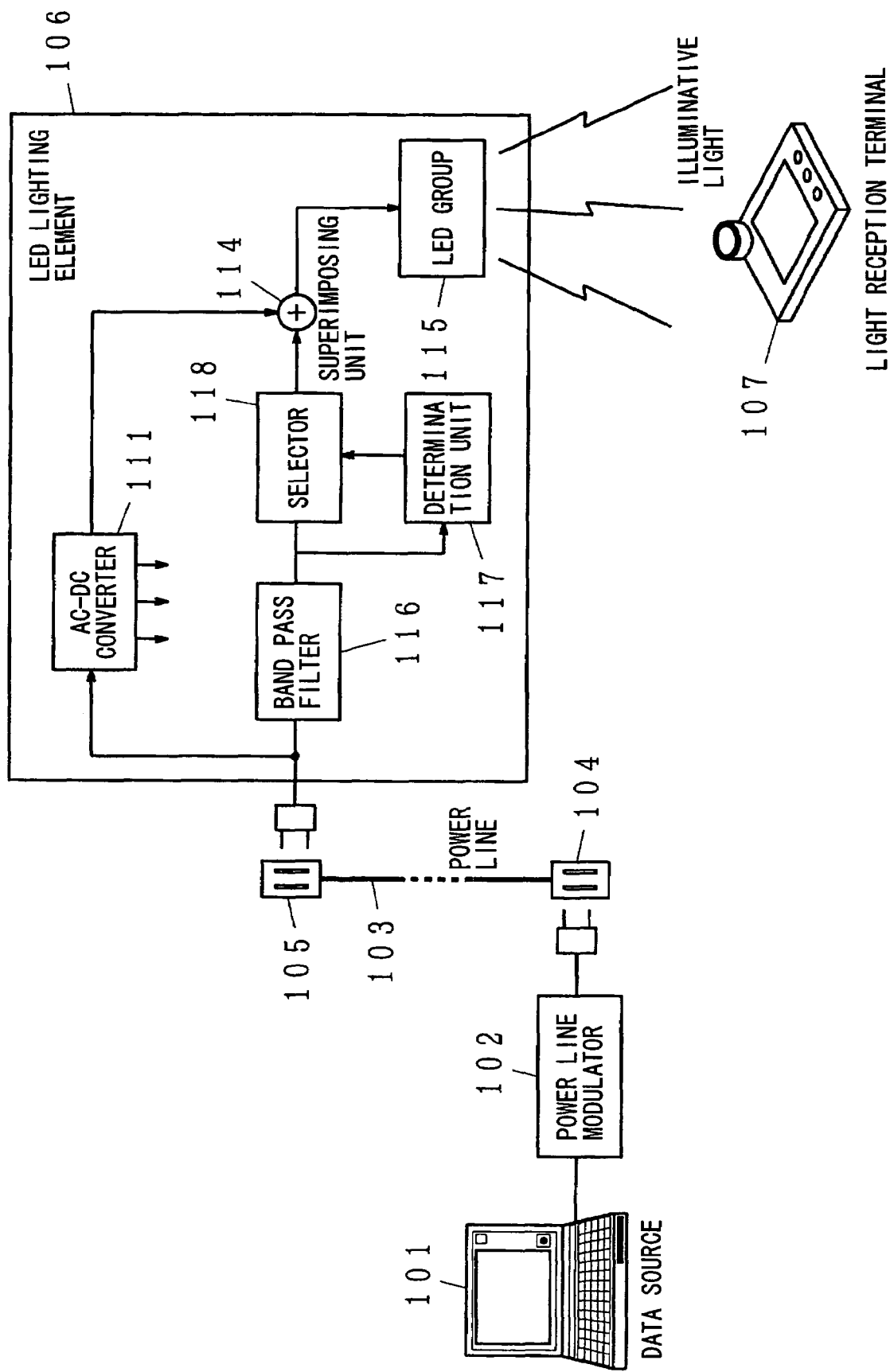
FIG. 3 is a block diagram of a broadcast system, according to a second embodiment of the first aspect of the present invention.

FIG. 3 is a block diagram of a broadcast system, according to a second embodiment of the first aspect of the present invention. In the drawing, the same reference numerals are given to the same parts as those in FIG. 1, and repetitive descriptions thereof are thus omitted. 116 denotes a band pass filter, 117 denotes a determination unit, and 118 denotes a selector. In this exemplary structure, an identification code (such as IP, PN code) is assigned to each LED lighting element 106 or each piece of data, and only a specific piece of data is selected based on its own identification code and then broadcast.

A power-line modulator 102 divides multiple pieces of data from a data source 101 into packets, adds a header to the top of each packet, carries out time division multiplexing, and superimposes the resulting packets of data on the electric power waveform. The header includes an identification code.

The LED lighting element 106 includes the band pass filter 116, the determination unit 117, and the selector 118 as well as an LED group 115 and an AC-DC converter 111. The band pass filter 116 removes AC components from electric power and separates data signal components. In this exemplary structure, all signals of multiple pieces of data pass through the band pass filter 116.

The determination unit 117 extracts a header from data signals separated by the band pass filter 116, compares it with a predetermined identification code, and determines whether or not the transmitted data should be optically transmitted. If YES, the selector 118 then selects a data signal and outputs it to a superimposing unit 114. The superimposing unit 114 superimposes a signal passed through the selector 118 on a DC electric power waveform, which is provided through conversion by the AC-DC converter 111, and supplies the resulting superimposed signal to the LED group 115. Subsequently, as with the above-mentioned first embodiment, light intensity or blinking of the LED group 115 is controlled based on a data signal, which allows optical data transmission. In addition, lighting comes from lights emitted by the LED group 115.

According to the second embodiment, by assigning an identification code to, for example, each LED lighting element 106, data broadcast by each LED lighting element 106 can be controlled on a transmitter side from which data is transmitted to the power line 103. Moreover, a structure that allows assignment of separate identification codes allows selection of data to be broadcast from each LED lighting element 106. In this case, multiple identification codes may be assigned, and multiple pieces of data may be selected to be optically transmitted.

The second embodiment may be structured in different ways as with the above-mentioned first embodiment. In addition, there are the same advantages as those of the above-mentioned first embodiment.

In addition to those embodiments, without selecting data to be broadcast using illuminative light, all data transmitted via the power line 103 may be optically broadcast, and broadcast data may be received and selected on a terminal side.

Figure 4:
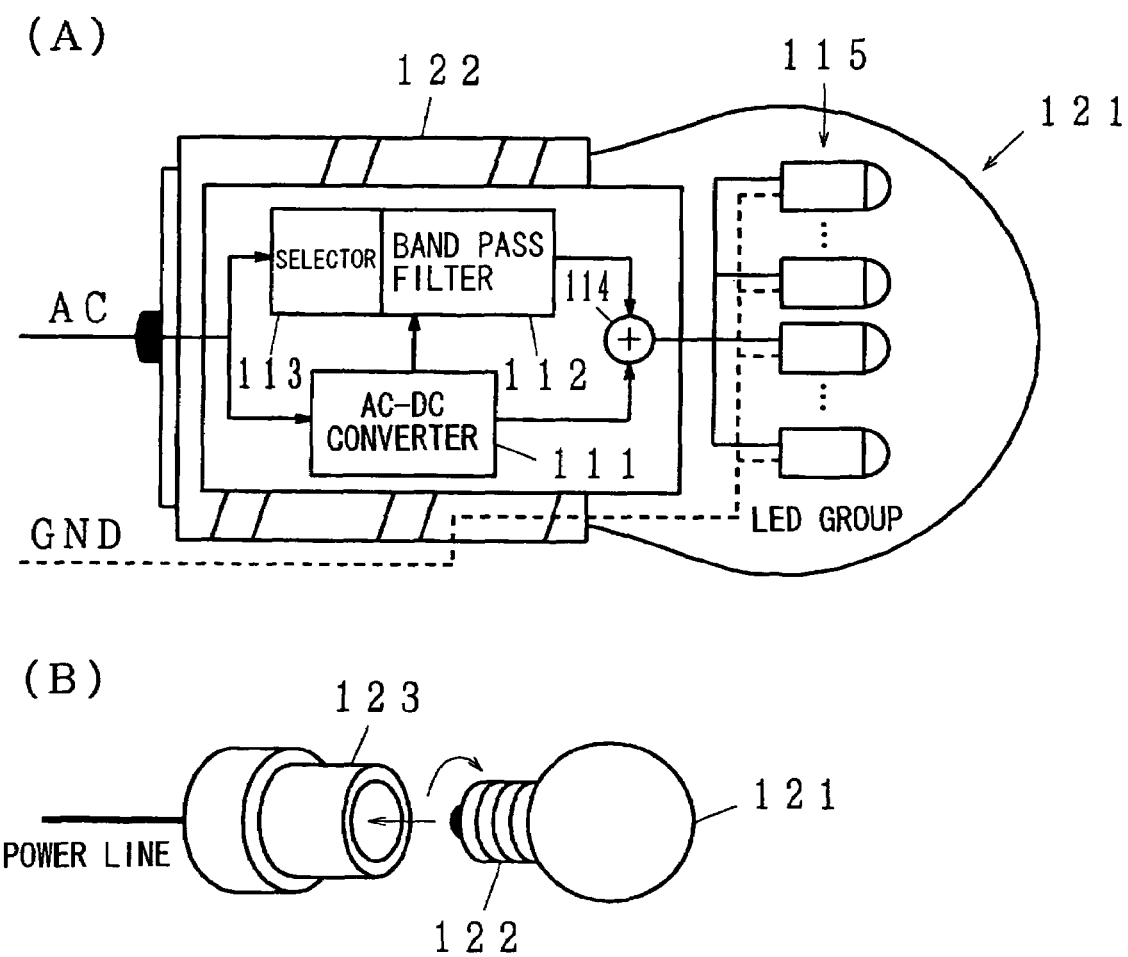
FIG. 4(A) is an explanatory diagram of an electric bulb of an embodiment applicable to the broadcast system, according to the first aspect of the present invention.
FIG. 4(B) is a diagram describing how to detach the electric bulb.

FIG. 4 is an explanatory diagram of an electric bulb applicable to the broadcast system, according to an embodiment of the first aspect of the present invention. In the drawing, 121 denotes an electric bulb, 122 denotes a base, and 123 denotes a socket. The example shown in FIG. 4 may be applied as a part of an LED lighting element 106 in the broadcast system, according to each embodiment described above. Typically, a lighting element including an attachable incandescent bulb has been available. As shown in FIG. 4(B), the socket 123 is arranged on the ceiling or the like, and electrical connection can be made by inserting the base 122 of the electric bulb 121 into the socket 123. In this example, existing facility in the interconnect portion extending until the power line 103 or the socket 123 is used as is, and as shown in FIG. 4(A), the internal structure of the LED lighting element 106, according to the first or the second embodiment described above, is accommodated in the electric bulb 121. For example, that structure may be accommodated in the base 122 of the electric bulb 121. In addition, differing from conventional point light sources with a filament such as an incandescent bulb, since a great number of LEDs are deployed in the same plane, a circuit can be deployed therebehind.

Use of such electric bulb 121 and only replacement of a typical incandescent bulb with the electric bulb 121, according to the first aspect of the present invention, allows use of the electric bulb 121 as an optical data transmission source.

Needless to say, variously shaped conventional electric bulbs may be used other than the shape as shown in FIG. 4. The shape of the electric bulb 121, according to the first aspect of the present invention, is not limited to that in FIG. 4, and it may be an arbitrary shape. For example, the electric bulb 121 may be structured with a form of linearly arranged LEDs such as a fluorescent lamp.

Figure 5:
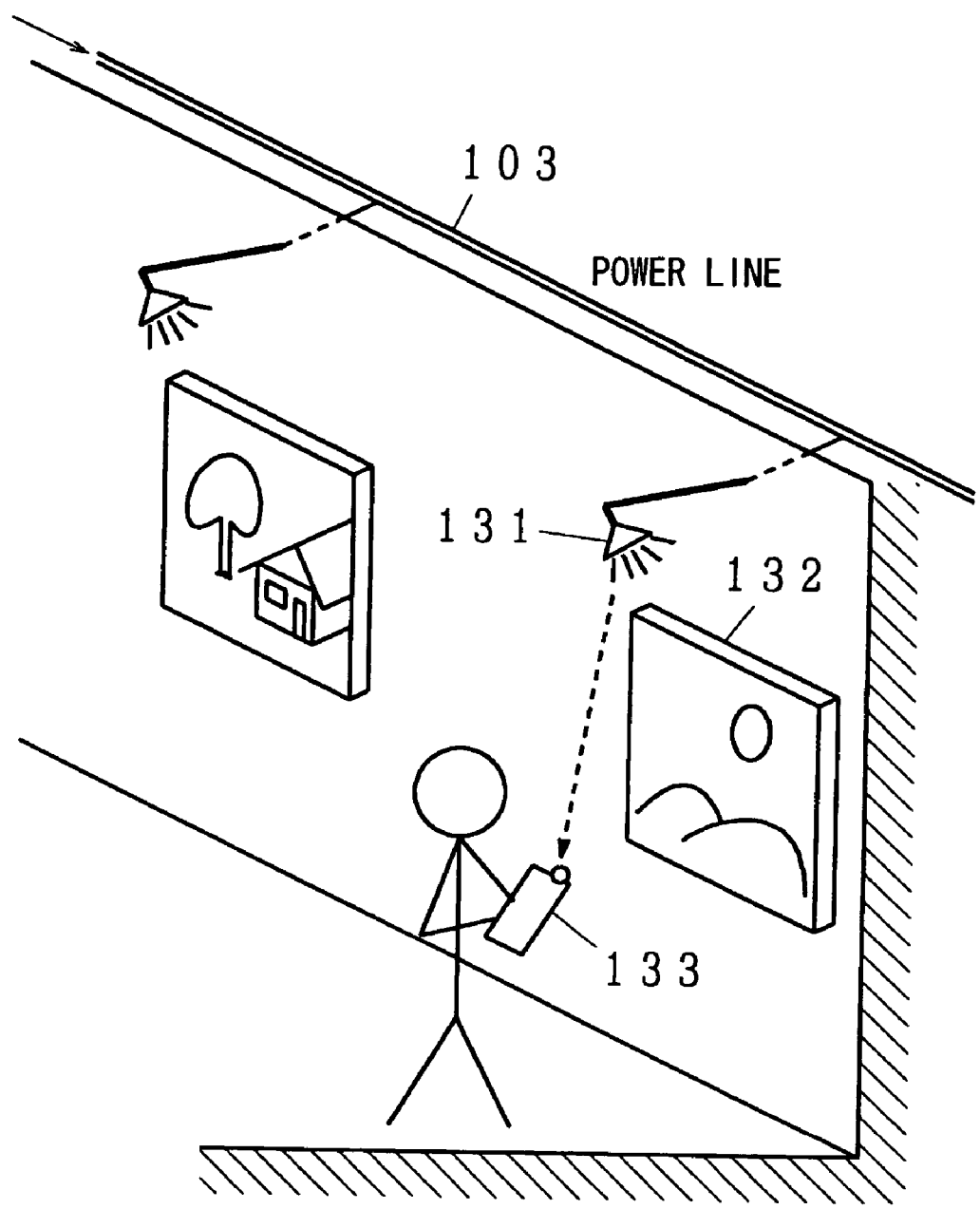
FIG. 5 is a diagram describing a first application of the first aspect of the present invention.

Next, several applications of the broadcast system, according to the first aspect of the present invention, are described forthwith. FIG. 5 is a diagram describing a first application, according to the first aspect of the present invention. In the drawing, 131 denotes LED lighting elements, 132 denotes artworks, and 133 denotes a light reception terminal. The example in FIG. 5 shows a case of the broadcast system according to the first aspect of the present invention used in an art gallery or a museum. In an art gallery or a museum, lighting such as spotlighting is used for each artwork or showpiece (hereafter, referred to as artworks 132) and description thereof. The LED lighting elements 131, according to the first aspect of the present invention, are used as lighting elements for illuminating the artworks 132. On the other hand, descriptive data for the artworks 132 is superimposed on a power line 103 via which electric power is supplied to the LED lighting elements 131, and the resulting superimposed data is transmitted. In this case, descriptive data for a great number of artworks 132 is superimposed on the power line 103. Each LED lighting element 131, which is provided for each artwork 132, selectively extracts descriptive data for each artwork, and controls light intensity or blinking of illuminative light as described above, optically transmitting the descriptive data.

When an appreciator takes out the light reception terminal 133 in front of an artwork 132, light is illuminated to the light reception terminal 133 and changes in the light intensity or blinking are captured and then demodulated, which allow the appreciator to read the descriptive data for the corresponding artwork 132. In addition, when the appreciator moves in front of the next artwork, descriptive data for the next artwork is then transmitted via light for illuminating that artwork. As a result, the appreciator can read the descriptive data for that artwork displayed in the light reception terminal 133.

In this manner, descriptive data for each artwork 132 is superimposed on an electric power waveform and then transmitted to the power line 103, and on the other hand, each of the LED lighting elements 131 for illuminating respective artworks selects descriptive data for the corresponding artwork 132 and optically transmits the resulting selected data, which allows provision of lighting to each artwork 132 and also allows an appreciator to read descriptive data for each artwork 132.

There may be more than once piece of descriptive data for each artwork. For example, in the case of providing descriptive data for each artwork in multiple languages, the LED lighting elements 131 select multiple pieces of descriptive data for artworks 132 to be illuminated, and optically transmit the selected data. The light reception terminal 133 then separates and demodulates optically transmitted, multiple pieces of descriptive data, selects descriptive data in a language of choice specified by the appreciator, and presents it to the appreciator. Alternatively, a structure such that the same LED lighting element 131 optically transmits multiple pieces of descriptive data for a single artwork 132, such as descriptive data for adults and that for children, is possible. Note that descriptive data is not limited to text data, and may be sound data, image data, or animation data. Alternatively, a combination thereof is also possible.

Figure 6:
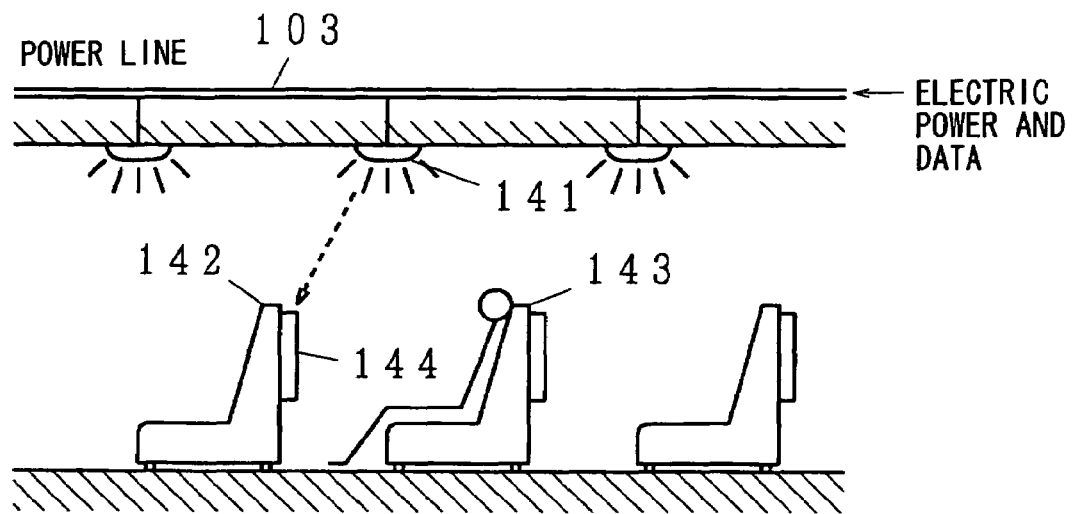
FIG. 6 is a diagram describing a second application of the first aspect of the present invention.

FIG. 6 is a diagram describing a second application, according to the first aspect of the present invention. In the drawing, 141 denotes LED lighting elements, 142 and 143 denote seats, and 144 denotes light reception terminals. The second application shows a case of the broadcast system, according to the first aspect of the present invention, used in an airplane, a train, or a bus. In the example of FIG. 6, the LED lighting elements 141 are provided to the respective seats, illuminating them. The LED lighting elements 141 also optically transmit data, which is transmitted via the power line 103. Furthermore, the light reception terminal 144 is provided in the backside of the front seat 142 so that a passenger seated in the seat 143 can see the screen of the light reception terminal 144. The light reception terminal 144 receives light illuminated from an LED lighting element 141, and captures data from the light. A passenger may select and view desired data through manipulation of the light reception terminal 144.

In an airplane or a spaceship, in particular, a radio wave must not be used because there may be adverse influences on instruments therein. Meanwhile, light has no effect on instruments as well as the human body. Accordingly, wireless data distribution may be carried out as shown in FIG. 6. Note that data may be selected by the light reception terminal 144 in addition to the LED lighting element 141.

Note that in an airplane, a train, or a bus, direct current is often used as electric power for lighting. Accordingly, the AC-DC converter 111 in FIGS. 1 and 3 is unnecessary. For example, in the case of optically transmitting all data transmitted via the power line 103, the band pass filter 112 and the superimposing unit 114 are unnecessary. Data may be optically transmitted by driving the LED group with data waveform superimposed electric power, which is supplied from the power line 103.

Two applications of the broadcast system, according to the first aspect of the present invention, have been shown above. However, the present invention is not limited to those applications, and can be applied to various applications for optically distributing data. For example, it can be used as a distribution system, which distributes to a personal computer on a desk in an ordinary office, and may be used for transmitting data to each process in a factory. In addition, broadcasting a television program or a radio program in a home is also possible, and that program can be viewed in any room using a portable display. In this case, a selector or a tuner may be provided in the LED lighting element, and a broadcasting station may be selected by controlling the selector using a television controller. Moreover, in a sport stadium or an event hall, for example, information of sports or events or information of other halls is superimposed on illuminative light and broadcast, and a portable terminal owned by a spectator receives it and provides that information for the spectator.

As described above, according to the first aspect of the present invention, a great number of pieces of data may be optically distributed using lighting elements as they are. In this case, different from the conventional way, it is unnecessary additionally deploy a transmitter and communication cables. Accordingly, a broadcast system can be constructed at low cost. In addition, there are no adverse effects on the human body, such as eyes, as with infrared rays, and there are no limitations on applications such as a limitation on available radio waves used for airplanes. Therefore, a safe broadcast system can be provided.

(Second Aspect of the Present Invention)

Next, the second aspect of the present invention is described. The second aspect of the present invention provides bi-directional optical communication, wherein illuminative light is used for at least one of the two directions (downlink).

As described in the first aspect of the present invention, illuminative light communication has excellent characteristics in that extremely large electric power can be used for signal transmission from a lighting element to a mobile terminal (hereafter, called 'downlink'). However, the conventional illuminative light communication is possible only in a single direction or with a downlink, and a signal transmission from a mobile terminal to a lighting element (hereafter, called 'uplink') has not been considered therein. In the case of ordinary communication except for broadcasting, various pieces of data, such as a control signal for handshaking, such as an ACK or a NACK, must be communicated among communication devices. Therefore, the uplink is very important.

Figure 7:
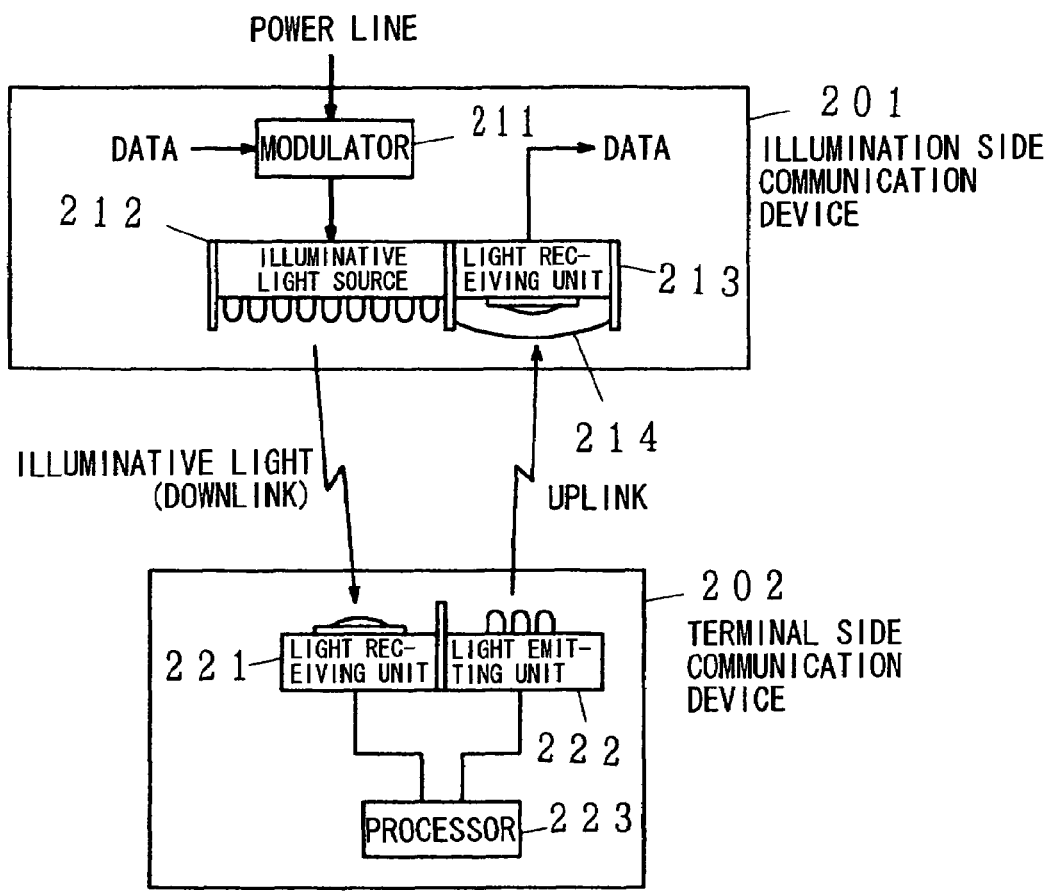
FIG. 7 is a schematic block diagram of a first embodiment according to a second aspect of the present invention.

FIG. 7 is a schematic block diagram of a first embodiment according to the second aspect of the present invention. In the drawing, 201 denotes a lighting side communication device, 202 denotes a terminal side communication device, 211 denotes a modulator, 212 denotes illuminative light sources, 213 denotes a light receiving unit, 214 denotes a filter, 221 denotes a light receiving unit, 222 denotes a light emitting unit, and 223 denotes a processor. The lighting side communication device 201 is used as a lighting element to illuminate the vicinity thereof, and includes the illuminative light sources 212, which emit light for lighting. In this exemplary structure, a light source is LEDs, but is not limited to them. Alternatively, LDs or other light emitting devices with a fast response speed are available.

The lighting side communication device 201 also includes the modulator 211 and the light receiving unit 213 for illuminative light communication. The modulator 211,which is deployed for a downlink, controls electric power, which is supplied to the illuminative light sources 212, in accordance with data to be transmitted. This allows control of light intensity or blinking of the illuminative light sources 212 and emission of light modulated in accordance with data. The terminal side communication device 202 to be described later then receives the modulated illuminative light, thereby allowing data transmission from the lighting side communication device 201 to the terminal side communication device 202 (downlink).

An arbitrary modulation system, such as on-off keying (OOK) or binary phase shift keying (BPSK), is available. In addition, all of or some of the illuminative light sources 212 for lighting may be LEDs, which are controlled to change light intensity or blinking. Note that since LEDs have a high-speed response characteristic as described above, change in light intensity and/or blinking is imperceptible to the human eye, and seems as if light is emitted continuously. Accordingly, the illuminative light sources 212 may be used for lighting besides data communication.

The light receiving unit 213, which is provided for receiving modulated light (such as infrared rays, visible light, ultraviolet light) emitted from the terminal side communication device 202, includes a light receiving device such as a photodiode. In addition, in this exemplary structure, a filter 214 is provided for selectively receiving modulated light emitted from the terminal side communication device 202. For example, to receive infrared rays, the filter 214 that allows infrared rays to pass through should be provided. Needless to say, a structure without the filter 214 is possible. In this case, received light is converted into an electric signal, which is then demodulated. Consequently, data from the terminal side communication device 202 is reconstructed and then output.

Note that data to be transmitted via illuminative light may be data received from the outside, or data retained in or generated by the lighting side communication device 201. Alternatively, data received by the light receiving unit 213 may be output to the outside or processed in the lighting side communication device 201.

The terminal side communication device 202 may be an arbitrary terminal device, and may include the light receiving unit 221 and the light emitting unit 222 for illuminative light communication and the processor 223 for various kinds of processing. The light receiving unit 221 receives and demodulates modulated light emitted from the lighting side communication device 201, and transmits the demodulated results to the processor 223. In this manner, reception of data transmitted from the lighting side communication device 201 via illuminative light is possible, or establishment of a downlink is possible.

The light emitting unit 222, which includes a light source such as LEDs or LDs, and a control circuit for turning on and off the light sources, receives data to be transmitted from the processor 223, controls light intensity or blinking of the light sources in accordance with data, and emits the resulting modulated light. At this time, any modulation system can be used for that modulation. Alternatively, infrared rays, visible light, or ultraviolet light may be used as light to be emitted. The light receiving unit 213 of the lighting side communication device 201 described above then receives the modulated light, or an uplink is established.

As described above, the lighting side communication device 201 has the illuminative light sources 212 illuminate the vicinity thereof, and modulates the illuminative light in accordance with data, allowing transmitting the data via the illuminative light. The light receiving unit 221 in the terminal side communication device 202 then receives this illuminative light, thereby receiving data transmitted from the lighting side communication device 201. In this manner, a downlink is established. In addition, the terminal side communication device 202 has the light emitting unit 222 emit modulated light in accordance with data, thereby transmitting data. The light receiving unit 213 of the lighting side communication device 201 then receives this modulated light, and thus the lighting side communication device 201 receives data transmitted from the terminal side communication device 202. In this manner, an uplink is established. In this manner, either downlink or uplink optical communication is possible, or bi-directional optical communication is possible.

For example, the terminal side communication device 202 may be a mobile, portable terminal device, such as a notebook computer, a PDA, or a cellular phone, which does not need cable connection. More specifically, in the case of a PDA with a camera or a cellular phone with a camera, the camera may be used as the light receiving unit 221. In addition, the terminal side communication device 202 is available in an environment where radio wave communication is restricted, such as a hospital, a train, an airplane, a spaceship, or a site where pacemaker users exist, and no license for use thereof is required. Needless to say, it is available in various environments, such as ordinary offices, stores, homes, and public facilities. In addition, not limited to indoors, it is available for various applications, such as neon signs, lighting for advertisement, and communication among automobiles or among facilities on the street and automobiles in a transportation system.

Moreover, optical wavelength is short, allowing very higher-speed communication than radio wave communication. Furthermore, typically, lighting elements are widely provided, and lighting is naturally provided in an environment where terminal devices are used. Such lighting elements may be used as the lighting side communication device 201 for communication, resulting in considerable reduction in installation cost.

Note that in an environment such as an office where multiple lighting elements are provided, respective lighting elements may be used as the lighting side communication device 201, and multiple lighting side communication devices 201 can be deployed. In this case, light emitted from a single terminal side communication device 202 can be received by the multiple lighting side communication devices 201. In this manner, light is received by the multiple lighting side communication devices 201, allowing improvement in communication quality. In addition, even when a single lighting side communication device 201 cannot receive light due to shadowing developed by a passerby, other lighting side communication devices 201 can receive that light, solving such problem of shadowing.

Figure 8:
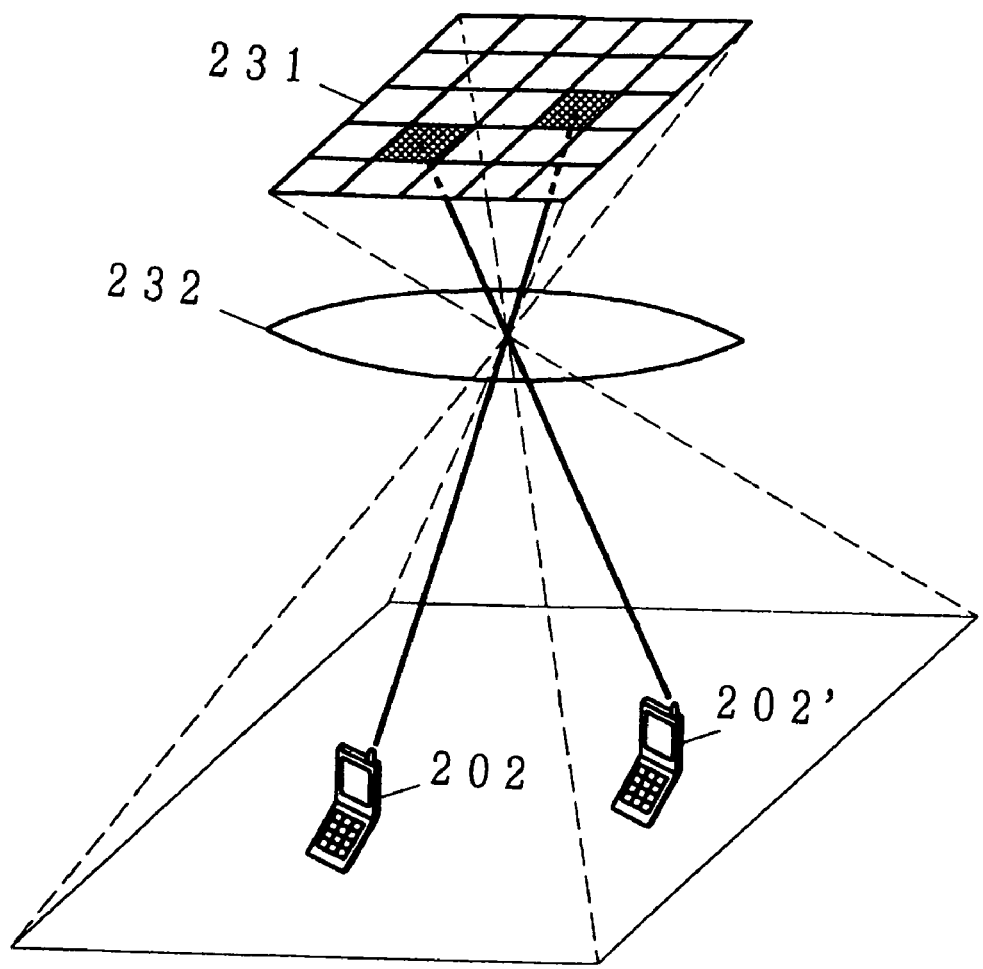
FIG. 8 is a diagram describing a modified example of a light receiving unit 213 in a lighting side communication device 201.

Next, several major modified examples of the first embodiment are described. FIG. 8 is a diagram describing a modified example of the light receiving unit 213 in the lighting side communication device 201. In the drawing, 231 denotes a two-dimensional sensor, and 232 denotes a lens. The two-dimensional sensor 231 is used as the light receiving unit 213 in the lighting side communication device 201, and the lens 232 is used to form an image on the light receiving surface. With such structure, an image due to light emitted from the terminal side communication device 202 is formed on the light receiving surface of the two-dimensional sensor 231, and that light is received by some of a great number of light receiving cells provided in the two-dimensional sensor 231. At this time, since the other light receiving cells receive environmental light, background noise can be removed using it, allowing high-quality communication.

In addition, when there are multiple terminal side communication devices 202 and 202', for example, in the light receiving area, an image due to lights emitted from the respective terminal side communication devices 202 and 202' are formed at different positions of the two-dimensional sensor 231, as shown in FIG. 8. This allows parallel reception of data from the respective terminal side communication device 202 and 202'. Needless to say, a case of three or more terminal side communication devices provided provides the same advantage.

In addition, in an environment where multiple lighting side communication devices 201 are provided, light emitted form the respective terminal side communication devices 202 and 202' can be received by the two-dimensional sensors 231, which are provided in the respective lighting side communication devices 201. In this case, communication quality can be improved by identifying light received points in the respective two-dimensional sensors 231 from the light received positions in the respective two-dimensional sensors 231 and the position of the lighting side communication device 201.

Figure 9:
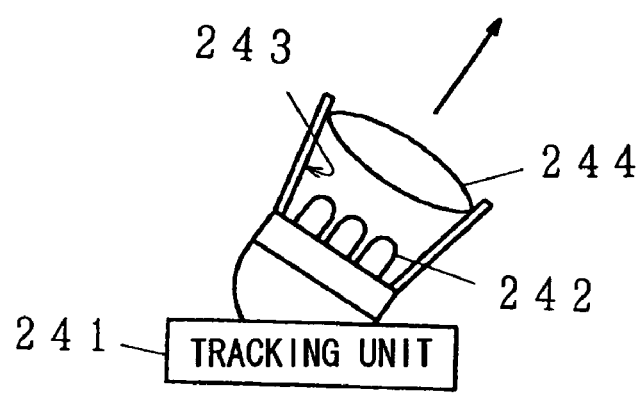
FIG. 9 is a diagram describing a modified example of a light emitting unit 222 in a terminal side communication device 202.

FIG. 9 is a diagram describing a modified example of the light emitting unit 222 in the terminal side communication device 202. In the drawing, 241 denotes a tracking unit, 242 denotes LED light sources, 243 denotes a mirror surface, and 244 denotes a lens. According to the basic structure shown in FIG. 7, when the LED light sources 242 are used as the light source of the light emitting unit 222 in the terminal side communication device 202 emitted light diverges, resulting in decrease in intensity of light received by the lighting side communication device 201. FIG. 9 shows an exemplary structure having the mirror surface 243 and the lens 244 provided to prevent such divergence of emitted light and narrow a light beam. Light emitted from the LED light sources 242 may be effectively provided to the lighting side communication device 201 using such an optical system, allowing preferable communication. Needless to say, when LDs with high directivity are used as the light source, the mirror surface 243 and the lens 244 are unnecessary.

In addition, in the case of narrowing the light beam or using LDs as a light source, communication quality decreases or communication is impossible when emitted light does not correctly hit the light receiving unit 213 in the lighting side communication device 201. Therefore, in the exemplary structure shown in FIG. 9, the tracking unit 241 is provided to guide the light beam to the light receiving unit 213 in the lighting side communication device 201. The tracking unit 241 may be structured with a movable mechanism that allows manual change in light beam direction. Alternatively, it may be structured to automatically operate according to illuminative light or operate under control of a terminal device itself. Alternatively, it may be structured to be controlled by the lighting side communication device 201 via a downlink. In this manner, there are a variety of structures to embody the tracking unit 241.

A modified example of the light receiving unit 213 in the lighting side communication device 201 and a modified example of the light emitting unit 222 in the terminal side communication device 202 have been described above. The second aspect of the present invention is not limited to those examples. For example, the structure shown in FIG. 8 may be applicable to the light receiving unit 221 in the terminal side communication device 202. This allows parallel illuminative light transmission of different pieces of data from multiple lighting side communication devices and selective reception of those pieces of data by the terminal side communication device 202.

In addition, data to be transmitted from the lighting side communication device 201 and data received therefrom may be transferred via a dedicated data line or may be superimposed on an electric power waveform and transmitted via a power line, which supplies electric power for lighting. Needless to say, besides the above-mentioned systems, various modifications thereof are possible.

Figure 10:
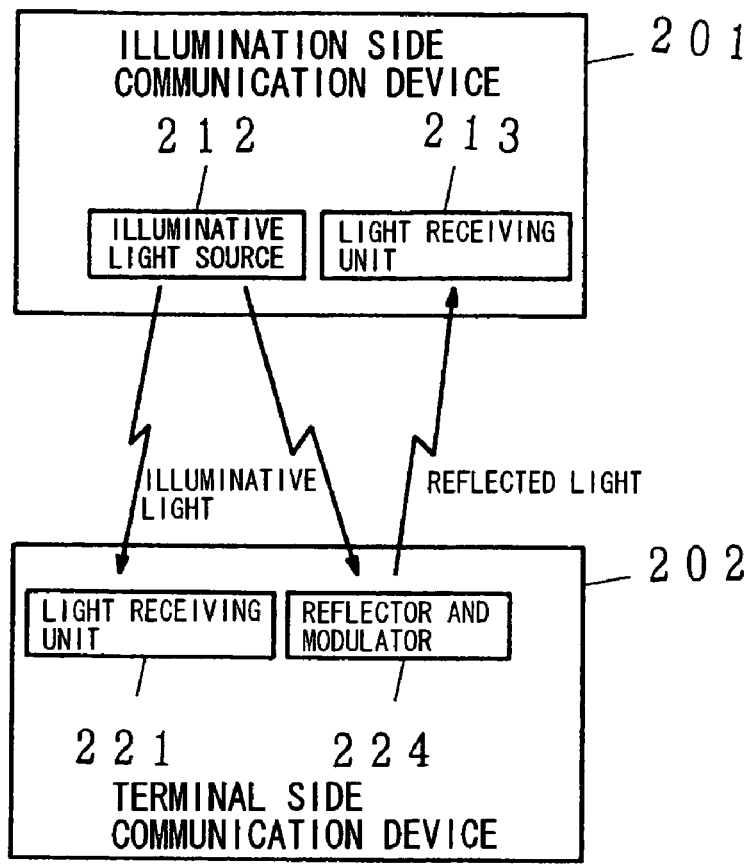
FIG. 10 is a schematic block diagram of a second embodiment according to the second aspect of the present invention.

FIG. 10 is a schematic block diagram of a second embodiment according to the second aspect of the present invention. In the drawing, the same symbols are given to the same parts as those in FIG. 7, and repetitive descriptions thereof are thus omitted. 224 denotes a reflector/modulator. In the aforementioned first embodiment, an exemplary structure such that the light emitting unit 222 is provided in the terminal side communication device 202 to emit light for establishment of an uplink is shown. On the other hand, the second embodiment shows a structure such that illuminative light for a downlink is used as is, and reflected light is used for an uplink. As described above, illuminative light has large electric power, and when it is used for an uplink, further reliable communication is possible. In addition, since the light emitting unit 222 is unnecessary in the terminal side communication device 202, power consumption of the terminal side communication device 202 can be considerably suppressed, greatly contributing to power saving. Note that since the structure of the lighting side communication device 201 can be the same as those of the aforementioned first embodiment and the modified example thereof, repetitive descriptions thereof are thus omitted, and the modulator 211 is not shown in the drawing. In addition, the light receiving unit 221 in the terminal side communication device 202 may be the same as those of the aforementioned first embodiment and the modified example thereof.

The reflector/modulator 224 is provided in the terminal side communication device 202, which allows use of illuminative light for an uplink. The reflector/modulator 224 reflects illuminative light and transmits the resulting reflected light, which is modulated in conformity with to-be-transmitted data via an uplink.

Figure 11:
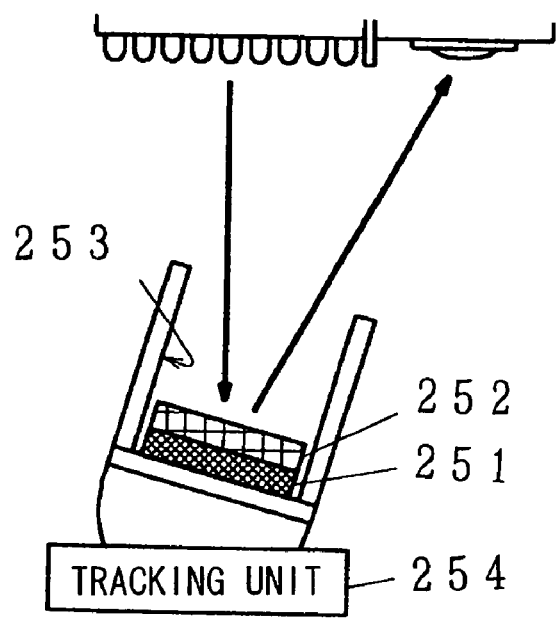
FIG. 11 is a diagram describing an exemplary structure using a mirror as a reflector/modulator 224.

FIG. 11 is a diagram describing an exemplary structure with a mirror used as the reflector/modulator 224. In the drawing, 251 denotes a mirror, 252 denotes an optical shutter, 253 denote a shielding wall, and 254 denotes a tracking unit. The mirror 251 is simply used for reflecting illuminative light, and the reflection direction is controlled by the tracking unit 254, which is similar to the tracking unit 241 of the modified example shown in FIG. 9. In addition, modulation can be carried out using the optical shutter 252 allowing incident light to the mirror 251 and reflected light from the mirror 251 to pass through or be shut off. For example, a liquid crystal shutter may be used as the optical shutter 252 for modulation, which controls the orientation of liquid crystal in accordance with data so as to allow reflected light to pass through or be shut off. Needless to say, other modulation methods may be used alternatively. For example, reflection direction of the mirror surface may be changed in accordance with data. In other words, since change in reflection direction of the mirror surface changes the intensity of incident light to the light receiving unit 213 in the lighting side communication device 201, data can be captured by detecting this change. In this case, the tracking unit 254 may also be used as a modulation means.

In addition, in the exemplary structure shown in FIG. 11, the shielding wall 253 is provided surrounding the mirror 251. This is provided for protecting user's eyes from the brightness of reflected light traveling from the mirror 251, which reflects light emitted by a light source other than the light source in the lighting side communication device 201 for communication. When the illuminative light source 212 and the light receiving unit 213 of the lighting side communication device 201 are provided closely, only light from the illuminative light source 212 should be reflected, returning to the light receiving unit 213, and thus reflection of other lights is unnecessary. The shielding wall 253 is provided for preventing such unnecessary reflection. Alternatively, the inner surface of the shielding wall 253 may be formed to be a mirror, thereby increasing reflected light intensity. Needless to say, a structure without the shielding wall 253 is possible.

Note that the unit shown in FIG. 11 may be used as a single structure or multiple units may be provided.

Figure 12:
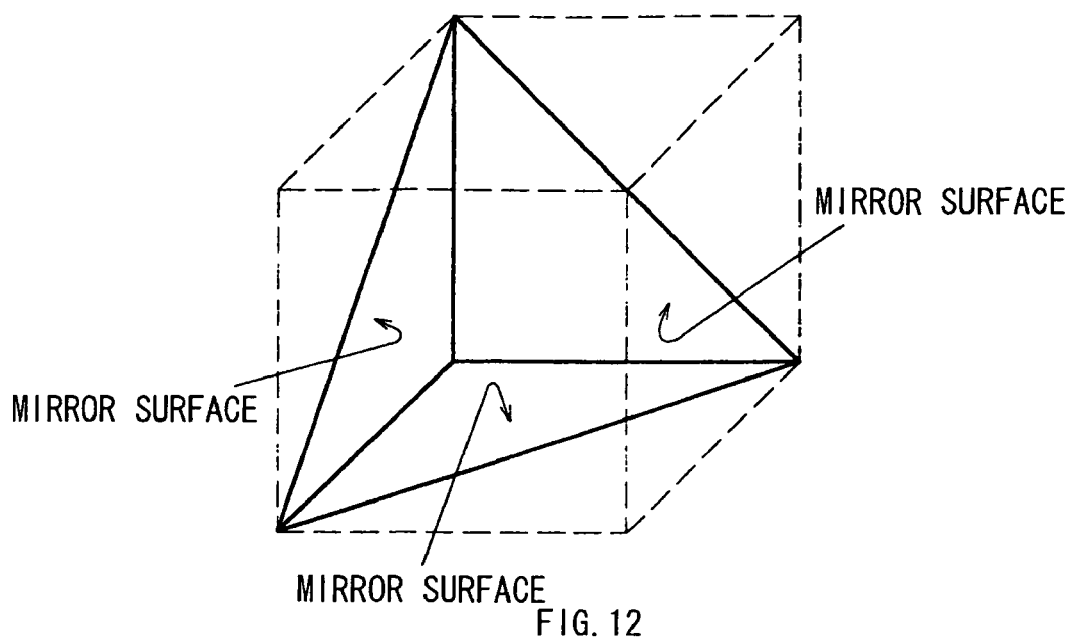
FIG. 12 is a diagram describing a general view of a corner cube reflector (CCR)

A corner cube reflector (CCR) may be used as an illuminative light reflecting means in the reflector/modulator 224. FIG. 12 is a diagram describing a general view of the CCR. The CCR has three reflecting surfaces orthogonal to each other in an inward direction. For example, as shown in FIG. 12, it can be structured with three inner reflecting surfaces of a cube or a rectangular, which have a shared apex and are orthogonal to one another.

The CCR is characterized in that incident light is reflected in the same incident direction. Accordingly, when illuminative light hits, the illuminative light is then reflected toward the light source of the illuminative light. According to the second aspect of the present invention, illuminative light is used for a downlink, and the illuminative light used for the downlink is reflected and also used for an uplink. More specifically, since the illuminative light is reflected toward the illuminative light source, the reflected light can be received by the light receiving unit 213 arranged very close to the illuminative light source in the lighting side communication device 201. In addition, since high directivity/strongly reflected light hits the light receiving unit 213 in the lighting side communication device 201, there is an advantage that peripheral light is difficult to adversely influence that light. Note that the lighting side communication device 201 can be provided in an arbitrary area, and even when the terminal side communication device 202 is provided in an arbitrary area, reflected light is reflected toward the lighting side communication device 201.

Figure 13:
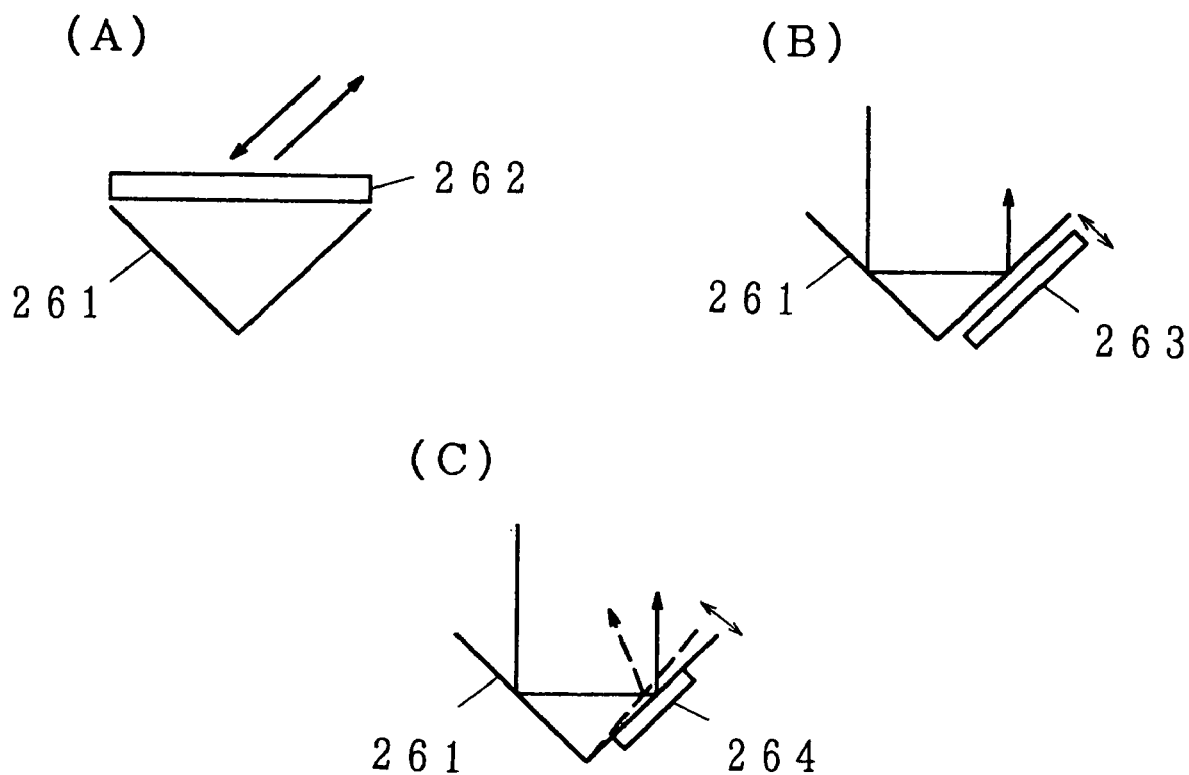
FIG. 13 is a diagram describing an exemplary modulation method using the CCR.

FIG. 13 is a diagram describing an exemplary modulation method using the CCR. In the drawing, 261 denotes the CCR, 262 denotes an optical shutter, 263 denotes a dielectric, and 264 denotes an actuator. Illuminative light can be reflected by the CCR toward the lighting side communication device 201 in the aforementioned manner. Several methods of modulating this reflected light in accordance with data are shown forthwith. FIG. 13(A) shows an example of modulating with the optical shutter 262 arranged in front of the CCR. The optical shutter 262 may be structured with a liquid crystal shutter using a liquid crystal display. The liquid crystal orientation of the liquid crystal shutter changes due to application of a voltage, thereby switching over between a light pass-through mode and a light shut-off mode. When this liquid crystal shutter is controlled to allow light to pass through, illuminative light from the lighting side communication device 201 hits the CCR 261, and the resulting reflected light then travels to the lighting side communication device 201, as described above. On the other hand, when the liquid crystal shutter is controlled to shut off light, both incident light to the CCR 251 and reflected light are shut off, and the light receiving unit 213 in the lighting side communication device 201 cannot receive reflected light. In this manner, the control of liquid crystal orientation of the liquid crystal shutter allows reflected light to pass through or be shut off. Reflected light modulated through such a shutter operation in accordance with data may be transmitted to the lighting side communication device 201. Needless to say, there are various kinds of liquid crystal, and they are available as needed. For example, a type of liquid crystal capable of changing over between a light pass-through mode and a light reflecting mode is available. In addition, in this exemplary structure, a liquid crystal shutter is used as the optical shutter 262. Alternatively, any type of shutter mechanism capable of being controlled to allow illuminative light and reflected light entered to pass through to the CCR 261 or prevent them from passing through is available regardless of its structure.

In the example shown in FIG. 13(B), the dielectric 263 is deployed very close (X/3) to part of or entirety of the mirror surface, which constitutes the CCR 261, so as to decrease the total amount of reflection from the inner surfaces. The intensity of reflected light from the CCR 261 may be controlled by changing the position of the dielectric in accordance with data, allowing transmission of modulated, reflected light to the lighting side communication device 201. Note that this method utilizes coherence, and use thereof is limited to the case where LDs are used as a light source in the lighting side communication device 201.

In the example shown in FIG. 13(C), the actuator 264 is attached to one of the mirror surfaces, which constitute the CCR 261, so as to change the mirror surface in accordance with data. For example, by changing an angle or deforming the mirror surface, a light reflected angle between adjacent mirror surfaces of the CCR 261 changes. As a result, the relationship between incident light and reflected light such that the latter returns along the former can be broken. Such control in accordance with data allows transmission of modulated, reflected light to the lighting side communication device 201. The actuator 264 may be a structure using a driving capability of a mechanical micro machine or distortion of a piezo element.

Figure 14:
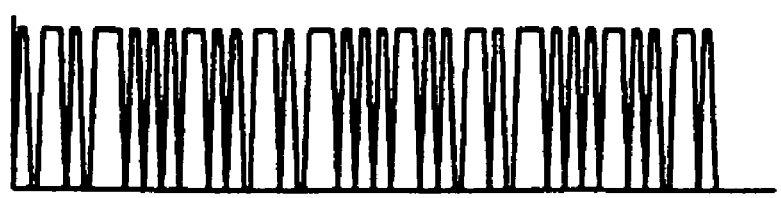
FIG. 14 is a graph describing exemplary waveforms of an incident light to the reflector/modulator 224 and a modulated, reflected light.
Figure 14:
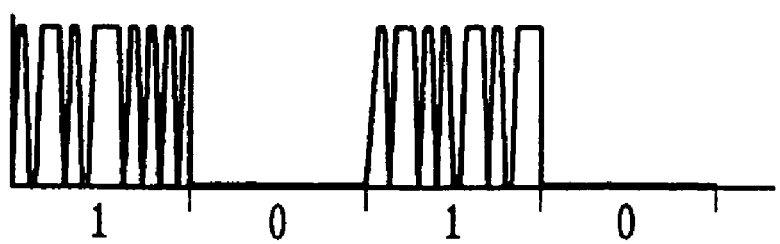
Figure 14:
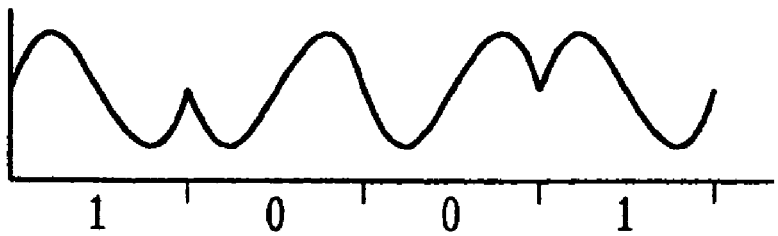
Figure 14:
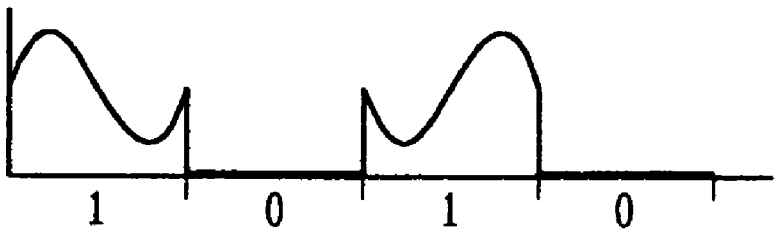

FIG. 14 is a graph describing exemplary waveforms of incident light to the reflector/modulator 224 and modulated reflected light, respectively. As described above, incident light to the reflector/modulator 224 is illuminative light that is modulated and emitted from the lighting side communication device 201. Accordingly, light intensity or blinking is controlled in accordance with data transmitted via a downlink. When the light is reflected by the CCR 261, the reflected light on which data transmitted via the downlink is still being superimposed is then provided. However, when the uplink data transfer rate is slower than the downlink transfer rate, there is no problem. For example, if the uplink data transfer rate is slow, illuminative light intensity changes many times during a single data transfer due to high-speed change in illuminative light intensity as shown in FIG. 14W). For example, when modulation is carried out and incident light is reflected by the CCR 261 as described in FIG. 13, average light intensity between a bright and a dark area during a single data transfer is received by the light receiving unit 213 in the lighting side communication device 201. On the other hand, when the CCR 261 does not reflect light toward the light source, the light receiving unit 213 in the lighting side communication device 201 cannot even receive average light intensity. Therefore, data can be reliably transferred even using illuminative light on which data for a downlink is still being superimposed for an uplink.

On the other hand, when the downlink data transfer rate is roughly equal to or lower than the uplink data transfer rate, reflected illuminative light is available for an uplink if there is no time when illuminative light is completely shut off. FIG. 14(B) shows a case of the downlink data transfer rate being equal to the uplink data transfer rate. In this example, sub carrier binary phase shift keying (BPSK) is used as a downlink data modulation system. In this case, since illuminative light intensity never continuously stay in zero during single data transfer, the light receiving unit 213 in the lighting side communication device 201 can receive uplink data through sensing change in received light intensity even when modulation is carried out by allowing illuminative light to pass through or be shut off for an uplink.

In this manner, even when illuminative light is modulated, an uplink from the terminal side communication device 202 to the illumination light communication device 201 can be established by reflecting the modulated illuminative light and then modulating it in conformity with uplink data. Illuminative light has large electric power, and reflected light thereof also has large electric power. This allows high-quality uplink communication. In addition, since with a structure of using the CCR 261, reflected light returns to the incident light source, there is no need for tracking, and an uplink can be established with a simple structure. Moreover, there is an advantage that it is unnecessary to synchronize with the downlink. Furthermore, when using the CCR 261, irregular reflected light scarcely hits users' eyes, and thus the users scarcely sense brightness.

Figure 15:
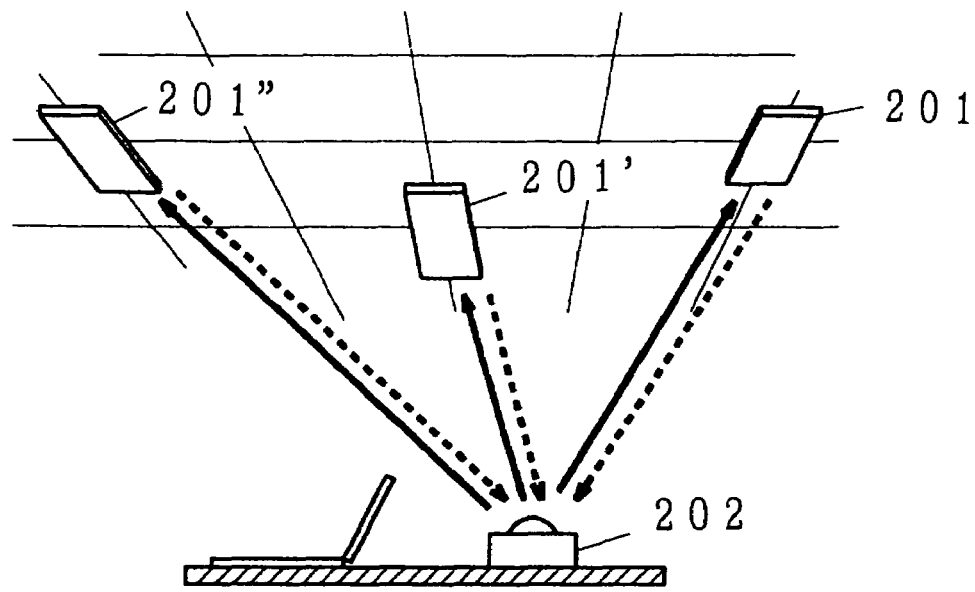
FIG. 15 is a diagram describing an exemplary usage of an illuminative communication device in which a CCR is provided as the reflector/modulator 224.
Figure 16:
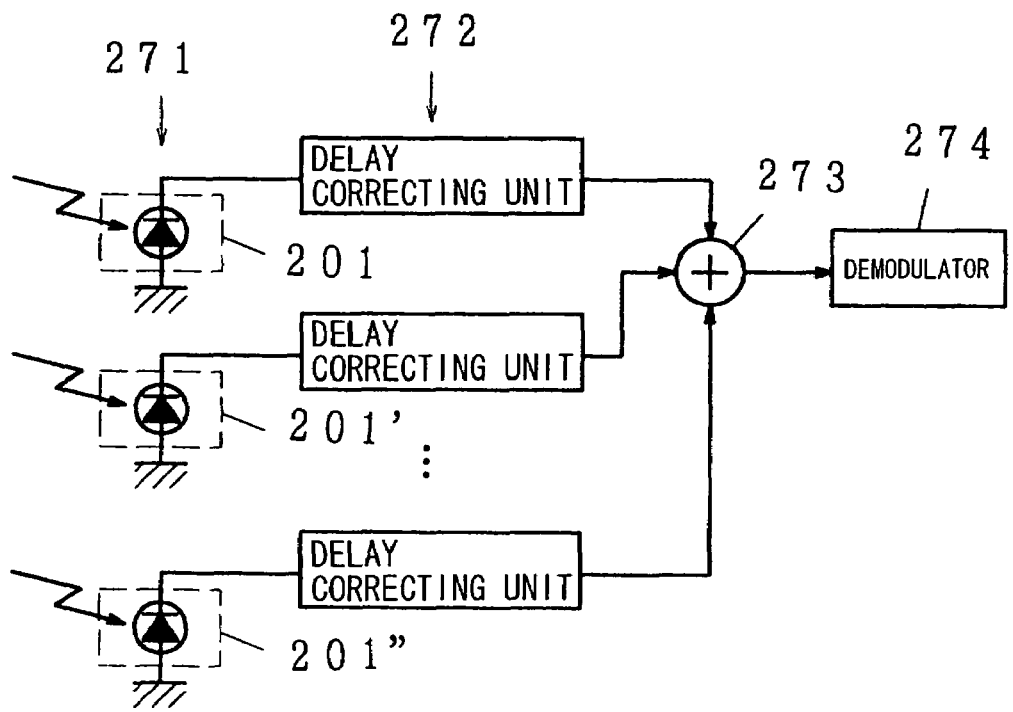
FIG. 16 is a diagram describing an exemplary method of combining received signals when multiple lighting side communication devices are provided in the exemplary usage of an illuminative light communication device in which a CCR is provided as the reflector/modulator 224.

FIG. 15 is a diagram describing an exemplary application of the illuminative light communication device which has the CCR as the reflector/modulator 224. FIG. 16 is a diagram describing an exemplary received signal combining method for the multiple lighting side communication devices. In the drawing, 271 denotes light receiving devices, 272 denotes delay correcting units, 273 denotes a combining unit, and 274 denotes a demodulator. As described above, the CCR is characterized in that it returns reflected light toward the light source. This feature is the same as that in the case where incident lights from multiple directions hit. For example, as shown in FIG. 15, when multiple lighting side communication devices 201, 201', and 201" emit respective illuminative lights, which then enter the terminal side communication device 202, illuminative light from the lighting side communication device 201 is reflected thereto by the CCR in the terminal side communication device 202, illuminative light from the lighting side communication device 201' is reflected thereto, and illuminative light from the lighting side communication device 201" is reflected thereto. As a result, uplink data transmitted from the terminal side communication device 202 is received by the multiple lighting side communication devices 201, 201', and 201".

The multiple lighting side communication devices 201, 201', and 201" can reliably receive data by combining electric signals obtained through reception of light. An exemplary circuit structure in this case is shown in FIG. 16. The light receiving devices 271 in the respective light receiving units 213 of the respective lighting side communication devices 201, 201', and 201" convert received lights to electric signals. The electric signals from the light receiving devices 271 are corrected for specified amounts of delays for respective lighting side communication devices 201, 201', and 201" by the delay correcting unit 272, and the resulting corrected electric signals are then combined by the combining unit 273. This may be done through simple addition, average electric power calculation, and/or weighting. The higher the signal intensity, the larger weight to be added. The combined electronic signals are demodulated by the demodulator, allowing data transmitted from the terminal side communication device 202 to be captured.

In this manner, since uplink data can be transmitted to the multiple lighting side communication devices, even if shadowing develops due to a passerby, which may cause disturbance of optical transmission to a lighting side communication device, other lighting side communication devices can receive light, allowing reliable communication. In this case, a CCR tracking mechanism is unnecessary, and disturbance of optical communication or shadowing can be solved by a simple structure. Note that three lighting side communication devices are shown in FIG. 15, but the present invention is not limited to this. Alternatively, two or four devices are available.

A case of using a single CCR has been described above; alternatively, multiple CCRs may be provided, for example, two-dimensionally. When multiple CCRs are provided, a modulating structure as shown in FIG. 13 should be provided for each of CCRs 261. By controlling all of them in the same manner, they can operate in the same manner as in the case of using a single CCR. For example, with a structure where the optical shutter 262 is used for modulation as shown in FIG. 13W), the optical shutter 262 may be shared by multiple CCRs.

In the case of providing multiple CCRs, it is possible to control respective multiple CCRs or respective groups of multiple CCRs to modulate. With such a structure, parallel data transmission from the terminal side communication device 202 is possible.

Figure 17:
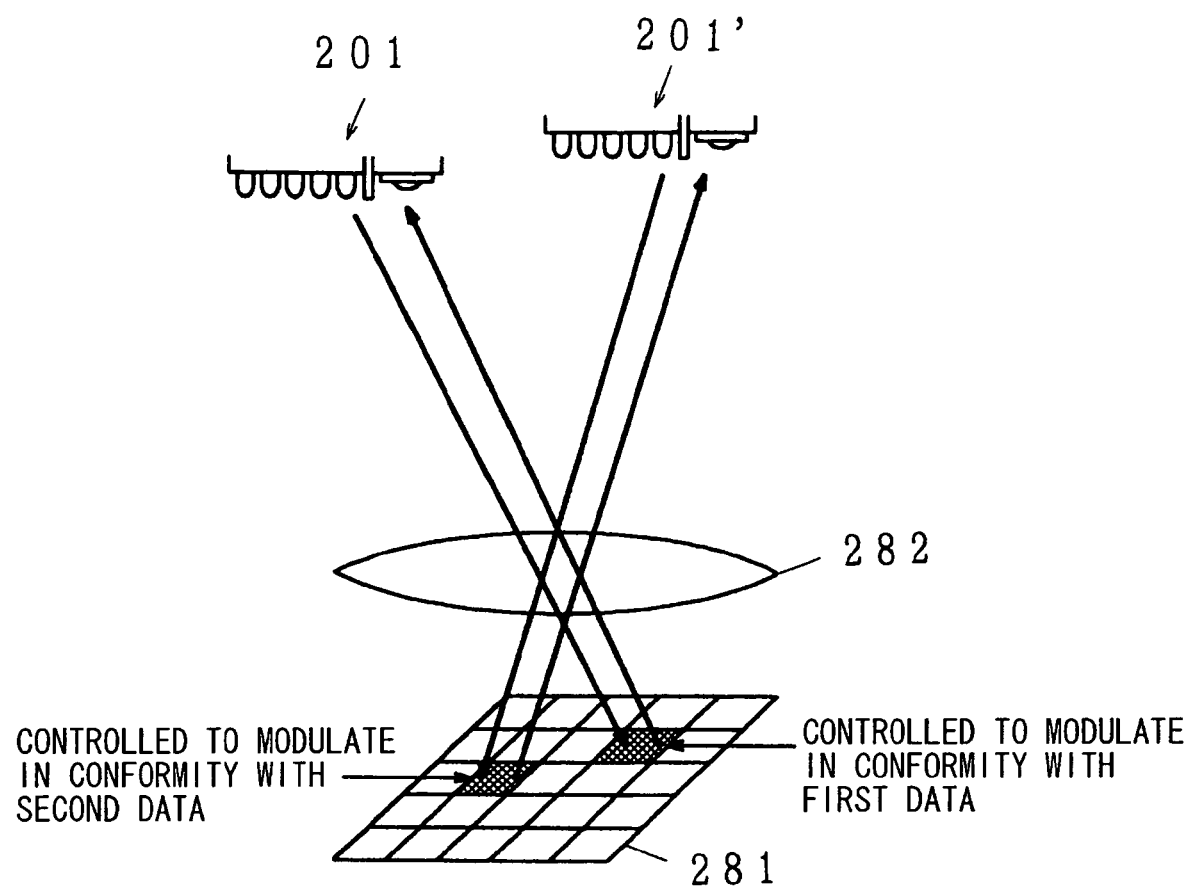
FIG. 17 is a diagram describing an exemplary structure of the reflector/modulator 224 in the terminal side communication device 2 capable of carrying out parallel transmission.

FIG. 17 is a diagram describing an exemplary structure which allows parallel transmission of the reflector/modulator 224 in the terminal side communication device 202. In the drawing, 281 denotes a CCR array, and 282 denotes a lens. The CCR array 281, which is made up of multiple CCRs, is structured such that respective multiple CCRs or respective groups of multiple CCRs can be controlled for modulation. When modulation for individual CCRs 281 is required using the optical shutter 262 shown in FIG. 13(A), an optical shutter capable of controlling for respective multiple CCRs or respective groups of multiple CCRs should be provided. In addition, with the structure allowing CCR mirror surfaces to change as shown in FIG. 13(C), the same structure can be provided for individual CCRs, and control for respective multiple CCRs or respective groups of multiple CCRs is possible.

The lens 282 is provided at the entrance (or exit) of the CCR array 281 and is controlled to form an image for illuminative lights, which have traveled from the lighting side communication devices 201 and 201' on the CCR mirror surface or in the vicinity thereof. With such a structure, incident lights emitted from the lighting side communication devices 201 and 201' hit only some of the CCRs in the CCR array 281. According to the characteristics of the CCR, some of the CCRs that incident illuminative light from the lighting side communication device 201 hits return reflected light thereto, while some of the CCRs that incident illuminative light from the lighting side communication device 201' hits return reflected light thereto. At this time, when the CCRs that respective incident illuminative lights hit are controlled to modulate in the same manner, the same data can be transmitted to the multiple lighting side communication devices 201 and 201' as described in FIG. 15.

Alternatively, CCRs that respective incident illuminative lights hit may be controlled to modulate in accordance with different pieces of data. In other words, the CCRs that incident illuminative light from the lighting side communication device 201 hits and that return reflected light thereto may be controlled to modulate in accordance with a first data while CCRs that incident illuminative light from the lighting side communication device 201' hits and that return reflected light thereto may be controlled to modulate in accordance with a second data. This allows transmission of the first data to the lighting side communication device 201 and the second data to the lighting side communication device 201'. Those pieces of data can be transmitted in parallel, allowing parallel communication.

Note that: CCRs that incident illuminative light hits may be predetermined; a simply structured light reception device may be provided together with CCRs; a light reception device may be combined with the CCR mirror surface; and/or a two-dimensional sensor and a lens system may be used as the light receiving unit 221 in the terminal side communication device 202 to allow identification of the position of the lighting side communication device. Needless to say, other structures are available.

The example of using reflected illuminative light for an uplink has been described above as the second embodiment. As with the aforementioned first embodiment, in the second embodiment, the lighting side communication device 201 may be provided in the same manner as conventionally available lighting elements, and the terminal side communication device 202 may be a portable terminal device, such as a notebook computer, a PDA, or a cellular phone. In addition, it is available in ordinary offices, stores, homes, public facilities, and an environment where radio wave communication is restricted such as hospitals, trains, airplanes, spaceships, and a site in which pacemaker users exist. Furthermore, use thereof is not limited to the indoors, and it is available for various applications, such as neon signs, lighting for advertisement, or communication among automobiles or among facilities on the street and automobiles in a transportation system.

Moreover, the second embodiment may be modified into various modifications as with the aforementioned first embodiment. The structure of the light receiving unit 213 in the lighting side communication device 201 shown in FIG. 8 and structure of the light emitting unit 222 in the terminal side communication device 202 shown in FIG. 9 may be used, and power line communication for data transmitted from and received by the lighting side communication device 201 is available. Needless to say, besides such modifications, a variety of other modifications are possible.

As described above, the conventional illuminative light communication allows only downlink optical communication. However, the second aspect of the present invention allows uplink optical communication, allowing bi-directional optical communication.

In addition, reflected illuminative light may be used for an uplink. In this case, high-quality communication is possible using illuminative light with large electric power. Furthermore, use of CCRs allows establishment of uplink optical communication with a simple structure that does not need tracking.

(Third Aspect of the Present Invention)

Next, the third aspect of the present invention is described forthwith. In the case of illuminative light communication, there is a problem that communication cannot be carried out without lighting. The third aspect of the present invention also uses infrared data communication to allow communication even without lighting. To begin with, a typical configuration of a light emitting diode (LED) for lighting used for the third aspect of the present invention is described.

Figure 25:
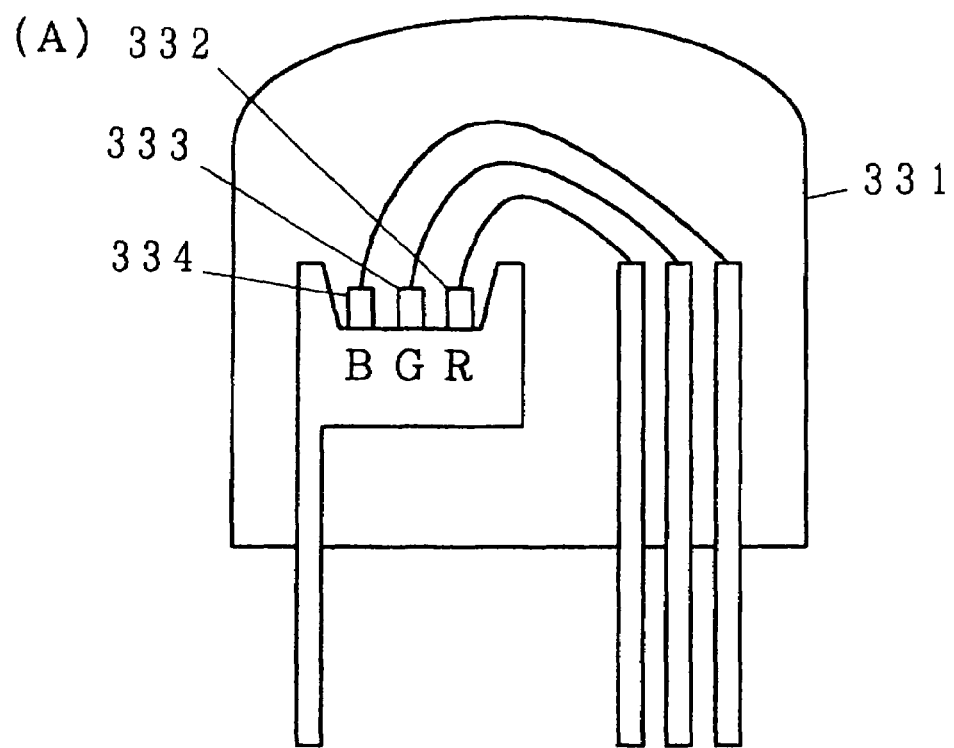
FIG. 25 is a diagram of an exemplary structure of a typical white LED.
Figure 25:
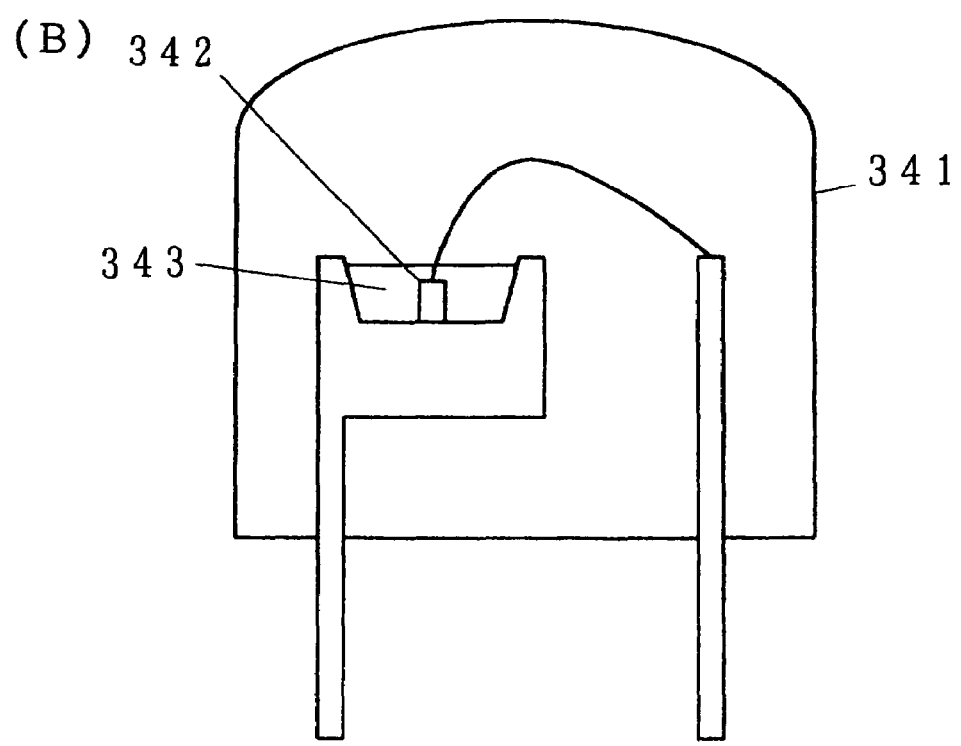

FIG. 25 is a diagram of a configuration of an exemplary typical white LED. In the drawing, 331 and 341 denote LED devices, 332 denotes a red light emitting element, 333 denotes a green light emitting element, 334 denotes a blue light emitting element, 342 denotes a light emitting element, and 343 denotes fluorescer. An exemplary white LED shown in FIG. 25(A) is configured such that the red light emitting element 332, the green light emitting element 333, and the blue light emitting element 334 are arranged in the LED device 331. White light can be seen when red, green, and blue light emitted from respective light emitting elements are mixed.

In the case of an exemplary white LED shown in FIG. 25(B), a blue or an ultraviolet light emitting element 342 is provided in the LED device 341, and the fluorescer 343 is provided surrounding the light emitting element 342. As with a fluorescent lamp, the LED device 341 has the fluorescer 343, which emits white light when blue light or ultraviolet light emitted from the light emitting element 342 is irradiated on the fluorescer 343. As a result, white light is emitted.

Since such single LED device has less light intensity for lighting, an LED array made up of multiple LED devices is typically used. In the following description, the LED array may be referred to as just LED. Such LED array is used for some traffic control signals, rear lamps of an automobile, desk lamps, and foot lights, for example. The features of LEDs are longer life, smaller size, and lower power consumption than those of conventional illuminative light sources such as incandescent lamps and fluorescent lamps. Accordingly use of LEDs as a future illuminative light source is considered.

In addition, another feature of light emitting elements such as LEDs is a very fast response speed since a preheating time is unnecessary. Paying attention to those features such as a fast response speed and electrical controllability, a study of superimposing a signal on an illuminative LED light and thereby transferring the signal has been conducted.

Lighting elements are often provided on the ceiling or a wall surface, or a pole is set up to irradiate a certain area from above, thereby preventing generation of a shadow. Typically, wireless communication including optical communication has a problem of shadowing which causes decrease in signal intensity and disturbance in communication behind an object. However, since lighting elements are often provided so as to prevent shadowing as described above, this means that illuminative light communication is possible without development of shadowing. In addition, there is an advantage that high communication quality is ensured using a high electric power for lighting.

However, use of illuminative light develops a problem that illuminative light communication cannot be carried out without lighting. Lights may be kept on even when unnecessary. However, users may not appreciate keeping lights turned on when unnecessary in view of energy conservation, or lighting may be prohibited at night, for example. There is a problem that communication cannot be carried out without lighting and cannot be carried out when unattended, at night, or while using a projector.

On the other hand, infrared light communication has been widely used, and standardization has been carried out by the infrared data association (IrDA) or the like. There is fear that infrared light communication may adversely influence the human body such as eyes. As a result, it is impossible to carry out high electric power communication. In addition, it is characterized in that it is easily influenced by shadowing, which causes decrease in communication quality due to characteristics of light when an obstruction such as a user exists. From these reasons, an available range is limited, and that communication may not be stably carried out.

To solve such problems, a communication device with the following structure uses illuminative light and infrared light together and is available even without lighting.

Figure 18:
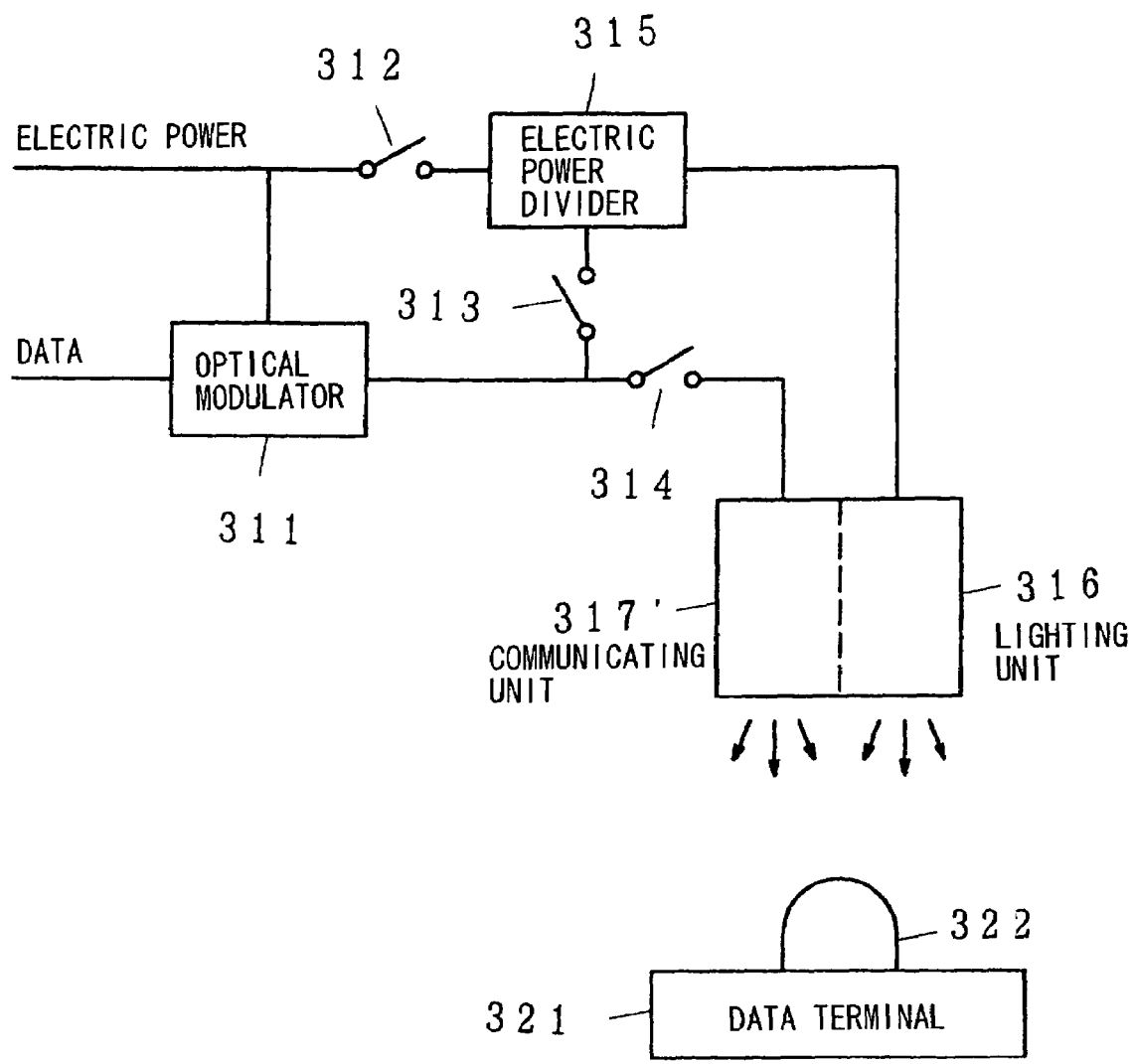
FIG. 18 is a block diagram of an illuminative light communication device, according to a first embodiment of a third aspect of the present invention.

FIG. 18 is a block diagram of an illuminative light communication device, according to a first embodiment of the third aspect of the present invention. In the drawing, 311 denotes an optical modulator, 312 through 314 denote switches, 315 denotes an electric power divider, 316 denotes a lighting unit, 317 denotes a communicating unit, 321 denotes a data terminal, and 322 denotes a light receiving unit. A light source which emits light for lighting is provided in the lighting unit 316. Since a semiconductor light emitting element capable of operating at a fast response speed such as a white LED is used as a light source, illuminative light communication is possible by controlling blinking and/or light intensity. In addition, the communicating unit 317 may transmit data using an optical communication method other than illuminative light communication such as infrared light communication. Note that the lighting unit 316 and the communicating unit 317 may be deployed in the same device to be described later. Needless to say, those may be formed separately.

The optical modulator 311 and the electric power divider 315, which are used as a modulation means according to the third aspect of the present invention, modulate illuminative light by controlling blinking and/or light intensity of the lighting unit 316 in conformity with data. In this exemplary structure, the optical modulator 311 modulates received data using a predetermined modulation method, superimposes the resulting modulated data on an electric power waveform, and then transmits the resulting superimposed data waveform to the electric power divider 315 via the switch 313 or to the communicating unit 317 via the switch 314. This allows control of light intensity and on/ off control of the lighting unit 316 and the communicating unit 317.

The electric power divider 315 mainly supplies electric power to the lighting unit 316. When an electric power superimposed with modulated data to be transmitted from the optical modulator 311 via the switch 313 is supplied, this electric power is supplied to the lighting unit 316.

The switches 312 through 314, which are switching means of the third aspect of the present invention, are turned on or off in conformity with an external command for turning on or off. The switch 312 allows or prohibits electric power supply to the electric power divider 315, thereby turning lights on or off. The switch 313 allows or prohibits provision of the modulated data to the electric power divider 315, thereby allowing or prohibiting transmission of data via illuminative light (illuminative light communication) while the lighting unit 316 is illuminating. The switch 314 allows or prohibits transmission of the modulated data to the communicating unit 317. Note that either the switch 312 or the switch 313 is turned on or both of them are turned off at the same time.

Figures 19, 20:
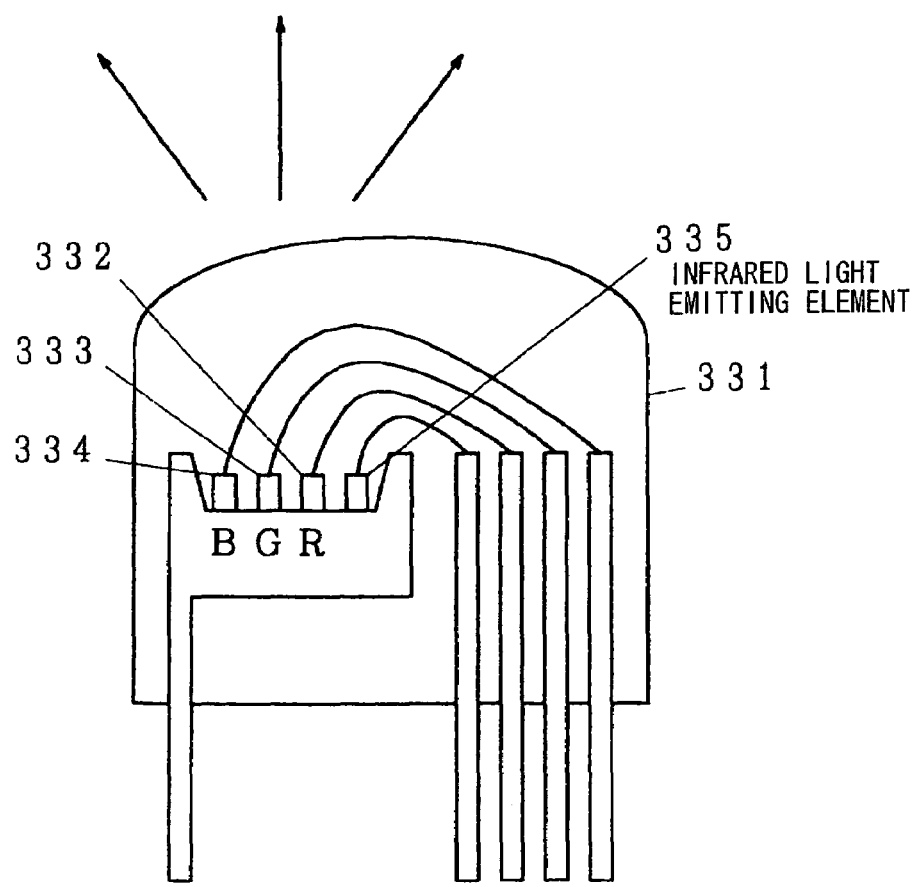
FIG. 19 is a table describing exemplary operations defined according to respective combinations of an ON and an OFF status of switches 12 through 14.
FIG. 20 is a schematic diagram of an exemplary lighting element, according to the third aspect of the present invention, which is preferable to being used for the illuminative light communication device, according to the third aspect of the present invention.

FIG. 19 is a table describing exemplary operations defined according to respective combinations of an on and an off status of the switches 312 through 314. When the switch 312 is on, the switch 313 is off, and the switch 314 is on, the communicating unit 317 carries out communication while the lighting unit 316 is illuminating as shown in FIG. 19(1). Note that in FIG. 19, communication by the communicating unit 317 is described as 'infrared light communication', but the present invention is not limited to this. When setting of the switches 312 and 313 is the same as that just described, and the switch is off, only lighting is carried out without carrying out communication as shown in FIG. 19(2). In this case, illuminative light is not used for communication. When the switch 312 is off, the switch 313 is on, and the switch 314 is on, as shown in FIG. 19(3), the lighting unit 316 carries out lighting and illuminative light communication, and the communicating unit 317 also carries out data communication. In this configuration, when the switch 314 is off, the lighting unit 316 carries out lighting and illuminative light communication as shown in FIG. 19(4). When both switches 312 and 313 are off, the lighting unit 316 is not used. In this configuration, when the switch 314 is on, the communicating unit 317 carries out data communication as shown in FIG. 19(5). Otherwise, when the switch 314 is off, neither lighting nor communication is carried out as shown in FIG. 19(6).

For example, in the case of carrying out communication when lighting is needed, data communication by the communicating unit 317 or illuminative light communication by the lighting unit 316 may be carried out by turning the switch 312 on, the switch 313 off, and the switch 314 on as shown in FIG. 19(1), or turning the switch 312 off, the switch 313 on, and the switch 314 either on or off as shown in FIG. 19(3) or FIG. 19(4). On the other hand, when lighting is unnecessary, data communication by the communicating unit 317 is carried out by turning both switches 312 and 313 off, and the switch 314 on as shown in FIG. 19(5).

As described above, illuminative light communication with lighting is possible, and communication without lighting is also possible. When infrared light communication is used as a communication method for the communicating unit 317 as described above, since infrared light is invisible, a person cannot sense the brightness during communication. Therefore, communication can be carried out even without lighting.

Figure 21:
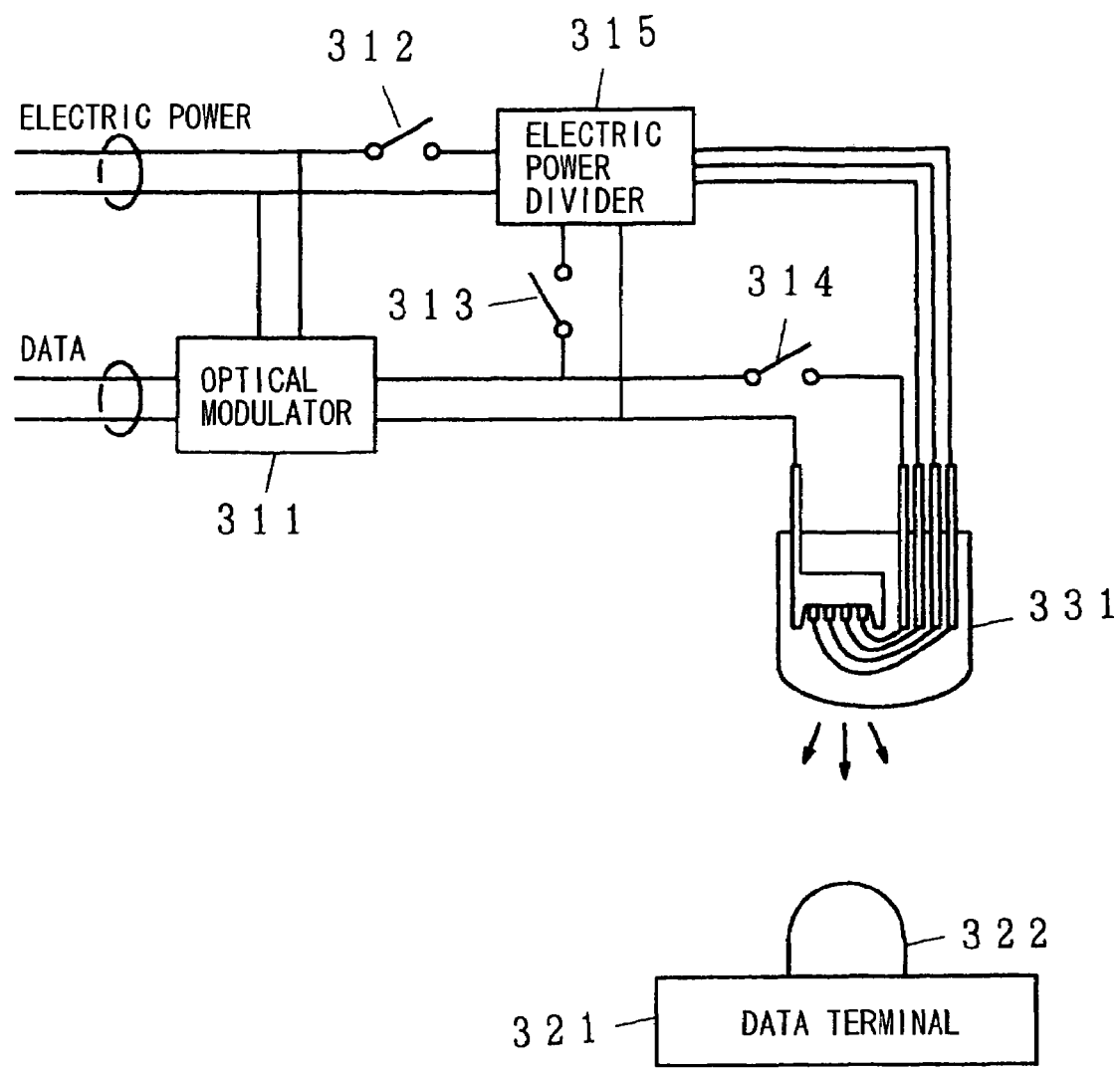
FIG. 21 is a diagram describing an application of an exemplary lighting element, according to the third aspect of the present invention, to the illuminative light communication device, according to the third aspect of the present invention.

FIG. 20 is a schematic diagram of an exemplary lighting element, according to the third aspect of the present invention, which is preferable to be used for the illuminative light communication device, according to the third aspect of the present invention. FIG. 21 is a diagram describing an exemplary application of the lighting element, according to the third aspect of the present invention, to the illuminative light communication device, according to the third aspect of the present invention. In the drawing, the same symbols are given to the same parts as those in FIG. 25, and repetitive descriptions thereof are thus omitted. 335 denotes an infrared light emitting element. As shown in FIG. 25, needless to say, typical LEDs for lighting emit only visible lights, and do not emit infrared light. Accordingly, in the case of carrying out infrared light communication by the communicating unit 317 as described above, an infrared light LED must be additionally provided as the communicating unit 317. Needless to say, different LEDs may be used in the lighting unit 316 and the communicating unit 317. Alternatively, since both LEDs have similar structures, they can be integrated into one. An example of this case is shown in FIG. 20.

In the example shown in FIG. 20, the infrared light emitting element 335 is provided in an LED which emits white light by mixing red, green, and blue emitted lights as shown in FIG. 25(A). Even though the infrared light emitting element 335 is provided in this manner, the package size is several millimeters wide and several millimeters high, which is almost the same as that of typical LEDs.

To use such lighting element in an illuminative light communication device, as shown in FIG. 21, the red light emitting element 332, the green light emitting element 333, and the blue light emitting element 334 are electrically connected to the electric power divider 315 so as to receive electric power with lighting or modulated electric power during illuminative light communication. In addition, the infrared light emitting element 335 is connected to the optical modulator 311 via the switch 314, allowing the optical modulator 311 to modulate and drive the infrared light emitting element 335 when the switch 314 is turned on. Furthermore, a shared electrode may be grounded along with the optical modulator 311 and the electric power divider 315.

For ordinary lighting, a visible white illuminative light is emitted by mixing three color lights emitted from the red light emitting element 332, the green light emitting element 333, and the blue light emitting element 334. High-speed modulation of this illuminative light allows illuminative light communication. In addition, light emitted from the infrared light emitting element 335 is invisible. However, high-speed modulation of light to be emitted allows wireless communication using invisible infrared light.

As described above, illuminative light communication by carrying out high-speed modulation of respective lights emitted from the red light emitting element 332, the green light emitting element 333, and the blue light emitting element 334, and infrared light communication by carrying out high-speed modulation of light emitted from the infrared light emitting element 335 can be changed over by changing settings of the switches 312 through 314 as described above. For example, when both lighting and communication are required, the red light emitting element 332, the green light emitting element 333, and the blue light emitting element 334 are operated to emit respective lights, and at the same time the emitted lights are modulated at a high speed, thereby transmitting data. As a result, since an optical power needed for lighting may also be used for communication, high-speed and high-quality communication can be carried out. In addition, when lighting is unnecessary but communication is required, communication is carried out by modulating and driving the infrared light emitting element 335 and operating it to emit infrared light. In this case, since infrared light is invisible, communication can be carried out even without lighting. In addition, typically, since people are often absent when lights are off, adverse influences on the human body such as eyes can be decreased.

Needless to say, infrared light communication may also be carried out with lighting, by modulating and driving the infrared light emitting element 335. In this case, what should be done on a receiver side is to receive only infrared light, and there is no need to deal with multiple wavelengths, allowing provision of a simplified structure.

Alternatively, communication using both illuminative light and infrared light may be carried out by modulating and driving respective lights from the red light emitting element 332, the green light emitting element 333, the blue light emitting element 334, and also modulating and driving light from the infrared light emitting element 335. In this case, since all power is available, higher-speed and higher-quality communication than that using the aforementioned methods is possible.

Note that since the red light emitting element 332, the green light emitting element 333, the blue light emitting element 334, and the infrared light emitting element 335 in the configuration shown in FIG. 20 may be driven independently, multiple pieces of data can be transmitted at the same time by dividing wavelengths.

Figure 22:
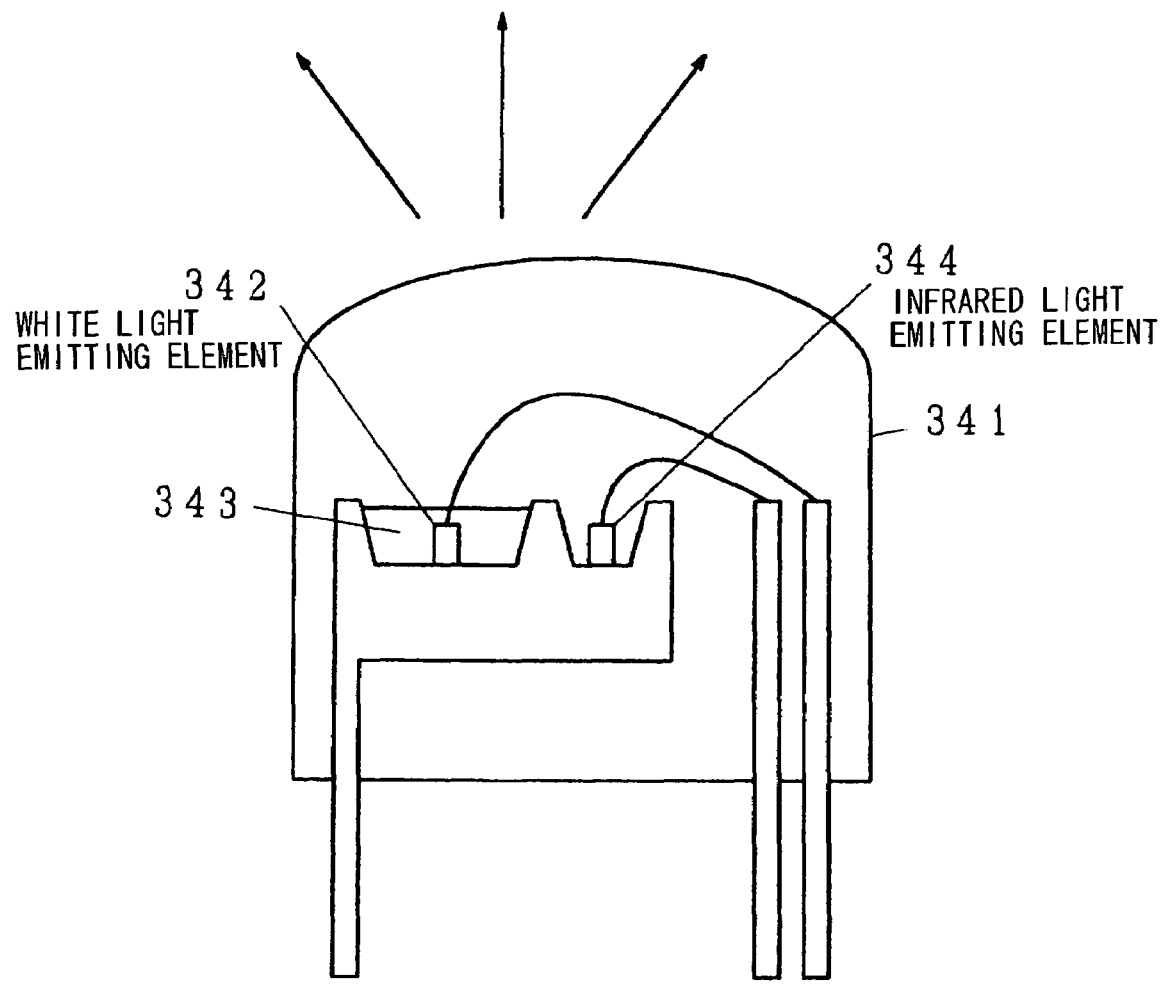
FIG. 22 is a schematic diagram of another exemplary lighting element, according to the third aspect of the present invention, which is preferable to being used for the illuminative light communication device, according to the third aspect of the present invention.
Figure 23:
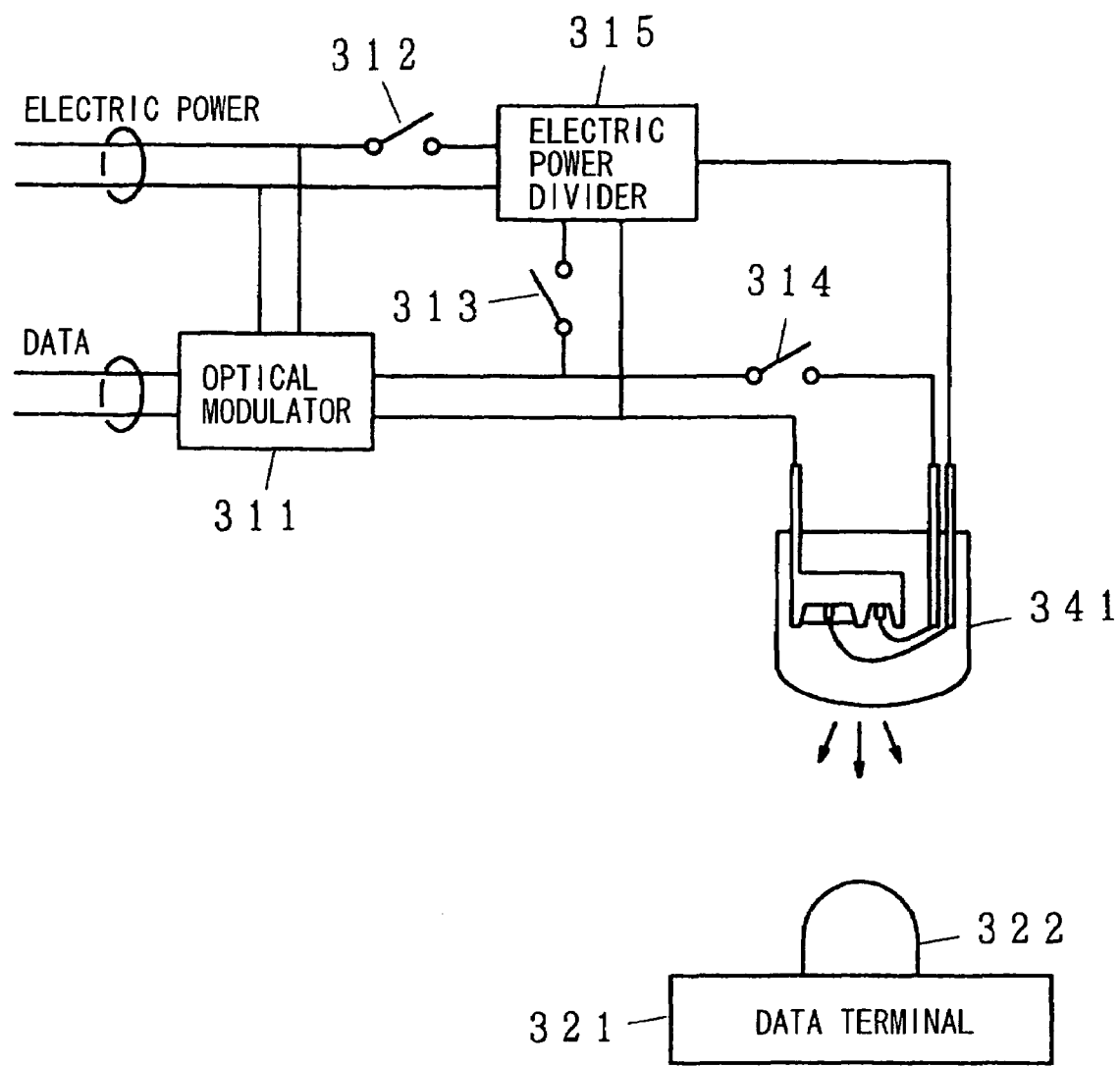
FIG. 23 is a diagram describing another application of an exemplary lighting element, according to the third aspect of the present invention, to the illuminative light communication device, according to the third aspect of the present invention.

FIG. 22 is a schematic diagram of another exemplary lighting element, according to the third aspect of the present invention, which is preferable to be used for the illuminative light communication device according to the third aspect of the present invention. FIG. 23 is a diagram describing another application of an exemplary lighting element, according to the third aspect of the present invention, to the illuminative light communication device according to the third aspect of the present invention. In the drawing, the same symbols are given to the same parts as those in FIG. 25, and repetitive descriptions thereof are thus omitted. 344 denotes an infrared light emitting element. In the example shown in FIG. 22, the infrared light emitting element 344 is provided in the LED device 341 structured as shown in FIG. 25(B).

To use such a lighting element in the illuminative light communication device, as shown in FIG. 23, the light emitting element 342 is electrically connected to the electric power divider 315 and receives electric power with lighting, and receives modulated power during illuminative light communication. In addition, the infrared light emitting element 335 is electrically connected to the optical modulator 311 via the switch 314, allowing the optical modulator 311 to modulate and drive the infrared light emitting element 335 while the switch 314 is turned on. Furthermore, a shared electrode may be grounded along with the optical modulator 311 and the electric power divider 315.

For ordinary lighting, white light is emitted by irradiating the fluorescer 343 with blue light or ultraviolet light emitted from the light emitting element 342. In this case, illuminative light can be used for communication by carrying out high-speed modulation and driving the light emitting element 342. In addition, modulation and driving of the infrared light emitting element 344 allow wireless communication using invisible infrared light.

As with the example shown in FIG. 20, when both lighting and communication are required, modulation and driving of the light emitting element 342 are carried out, thereby transmitting data. As a result, since optical power needed for lighting can also be used for communication, high-speed and high-quality communication can be carried out. In addition, when lighting is unnecessary but communication is required, communication is carried out by modulating and driving the infrared light emitting element 335 to emit infrared light. In this case, since infrared light is invisible, communication can be carried out without lighting. In addition, typically, since people are often absent when lights are off, adverse influences on the human body such as eyes can be decreased.

Needless to say, as with the example shown in FIG. 20, with lighting, infrared light communication may be carried out by modulating and driving the infrared light emitting element 344, or by modulating and driving both the light emitting element 342 and the infrared light emitting element 344. Note that according to the configuration shown in FIG. 22, it is possible to transmit different pieces of data in parallel by driving the light emitting element 342 and the infrared light emitting element 344 individually, however, it is impossible to transmit different pieces of data via a red, a green, and a blue illuminative light wavelength, respectively.

Figure 24:
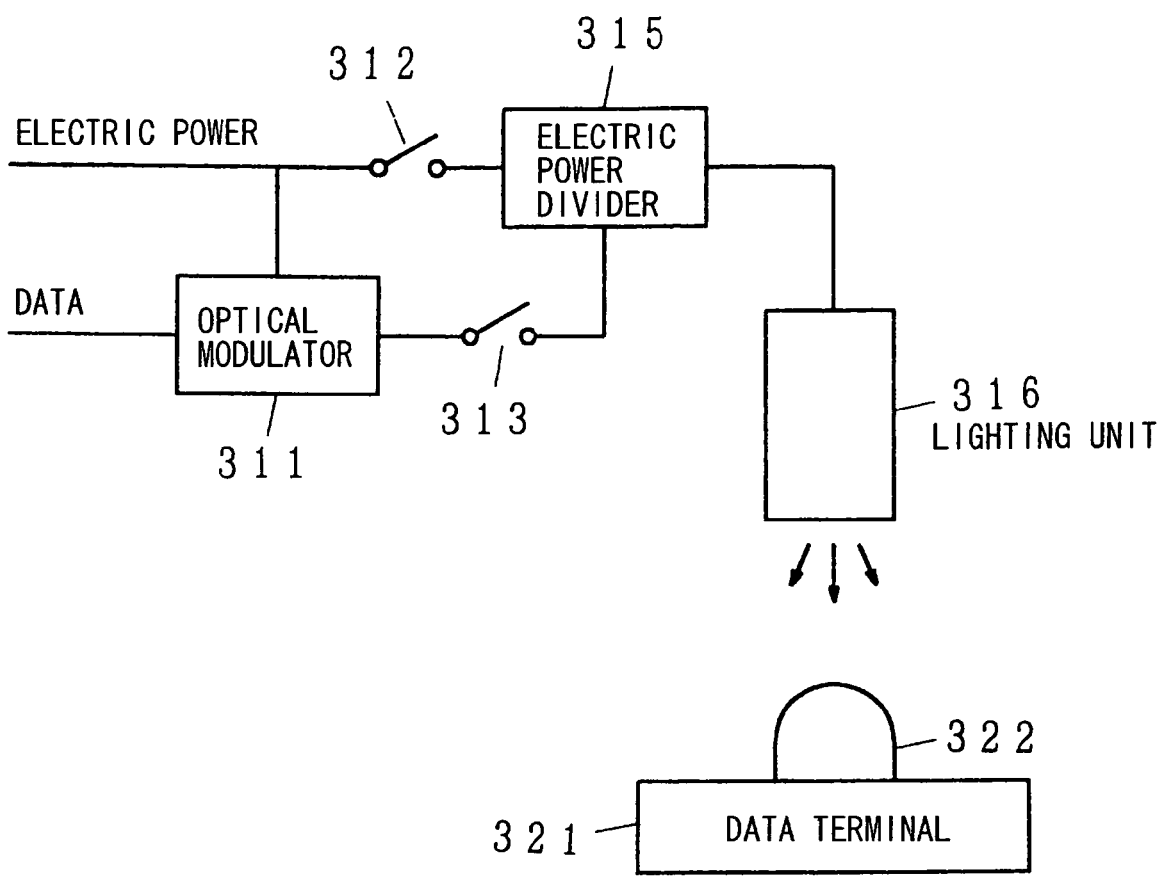
FIG. 24 is a block diagram of an illuminative light communication device, according to a second embodiment of the third aspect of the present invention.

FIG. 24 is a block diagram of an illuminative light communication device, according to a second embodiment of the third aspect of the present invention. Symbols in the drawing are the same as those in FIG. 18. According to the aforementioned first embodiment, communication without lighting is carried out by the communicating unit 317, which is additionally provided. In the second embodiment, an example where communication is carried out by a lighting unit 316 without a communicating unit 317 without lighting is shown.

In this exemplary structure, a switch 312 is used for turning lights on or off while a switch 313 is used for changing over between carrying out and not carrying out communication.

An electric power divider 315 drives the lighting unit 316 in accordance with the statuses of the respective switches 312 and 313. It carries out optical communication by modulating in accordance with data to be transmitted while supplying electric power sufficient for lighting to the lighting unit 316. On the other hand, it carries out communication without lighting by modulation-controlling in conformity with data to be transmitted so as to make the lighting unit 316 blink a necessary number of times for communication.

For example, when the switches 312 and 313 are turned on, illuminative light communication is carried out through modulation while the lighting unit 316 is illuminating. In addition, when the switch 312 is turned off and the switch 313 is turned on, communication is carried out by driving the lighting unit 316 in conformity with a modulation signal from an optical modulator 311, and making the lighting unit 316 emit for a short time in conformity with data to be transmitted. Short time light emission is unperceivable. Accordingly, even when light is actually emitted, it appears to the human eye as if not illuminating, thereby allowing carrying out communication even when not illuminating. Note that when the switch 312 is turned on and the switch 313 is turned off, ordinary lighting is carried out; otherwise, when both the switches 312 and 313 are turned off, communication is not carried out without lighting.

In this manner, since without lighting, the lighting unit 316 is controlled not to continuously illuminate, but is allowed to illuminate for a short time in conformity with data, visible light communication can be carried out by the lighting unit 316 while it appears to the human eye as if not illuminating.

As described above, other than communication through short time light emission, communication by making the lighting unit 316 emit a low intensity of light that allows communication is possible. In this case, without lighting, communication is often possible as long as lighting is not completely prohibited, or illuminating with almost the same intensity as that provided by a safety lamp.

As described above, the third aspect of the present invention allows provision of an illuminative light communication device capable of carrying out communication even without lighting, and also provision of a lighting element preferable to be used for the illuminative light communication device.

An illuminating facility may be available around the clock, or otherwise, may not illuminate while unattended, while surrounded by sunlight or while using a projector. An attempt of data transmission using only illuminative light in such a case develops a problem that lighting is required as data is transmitted. The third aspect of the present invention allows communication even without lighting by carrying out infrared light communication without lighting, or by using a low light intensity for short-time communication.

In addition, in the case of using infrared light communication, provision of a lighting element integrally made up of an illuminative light emitting element and an infrared light emitting element allows infrared light communication without lighting, as described above. Furthermore, lights ranging from visible light to infrared light can be emitted by an integrated element, which allows decrease in device size. In other words, rather than using an independent lighting system and an independent infrared data communication system, a new compact system structured by integrating lighting elements can be provided. From a different point of view, wireless infrared light data communication has been well-known, but it has been structured regardless of lighting. In other words, a transmitter/receiver unit other than a lighting unit is fixed to the ceiling. Therefore, it is often difficult to fix it across a large area of the ceiling, and an adverse influence of shadowing or the like may prevent utilization thereof. However, use of the lighting elements, according to the third aspect of the present invention, allows easy integration of an infrared light data communication system and a lighting system. Since lighting units are typically fixed to a large area of the ceiling or the like, the lighting elements, according to the third aspect of the present invention, can be easily fixed to the large area for data communication. As a result, an adverse influence of shadowing is decreased, and reliable wireless infrared light communication can be provided.

(Fourth Aspect of the Present Invention)

To begin with, the fourth aspect of the present invention is described. According to the aforementioned first through the third aspect of the present invention, an exemplary communication using illuminative light emitted directly from lighting elements has been described. The fourth aspect of the present invention shows an exemplary structure for transmitting illuminative light modulated in conformity with data via an optical fiber to a site for lighting and communication.

Figure 32:
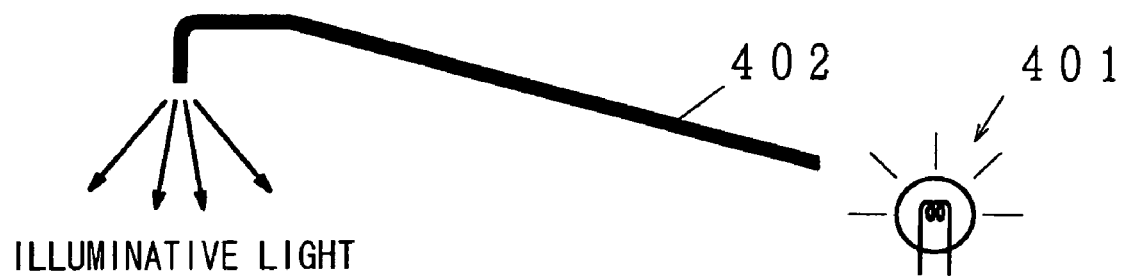
FIG. 32 is a diagram describing an example of a conventional lighting element using an optical fiber.

FIG. 32 is a diagram describing an exemplary conventional lighting element using an optical fiber. In the drawing, 401 denotes a light source, and 402 denotes an optical fiber. As shown in FIG. 32, in the conventional lighting element using the optical fiber 402, light emitted from the light source 401 such as a halogen lamp, an LED, or a laser enters an end of the optical fiber 402, which then emits to the outside from the other end. This emitted light is used for lighting.

According to this method, since light with a favorable rectilinear progression characteristic is emitted from a point light source or an end of the optical fiber 402, a large amount of light is emitted to a narrow viewing angle. Therefore, when directly looking at an end of the optical fiber 402, it is very bright. In addition, there is a disadvantage that wide-range lighting is impossible. To solve this problem, a diffusing plate is provided at the output end of the optical fiber 402 to diffuse light emitted from that end of the optical fiber 402, thereby widely emitting light, and reducing brightness.

On the other hand, indoor wireless optical communication technologies have been used along with advancement in high-speed communication technologies. More specifically, the infrared LAN has been widely used not only in offices but also homes. However, a transmitter/receiver, which is an access point to the infrared LAN, must be provided on the ceiling. When there is an interference between the access point and a terminal, data communication is typically impossible. Furthermore, it is necessary to control electric power for preventing an adverse influence on the human body such as eyes, and is thus impossible to carry out high-speed and high-quality communication.

To solve such problems, an illuminative light communication system has been considered. The fourth aspect of the present invention shows a structure for carrying out lighting and communication using an optical fiber.

Figure 26:
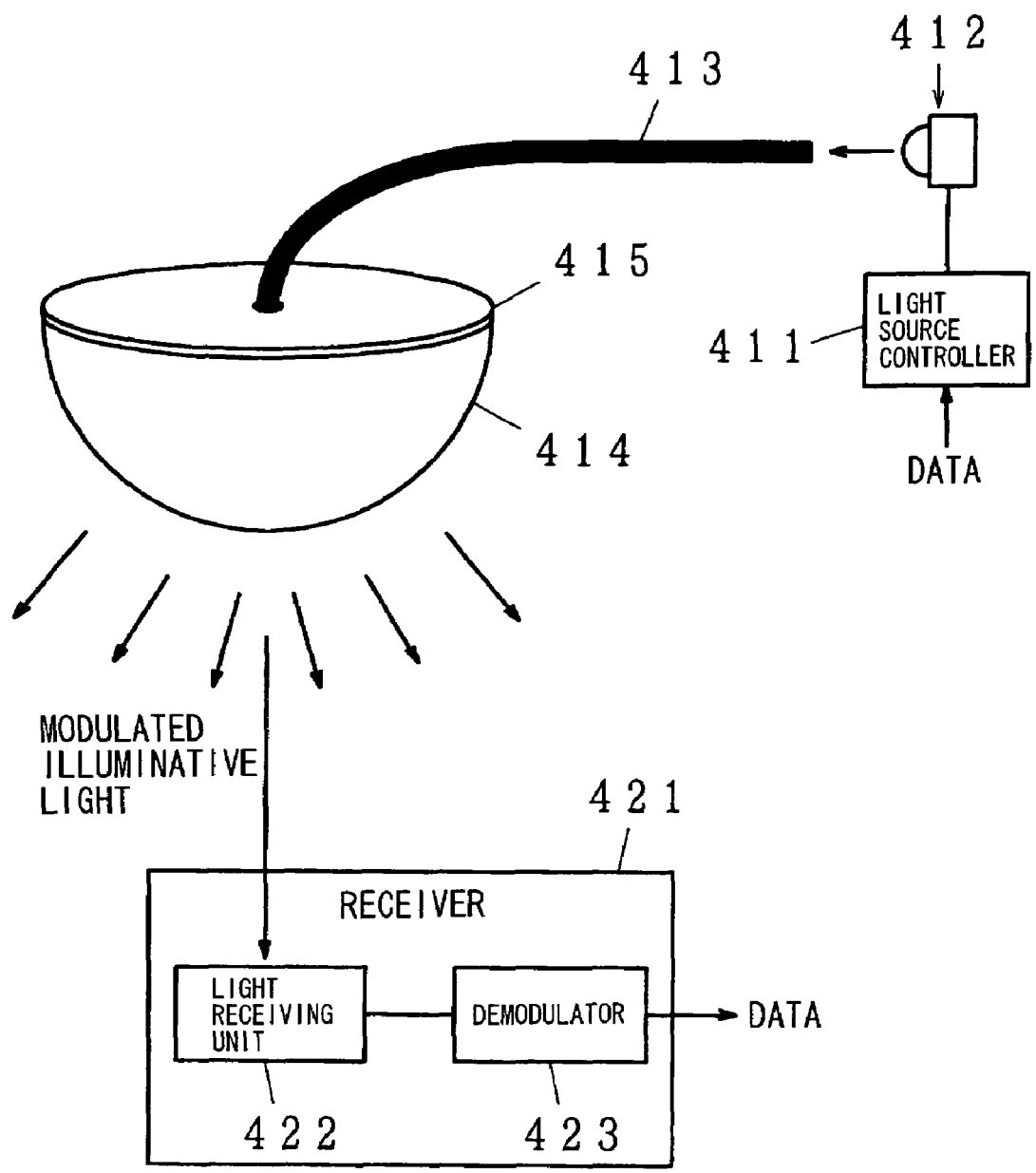
FIG. 26 is an explanatory diagram of a first embodiment of a fourth aspect of the present invention.

FIG. 26 is an explanatory diagram of a first embodiment of the fourth aspect of the present invention. In the drawing, 411 denotes a light source controller, 412 denotes a light source, 413 denotes an optical fiber, 414 denotes a light scatterer, 415 denotes a reflector plate, 421 denotes a receiver, 422 denotes a light receiving unit, and 423 denotes a demodulator. A high-speed response device such as an LED or a laser diode is used as the light source 412, which emits light for lighting.

The light source controller 411 controls blinking or light intensity of the light source 412 in accordance with data to be transmitted. As a result, modulated light is emitted from the light source 412.

The optical fiber 413 sends light emitted by the light source 412 from one end to the other end. A glass fiber and a plastic optical fiber (POF) may be used as the optical fiber 413. According to comparison of these fibers, since the POF is lighter and can have a larger diameter than a glass fiber, optical energy density per POF cross section is lower than that of the glass fiber. As a result, higher power optical energy may be transmitted. In addition, the POF can be easily connected and has more flexibility than the glass fiber.

The light scatterer 414 is provided at an end of the optical fiber 413, and radiates light transmitted through the optical fiber 413. A high-intensity scattering optical transmission polymer may be used as the light scatterer 414. The high-intensity scattering optical transmission polymer may be made of a highly scattering optical transmission (HSOT) polymer having a micron-order of a non-uniform structure in, for example, a photonics polymer, and may be used as a highly effective visible light scatterer for a lighting element. When using the POF as the optical fiber 413, since the light scatterer 414 and the optical fiber 413 are made of plastic, integrating them into one is possible. For example, this integration may be carried out by individually fabricating each of them, or alternatively, by making adjustments to additives and fabrication conditions. The light scatterer 414 may have an arbitrary shape. For example, it may have a hemispherical shape as shown in FIG. 26, to the center of which an end of the optical fiber 413 is connected.

The reflector plate 415 has a mirror surface facing the light scatterer 414, and returns scattered light from the top of the light scatterer 414 into the light scatterer 414 so as to increase the amount of scattered light from the bottom of the light scatterer 414. This reflector plate 415 may be made of another material. Alternatively, it may have a reflecting surface formed by coating or depositing a reflector material upon a reflecting surface. Note that this exemplary structure is assumed to have the hemispherical light scatterer 414 as shown in FIG. 26 to illuminate from a room ceiling. In such a case, since the flat surface of the hemisphere faces the ceiling, and emission of scattered light from this surface is unnecessary, the reflector plate 415 is provided on the flat surface of the light scatterer 414 so as to increase lighting efficiency.

However, when it is unnecessary to improve the shape of a lighting element and/or lighting efficiency, a structure without the reflector plate 415 is possible.

The receiver 421 receives the modulated scattered light emitted from the light scatterer 414 via the optical fiber 413 as described above, resulting in reception of the transmitted data. To do this operation, it is made up of a light receiving unit 422 and a demodulator 423. The light receiving unit 422 receives modulated scattered light emitted from the light scatterer 414 via the optical fiber 413, converts it to an electric signal, and then transmits the resulting signal to the demodulator 423. The demodulator 423 demodulates the electric signal corresponding to the intensity of the light received by the light receiving unit 422, and reconstructs the original data. This allows reception of transmitted data.

An exemplary operation of a first embodiment according to the aforementioned fourth aspect of the present invention is described. The fourth aspect of the present invention can be used as a lighting element as is when not transmitting data. In other words, light emitted from the light source 412 enters into and passes through the optical fiber 413, and then enters the light scatterer 414. The light scatterer 414 scatters the incident light from the optical fiber 413, and scatters and radiates it. Note that light emitted from the flat top surface of the hemispheric light scatterer 414 is reflected by the reflector plate 415, entering the light scatterer 414 again, and is then scattered. This light scattered by the light scatterer 414 should be used as illuminative light.

In this manner, when using the light scatterer 414 as a lighting element, the light scatterer 414 is provided at an output end of the optical fiber 413, and light passing through the optical fiber 413 is radiated as scattered light. Therefore, brightness per unit area is lower than that provided through directly illuminating from an end of the optical fiber 413. Accordingly, in direct sight, it is not so bright. In addition, the light scatterer 414 can illuminate a wide area.

Furthermore, in the case of integrating the light scatterer 414 and the optical fiber 413 into one, only the light scatterer 414 needs to be provided indoors, and large devices such as conventional lighting elements are unnecessary. In addition, indoor light sources such as conventional lighting elements are unnecessary as long as light can be transferred via the optical fiber 413 regardless of the position of the light source 412. Accordingly, when used in a place where a problem such as an electrical short circuit may develop, the light source 412 may be used as a lighting element and may be deployed in another room and the optical fiber 413 may be extended thereto. This allows safe lighting without developing problems such as an electric leakage and an electrical short circuit.

When transmitting data, the data to be transmitted is provided to the light source controller 411. The light source controller 411 controls blinking or light intensity of the light source 412 in accordance with the received data to be transmitted, thereby emitting light modulated in accordance with the data to be transmitted from the light source 412. As with the aforementioned case of lighting, modulated light emitted from the light source 412 enters into the optical fiber 413, and passing it through to the light scatterer 414. The light scatterer 414 scatters the incident modulated light from the optical fiber 413 and then emits the resulting scattered light. Even if the light scatterer 414 has scattered light, there is no influence on the frequency of the modulated light as long as that frequency is lower than the optical frequency. As a result, modulated scattered light is emitted from the light scatterer 414.

In addition, since a high-speed response device is used as the light source 412 as described above, the light source controller 411 can control fast blinking and/or light intensity, resulting in change in fast blinking and/or light intensity of modulated scattered light emitted from the light scatterer 414. However, high-speed change in blinking and/or high-speed light intensity is unperceivable to the human eye, and it seems like light illuminates at an almost constant light intensity. As a result, scattered light emitted from the light scatterer 414 can be used as illuminative light as is even when it has been modulated.

When receiving data, the light receiving unit 422 of the receiver 421 should receive the modulated scattered light emitted from the light scatterer 414. Light received by the light receiving unit 422 is converted to an electric signal, and the resulting electric signal is then transmitted to the demodulator 423. Data can then be reconstructed by the demodulator 423 demodulating that signal.

In this way, lighting and data transmission are possible. According to the conventional optical fiber communication, it is difficult to move a receiver because an optical fiber must be extended to the receiver. On the other hand, the fourth aspect of the present invention allows data reception wherever illuminative light can be received. In addition, since direct connection to the optical fiber is unnecessary, the receiver is movable. For example, it is possible to use a portable terminal together with the receiver 421. In addition, according to the conventional infrared data communication and wireless communication, a specific transmitter besides a lighting element must be provided. On the other hand, the fourth aspect of the present invention allows lighting and communication by providing the light scatterer 414 as a lighting element, which is typically provided indoors, and extending the optical fiber 413 instead of an electric wire.

In addition, since scattered light is emitted by the light scatterer 414, an expanded illuminative range can be provided, allowing expansion in communicative range. Furthermore, a high electric power ranging from several watts to several tens of watts is needed for lighting. However, since that power can be used for communication, high-speed and high-quality communication is possible.

Figure 27:
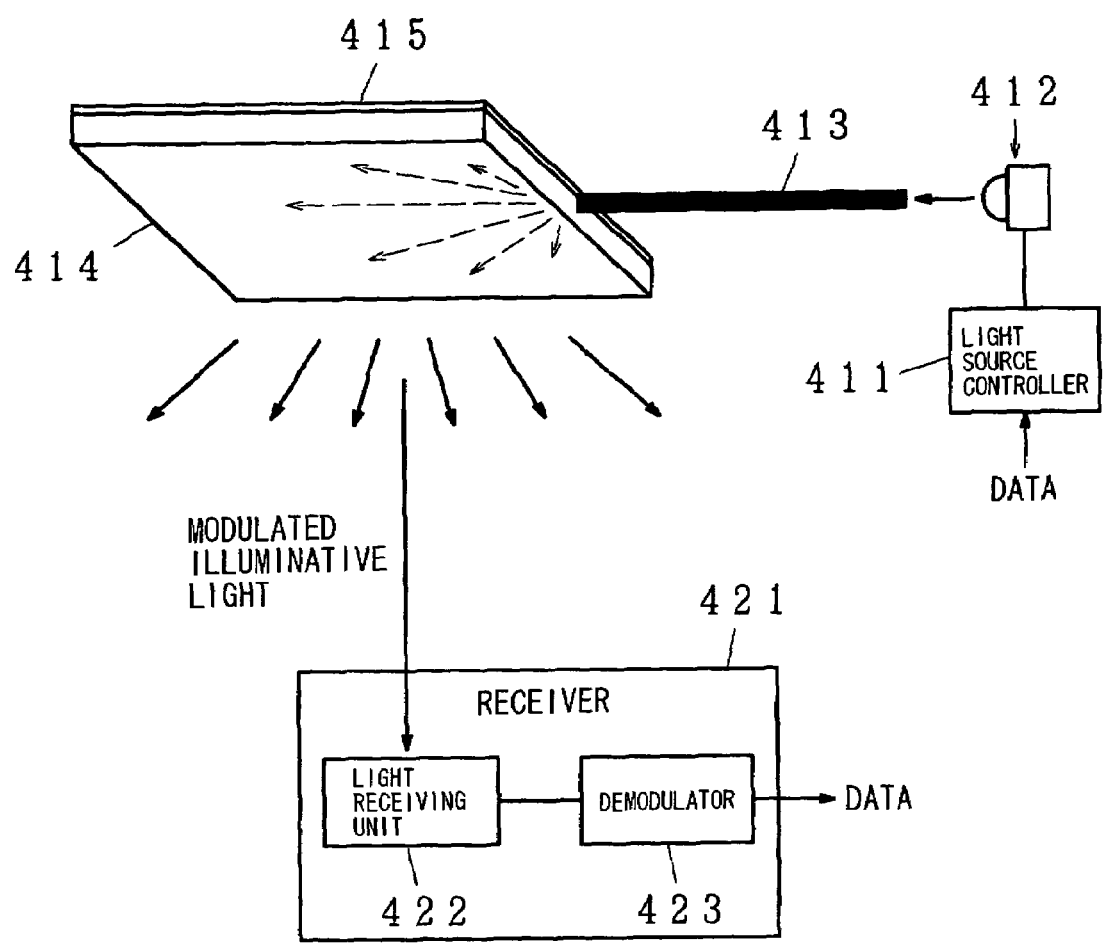
FIG. 27 is an explanatory diagram of a first modified example of the first embodiment, according to the fourth aspect of the present invention.

FIG. 27 is an explanatory diagram of a first modified example of the first embodiment according to the fourth aspect of the present invention. In the drawing, the same symbols are given to the same parts as those in FIG. 26, and repetitive descriptions thereof are thus omitted. With the aforementioned structure, since communication is possible as long as a receiver 421 can receive illuminative light, the shape of the light scatterer 414 may be arbitrary, and various shapes are available. The first modified example shows a case that a flat-plate light scatterer 414 is used as an example. Note that the structure and operation are the same as those described above except that the shape of the light scatterer 414 is a flat plate.

By using such flat-plate light scatterer 414, incident light to the light scatterer 414 from the optical fiber 413 is scattered in the horizontal direction, and light scattered in the vertical direction is emitted from a flat surface. By using scattered light emitted from the flat surface as illuminative light, the light scatterer 414 can be used as a two-dimensional illuminative light source. This allows provision of a very thin lighting element as thin as the light scatterer 414.

Note that when there is a surface from which emission of scattered light is unnecessary, a reflector plate 415 shown in FIG. 26 or a reflecting surface corresponding to the reflector plate 415 may be formed on that surface. In the exemplary structure shown in FIG. 27, the reflector plate 415 is provided upon the upper surface of the flat-plate light scatterer 414. This reflector plate 415 returns the scattered light emitted from the top of the light scatterer 414 into the light scatterer 414 again, allowing increase in lighting efficiency.

In addition, since light passing through an optical fiber 413 has a rectilinear progression characteristic, sufficient scattering by only a single-plate light scatterer 414 may be impossible. In such cases, multiple-plate light scatterers 414 may be overlapped. This allows increase in scattering angle, and emission of further uniformly scattered light over a wider angle. In addition, a reflector plate may be provided on a surface opposite to a joint surface between the light scatterer 414 and the optical fiber 413 so as to reflect rectilinear propagating light, changing the propagating direction, and thereby sufficiently scattering it. Alternatively, sufficient scattering may also be achieved by using multiple optical fibers from which incident lights hit the light scatterer 414 in multiple directions.

Figure 28:
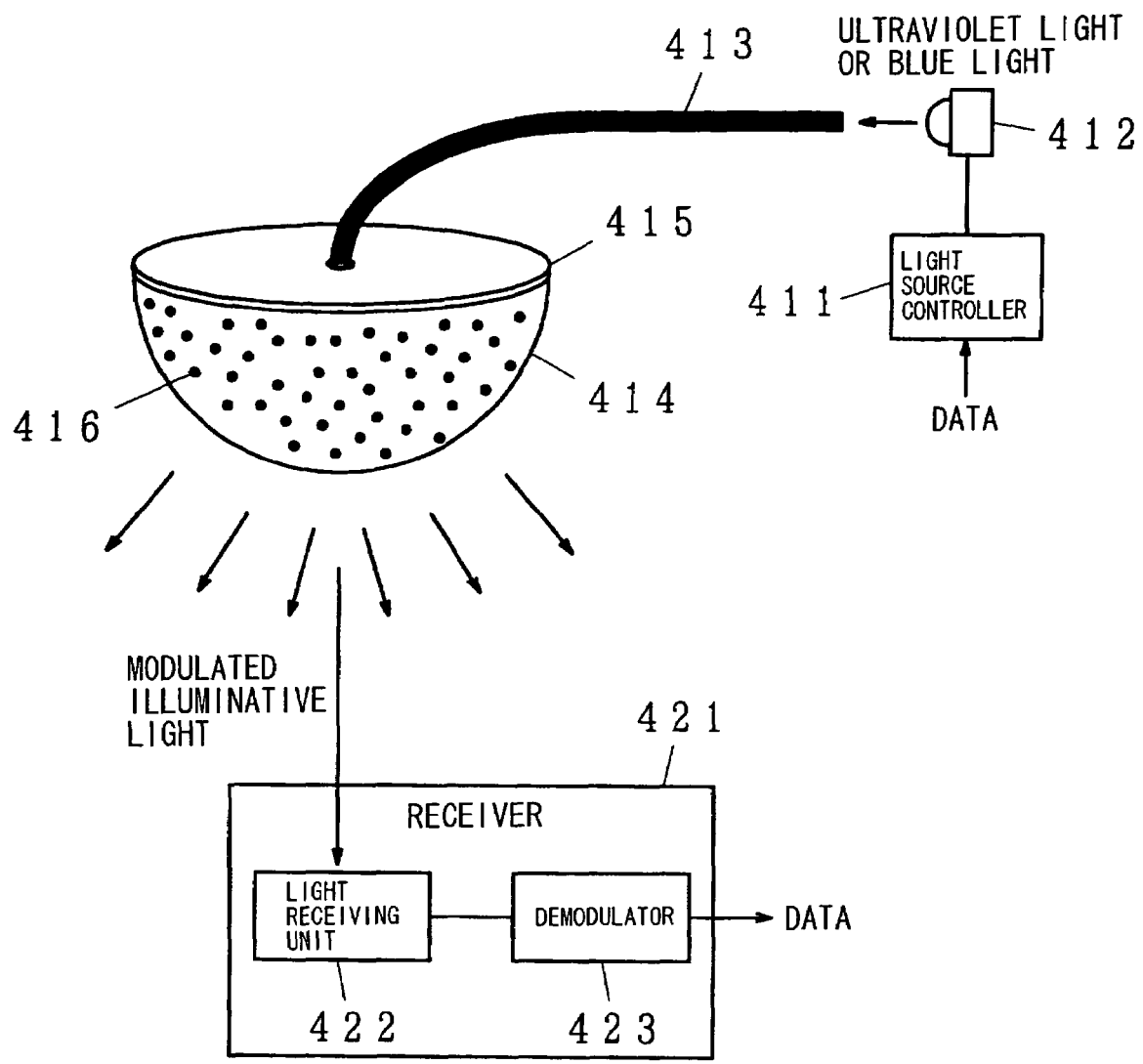
FIG. 28 is an explanatory diagram of a second modified example of the first embodiment, according to the fourth aspect of the present invention.

FIG. 28 is an explanatory diagram of a second modified example of the first embodiment according to the fourth aspect of the present invention. In the drawing, the same symbols are given to the same parts as those in FIG. 26, and repetitive descriptions thereof are thus omitted. 416 denotes a fluorescent material. In the second modified example, ultraviolet rays or a blue LED or a laser diode is used as a light source 412. In addition, a light scatterer 414 is mixed with the fluorescent material 416.

Incident ultraviolet rays or blue light emitted from the light source 412 via an optical fiber 413 hit the light scatterer 414. As with fluorescent lamps, the fluorescent material 416 in the light scatterer 414 is then exited by the incident ultraviolet rays or blue light, resulting in emission of white light. This white light is radiated from the light scatterer 414. The light radiated from the light scatterer 414 may be used as illuminative light for lighting. In addition, control of the light source 412 to blink or to emit a controlled intensity of light in accordance with data to be transmitted allows the light source 412 to emit modulated ultraviolet rays or blue light. As a result, modulated white light is radiated from the light scatterer 414. Reception of that white light by the light receiving unit 422 in the receiver 421 allows data communication.

Note that the light scatterer 414 in this case is not limited to having a hemispheric shape as shown in FIG. 28, and various shapes such as a flat plate as shown in FIG. 27 are available.

Figure 29:
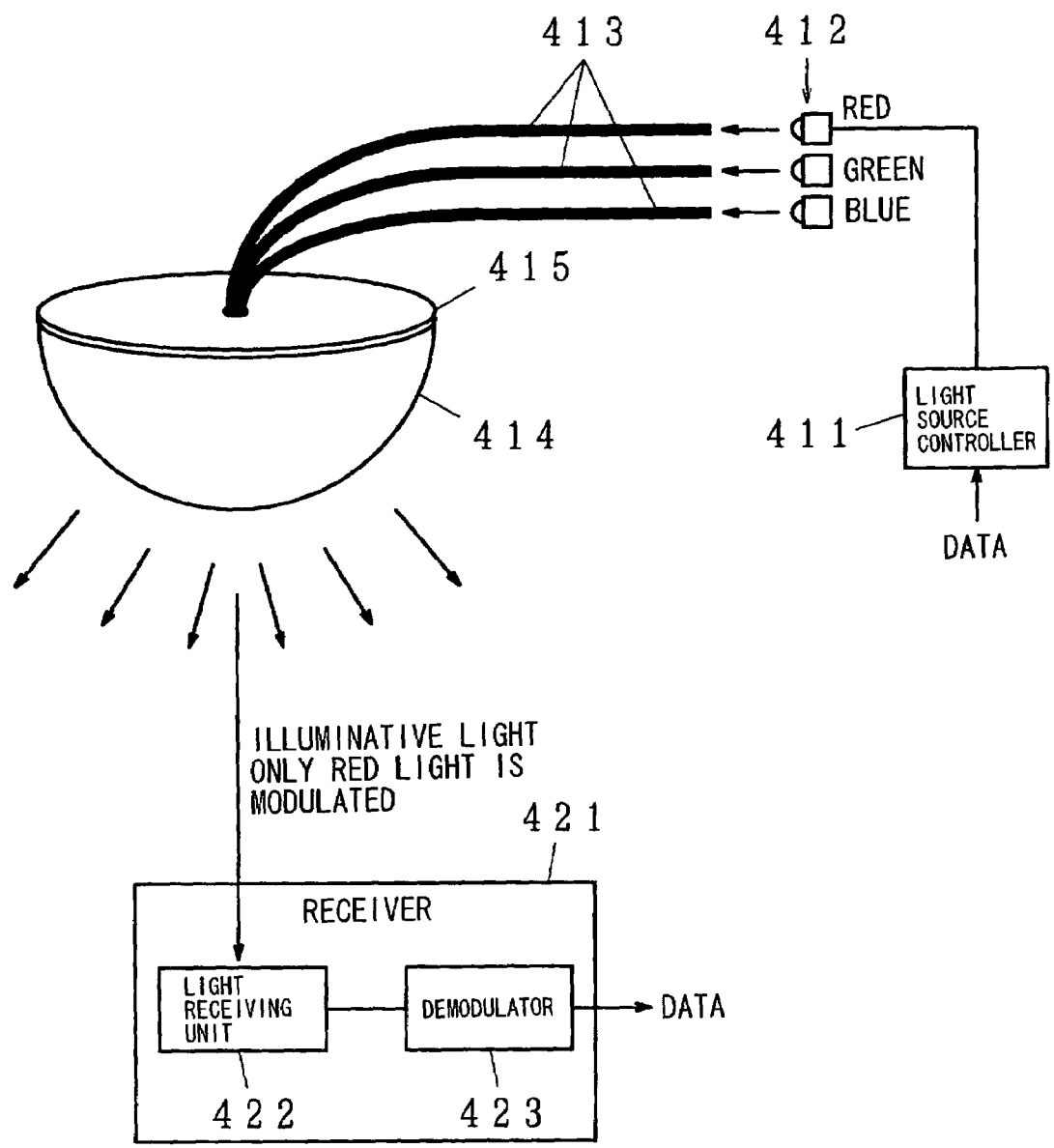
FIG. 29 is an explanatory diagram of a second embodiment, according to the fourth aspect of the present invention.

FIG. 29 is an explanatory diagram of a second embodiment of the fourth aspect of the present invention. In the drawing, the same symbols are given to the same parts as those in FIG. 26, and repetitive descriptions thereof are thus omitted. In the second embodiment, multiple optical fibers 413 are connected to a single light scatterer 414, and lights with different wavelengths are sent to the optical fibers 413, respectively. In the exemplary structure shown in FIG. 29, a red, a green, and a blue light source are used as a light source 412, and color lights emitted from the light sources 412 enter into three optical fibers 413, respectively.

The red, the green, and the blue light entered into the respective optical fibers 413 passing therethrough then hit the light scatterer 414. Respective incident color lights that hit the light scatterer 414 scatter and mix with each other, resulting in radiation of white light. Accordingly, when using light emitted from the light scatterer 414 as illuminative light, it can be used as a white light source. Needless to say, besides using it as a white light source, illuminative light with an arbitrary color can be provided by making adjustments to intensity respective color lights.

In the case of data communication, all of or some of those multiple light sources 412 may be controlled to be driven at the same time. In the exemplary structure shown in FIG. 29, only an LED or a laser diode which emits red color light is controlled to be driven and a green and a blue LED or laser diodes are not controlled to be driven. Consequently, only red light is modulated, but other color lights are not. For example, such a structure is effective when the light receiving unit 422 in the receiver 421 has the highest sensitivity to red light or infrared rays.

When some of color lights are modulated as described above, it is desirable that the receiver 421 receives and demodulates those modulated optical components. For example, in the case where red light is modulated by the exemplary structure shown in FIG. 29, data can be reliably received by selectively receiving red light using various well-known methods and then demodulating it by the demodulator 423; wherein those various well-known methods may be one that provides a red light passing filter, one that uses the light receiving unit 422 having high optical sensitivity to red light, or one that divides red light using a prism.

Note that light passing through the multiple optical fibers 413 can be arbitrary and is not limited to the aforementioned red, green or blue light, and that light intensity may be changed as desired. For example, the same color light may be used to increase light intensity. Alternatively, when using the red, the green, and the blue light source 412, as described above, three-color light s may enter into a single optical fiber 413. In addition, color of light to be modulated in transmitting data is not limited to red, and other multiple color lights should be modulated.

In the structure shown in FIG. 29, the light sources 412 may be controlled to be driven individually in accordance with different pieces of data, respectively, allowing transmission of multiple pieces of data. In other words, it is possible to transmit first data using red light, second data using green light, and third data using blue light. By selecting a color of light to be received by the receiver 421, transmitted data can be selectively received based on the selected color.

In addition, besides multiple optical fibers 413 through which illuminative light passes, another optical fiber for data transmission may be provided to transmit data by controlling a light source corresponding to that optical fiber. In this case, use of a white light source allows transmission of data without changing illuminative light color. Alternatively, use of infrared light also allows data transmission.

Figure 30:
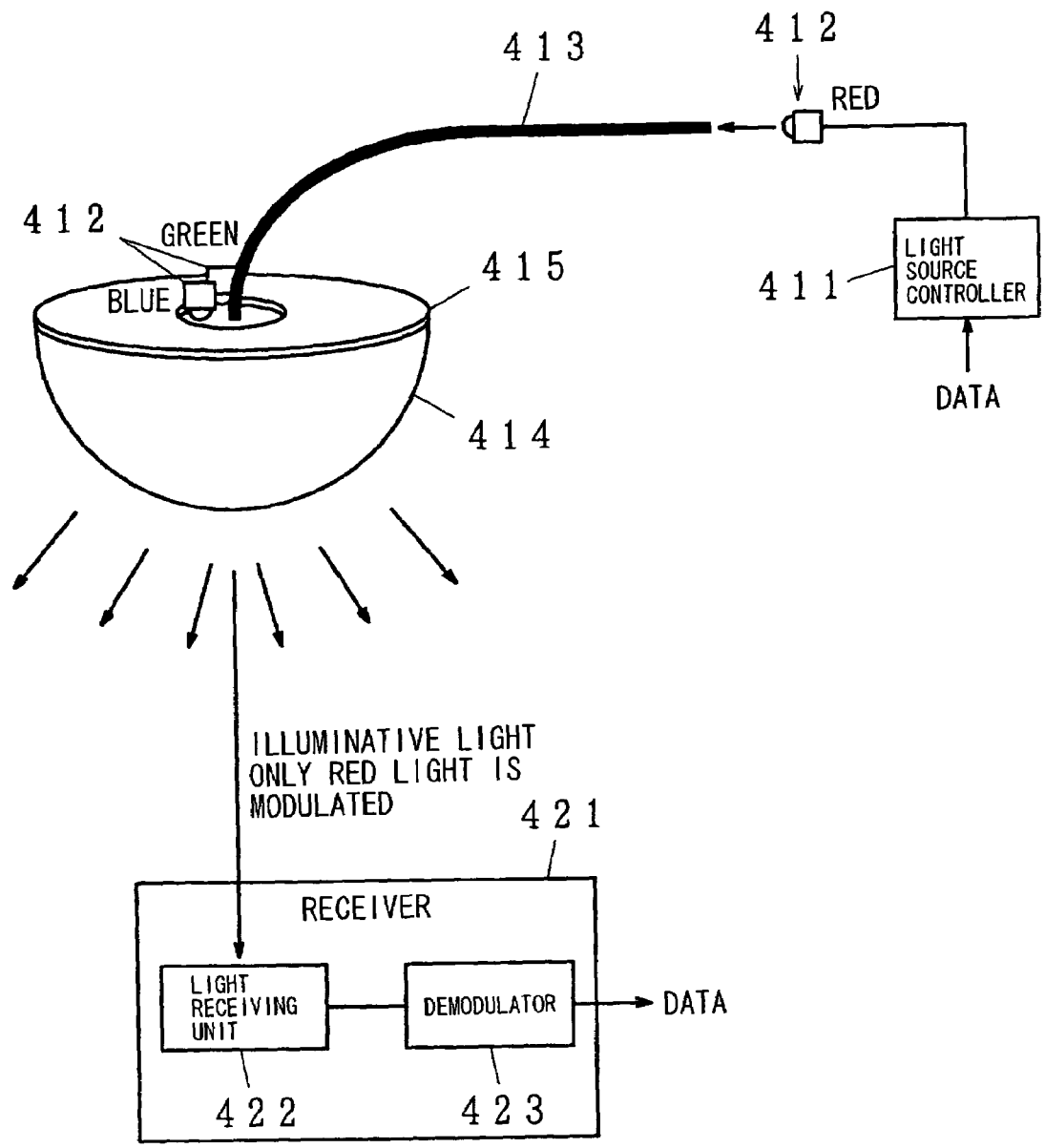
FIG. 30 is a schematic block diagram of a modified example of the second embodiment, according to the fourth aspect of the present invention.

FIG. 30 is a schematic block diagram of a modified example of the second embodiment according to the fourth aspect of the present invention. As shown in FIG. 30, for example, when modulating only lights with specific colors, a structure of providing a light scatterer 414 with modulated light from only a light source 412, which is controlled to be driven by a light source controller 411, via the optical fibers 413 and directly providing a light scatterer 414 with lights emitted by light sources 412, which emit lights with other colors, is possible. In this case, since incident color lights are mixed and synthesized at the light scatterer 414, the resulting synthesized lights may be used as illuminative light. Moreover, since a specific color light is modulated, and that optical component thereof is received by a light receiving unit 422 in a receiver 421 and then demodulated by a demodulator 423, data can be reconstructed. FIG. 30 shows an example of modulating red light, but the present invention is not limited to this. Alternatively, blue or green light may be modulated, or two of the three colors may be modulated.

Figure 31:
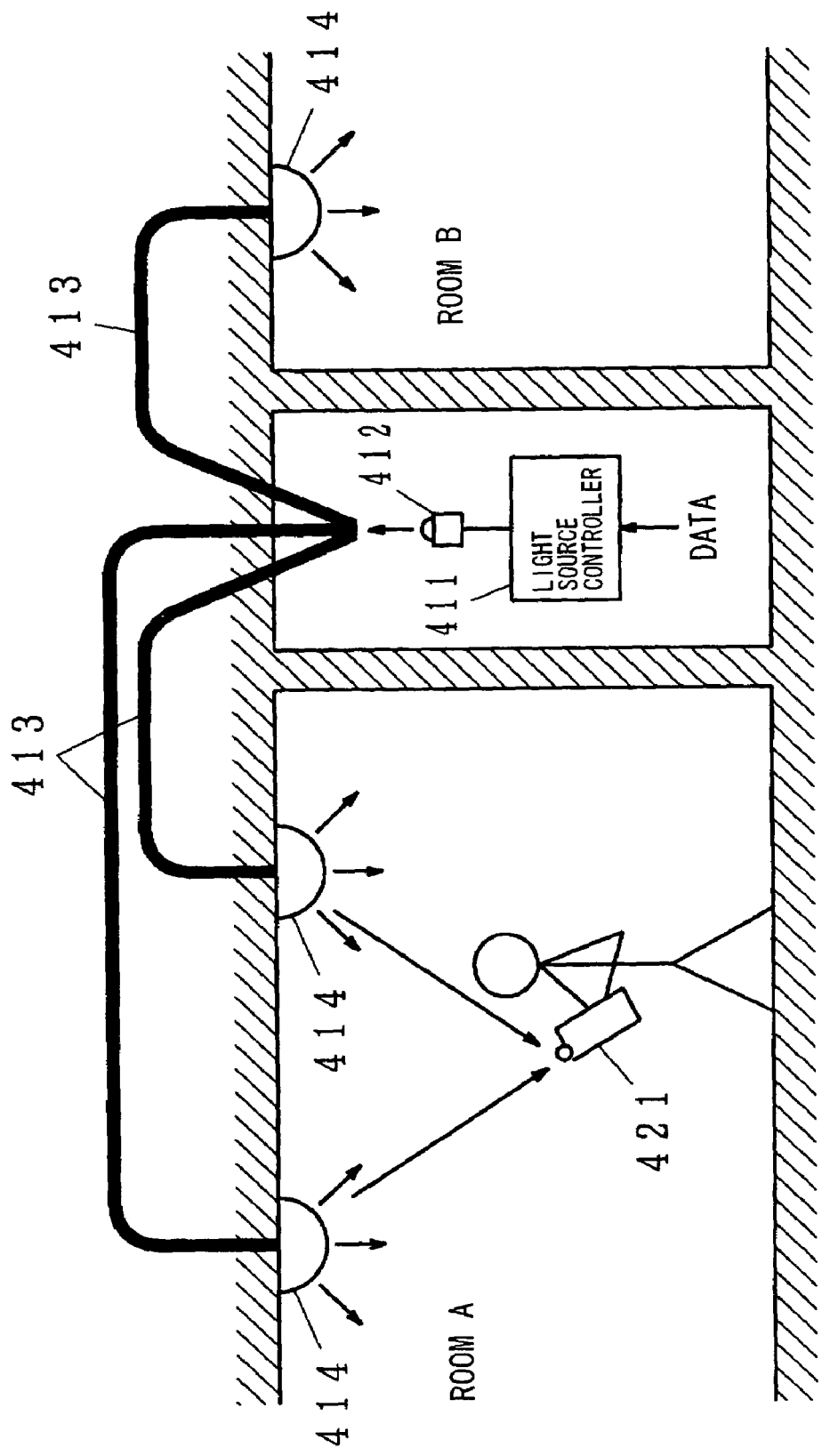
FIG. 31 is a diagram describing an application, according to the fourth aspect of the present invention.

FIG. 31 is a diagram describing an exemplary structure of an application, according to the fourth aspect of the present invention. In this exemplary structure, data is broadcast to multiple rooms. As described above, according to the fourth aspect of the present invention, that structure may be used as a lighting element. Therefore, light scatterers 414 are provided on the room ceilings. In the case of illuminative light communication, communication quality decreases due to shadows. When providing the light scatterers 414 on the ceilings as described above, shadows of someone or something are difficult to generate, which allows avoidance of such a shadowing problem.

Meanwhile, multiple light scatterers 414 provided in a room A are exemplified. By providing multiple light scatterers 414, it is possible to further decrease adverse influences by shadows. When providing multiple light scatterers 414, modulated light may be transmitted to the multiple light scatterers 414 from the same light source via optical fibers 413. Therefore, it is unnecessary to provide the light source controller 411 and the light source for each lighting element, thereby considerably reducing cost for installation of transmitters. Needless to say, it is possible to provide a structure of transmitting different pieces of data from the multiple light scatterers 414. In this case, data can be selectively received by selecting illuminative light received by a receiver 421.

Similarly, the light scatterer 414 is also provided in a room B. In this case, modulated light may be transmitted to the room B from the same light source in the room A. As a result, the same data can be broadcast to different rooms. In this case, the light source controller 411 and the light source 412 can be shared by different rooms.

Note that in the aforementioned first and the second embodiment, unidirectional data communication has been described. However, since the optical fibers 413 allows light to pass through bi-directionally, bi-directional data communication is naturally possible. In other words, light emitted from a light source existing outside of the light scatterers 414 is output from an end of the light source 412 via the light scatterers 414 and the optical fibers 413. This structure is used to control a light source existing outside of the light scatterers 414 to be driven to emit modulated light. This modulated light is output from an end of the optical fibers 413 on the light source 412 side. A light separating means such as a half mirror is provided between the light source 412 and the optical fibers 431, light emitted from the end of the optical fibers 413 on the light source 412 side is separated and received, and is then demodulated, resulting in reception of transmitted data. This allows bi-directional data communication. Note that the intensity of incident light to the optical fibers 413 via the light scatterers 414 becomes extremely weak due to scattering by the light scatterers 414. However, improved optical sensitivity and signal identifying technology allows reliable data communication.

According to the fourth aspect of the present invention as described above, provision of an optical fiber and a light scatterer allows lighting and illuminative light communication. Moreover, it is unnecessary to provide a lighting element and a communication device on a ceiling separately as with prior arts. In addition, illuminative light communication allows high-electric power communication. Therefore, high-speed and high-quality communication is possible. In addition, since a lighting element has large electric power and is typically deployed at a site that is difficult to develop shadows, a shadowing problem with infrared LAN, or a problematic phenomenon that communication is interrupted due to an interference may considerably decrease. Furthermore, light emitted from a light source is output from a light scatterer via an optical fiber. In this case, only light is used without an electric circuit, allowing simplification of a system and prevention of development of problems such as an electrical leakage and an electrical short circuit.

(Fifth Aspect of the Present Invention)

Next, the fifth aspect of the present invention is described. The fifth aspect of the present invention shows a structure for transmitting optical data among lighting elements.

Lighting elements are provided on a ceiling, or a pole is provided for illuminating light from above so as to prevent shadows across a certain area. There is an advantage for illuminative light communication in that high quality communication is possible because shadowing does not develop and high illuminative electric power is available.

Meanwhile, since lighting elements are provided in high places such as the ceiling as described above, there is a problem that it is difficult to carry out electrical work. For example, in the case of the aforementioned illuminative light communication, data to be transmitted must be sent to the lighting elements through illuminative light communication. A method of providing a cable or an optical fiber for a network may be considered as a method for transmitting data to lighting elements, for example. However, since new electrical work is necessary for providing a cable or an optical fiber, usage of illuminative light communication is not easy and is costly.

As with the first aspect of the present invention, a method of superimposing a signal on an electric wire for lighting and transmitting the resulting data to lighting elements, for example, has been considered as a method not requiring provision of additional cables or optical fibers. However, in the case of transmitting data by superimposing a signal on an electric wire, undesired radio emission may often develop or wireless communication may be interrupted when the frequency of the signal is high. In addition, there is another problem in that signals are easily influenced by motor noise and inverter noise.

As described above, there have been no preferred means for transmitting data to lighting elements for illuminative light communication, which has been an obstacle to illuminative light communication. The fifth aspect of the present invention provides a preferred means for transmitting data to each lighting element.

Figure 33:
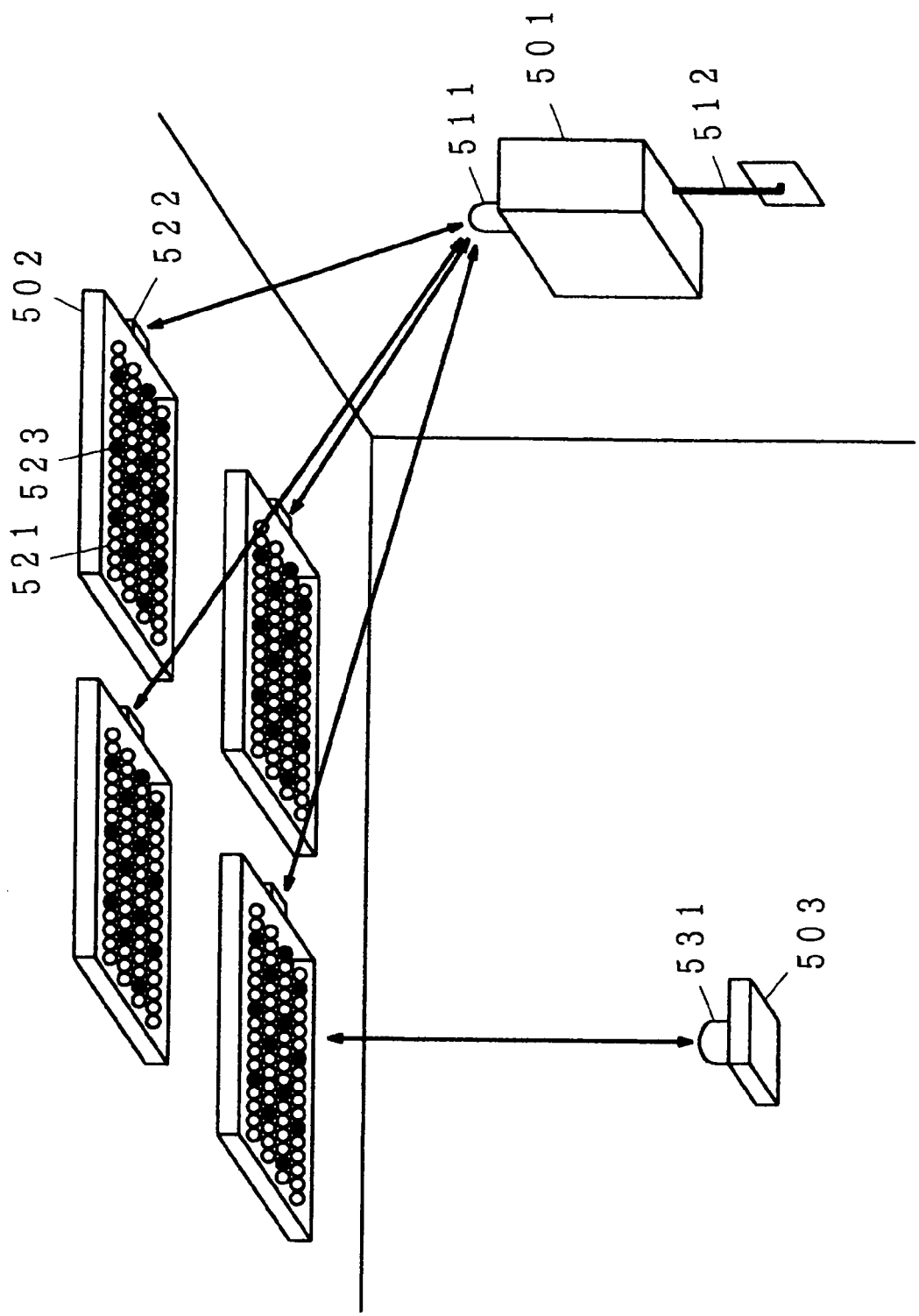
FIG. 33 is an explanatory diagram of an illuminative light communication system, according to a first embodiment of the fifth aspect of the present invention.

FIG. 33 is an explanatory diagram of an illuminative light communication system, according to a first embodiment of the fifth aspect of the present invention. In the drawing, 501 denotes an optical communication device, 502 denotes lighting elements, 503 denotes a terminal device, 511, 522, and 531 denote light transmitting/receiving units, 512 denotes a communication cable, 521 denotes light emitting devices, and 523 denotes light reception devices. In the example shown in FIG. 33, an illuminative light communication system is structured using lighting elements provided for indoor lighting.

The optical communication device 501, which transmits to the lighting elements 502 data that is to be sent by them through illuminative light communication, is provided indoors. The optical communication device 501 is connected to the network, and transmits/receives data via the network. The network is a wired network, which is provided in offices, schools, plants, and homes, and is configured from an optical fiber, a coaxial cable, or a stranded wire, many of which are connected to an external telephone network or the Internet. A terminal of such network is often provided in a wall as shown in FIG. 33. In such case, electrical connection between the wall surface terminal and the optical communication device 501 is made by the communication cable 512.

The optical communication device 501 allows communication via the network as described above, and has the light transmitting/receiving unit 511 allowing optical communication among the lighting elements 502 through the air. According to the fifth aspect of the present invention, since optical communication is carried out through the air, an optical fiber is unnecessary. Needless to say, it is unnecessary to extend the communication cable 512 to the respective lighting elements 502. Since the lighting elements 502 are provided at a high position such as the ceiling, the optical communication device 501 may be provided at a lower position where the lighting elements 502 carrying out communication cannot be blinded.

The light transmitting/receiving unit 511 includes a light emitting device and a light reception device, emits modulated light through control of the light emitting device to modulate in accordance with data, and transmits data to the lighting elements 502. In this example, it is desirable that lights emitted from the light emitting device may be received by the multiple lighting elements 502. Therefore, light with poor directivity is preferable. Alternatively, it is possible to output to the respective lighting elements 502 emitted lights with high directivity, which allows identification of each lighting element 502.

The light reception device receives light emitted from the light transmitting/ receiving units 522 of the lighting elements 502, thereby receiving data transmitted from the lighting elements 502. Note that since illuminative light emitted from the lighting elements 502 is received, it is necessary to separate and capture data from the light emitted from the light transmitting/receiving units 522 of the lighting element 502. When it is unnecessary to receive data from the lighting elements 502, the light reception device is unnecessary.

With such structure, the optical communication device 501 allows communication via the wired communication cable 512 and functions as a gateway, which carries out conversion for optical communication. In addition, through communication with multiple lighting elements 502, it also functions as a base station for wireless (optical) communication. Note that light used by the light transmitting/receiving unit 511 for communication is not limited to visible light, and infrared light is also available.

The lighting elements 502, according to the fifth aspect of the present invention, are provided on the ceiling, for example, and illuminates indoors by light emitted from the light emitting device. The lighting elements 502 are each provided with light transmitting/receiving units 522 including light emitting devices and light reception devices. According to this embodiment, optical communication with the optical communication device 501 through the air is carried out. The light emitting devices should be formed so as to allow pinpoint reception of light from the light transmitting/receiving unit 511 of the optical communication device 501 by providing a lens system, for example. Needless to say, direction should be appropriately changeable in consideration of light incident direction. The light emitting devices are provided for transmitting data to the optical communication device 501 from the lighting elements 502, and should allow pinpoint transmission of light to the light transmitting/receiving unit 511 of the optical communication device 501. For example, when using laser diodes (LDs), a rectilinear progression characteristic may improve, and identifiability of the optical communication device 501 may be improved by coherent light. These light transmitting/receiving units 522 allow bi-directional data communication among the lighting elements 502 and the optical communication device 501.

The lighting elements 502 are each provided with a controller not shown in the drawing. The light transmitting/receiving units 522 receive and demodulate light, and the resulting demodulated data is transmitted to corresponding controller. The controller controls the light emitting devices 521 to modulate in accordance with received data and emits illuminative light modulated in accordance with that data. This allows illuminative light data transmission from the lighting elements 502 to the terminal device 503.

In the example shown in FIG. 33, the light emitting devices 521 are indicated by o symbols, and the light reception devices 523 indicated by • symbols are provided therebetween. Since the light emitting devices 521, which are used for lighting as described above, emit light modulated in accordance with data, those having a high-speed response characteristic are available. For example, semiconductor light emitting devices such as LEDs and LDs are optimum.

The light reception devices 523 are used for receiving light from the terminal device 503. They receive and demodulate modulated light emitted from the terminal device 503, and the controller can then capture data transmitted from the terminal device 503. The captured data may be optically transmitted from the light transmitting/receiving units 522 to the optical communication device 501, and then to the network. Those light reception devices 523 allow bi-directional communication among the lighting elements 502 and the terminal device 503. Note that those light reception devices 523 may receive infrared light, other than visible light. In addition, a structure such that an antenna is provided instead of the light reception devices 523 for radio wave data reception from the terminal device 503 is possible. In the case of a broadcast system, the light reception devices 523 are unnecessary.

The terminal device 503 is a data terminal comprising the light transmitting/receiving unit 531. The light transmitting/receiving unit 531 receives and demodulates illuminative light, thereby capturing data. In addition, the light transmitting/receiving unit 531 is controlled to emit light modulated in accordance with data, thereby transmitting data from the terminal device 503 to the lighting elements 502. The terminal device 503 may be provided in an arbitrary position as long as it is illuminated by the lighting elements 502. Accordingly, communication is possible even if the terminal device 503 is movable. In addition, since the lighting elements are typically provided so as to prevent shadows, and illuminative light has large electric power, high quality and high speed communication is possible. Furthermore, illuminative light may be used safely without adversely influencing the human body such as eyes as with infrared rays.

In the aforementioned first embodiment, the optical communication device 501 controls the light transmitting/receiving unit 511 to emit light, thereby optically transmitting data, which has been transmitted from the network, through the air. The respective light transmitting/receiving units 522 of the lighting elements 502 receive light emitted from the light transmitting/receiving unit 511 of the optical communication device 501, thereby receiving data. The respective lighting elements 502 then control the light emitting devices 521 to modulate in accordance with data captured through reception of light by the light transmitting/receiving units 522, and thereby outputting the modulated illuminative light. The terminal device 503 receives and demodulates the modulated illuminative light, and thus the terminal device 503 can receive data.

On the other hand, the light transmitting/receiving unit 531 of the terminal device 503 emits light modulated in accordance with data in the terminal device 503. The light reception devices 523 of the lighting devices 502 then receive that emitted light, thereby receiving that data. The light transmitting/receiving units 522 of the lighting devices 502 then emit light modulated in accordance with that received data, transmitting the data to the optical communication device 501. In the optical communication device 501, the light transmitting/receiving unit 511 receives modulated light from the lighting elements 502 and converts it to electrical signals, transmitting the resulting signals to the network. This allows data transmission from the terminal device 503 to the network.

Figure 34:
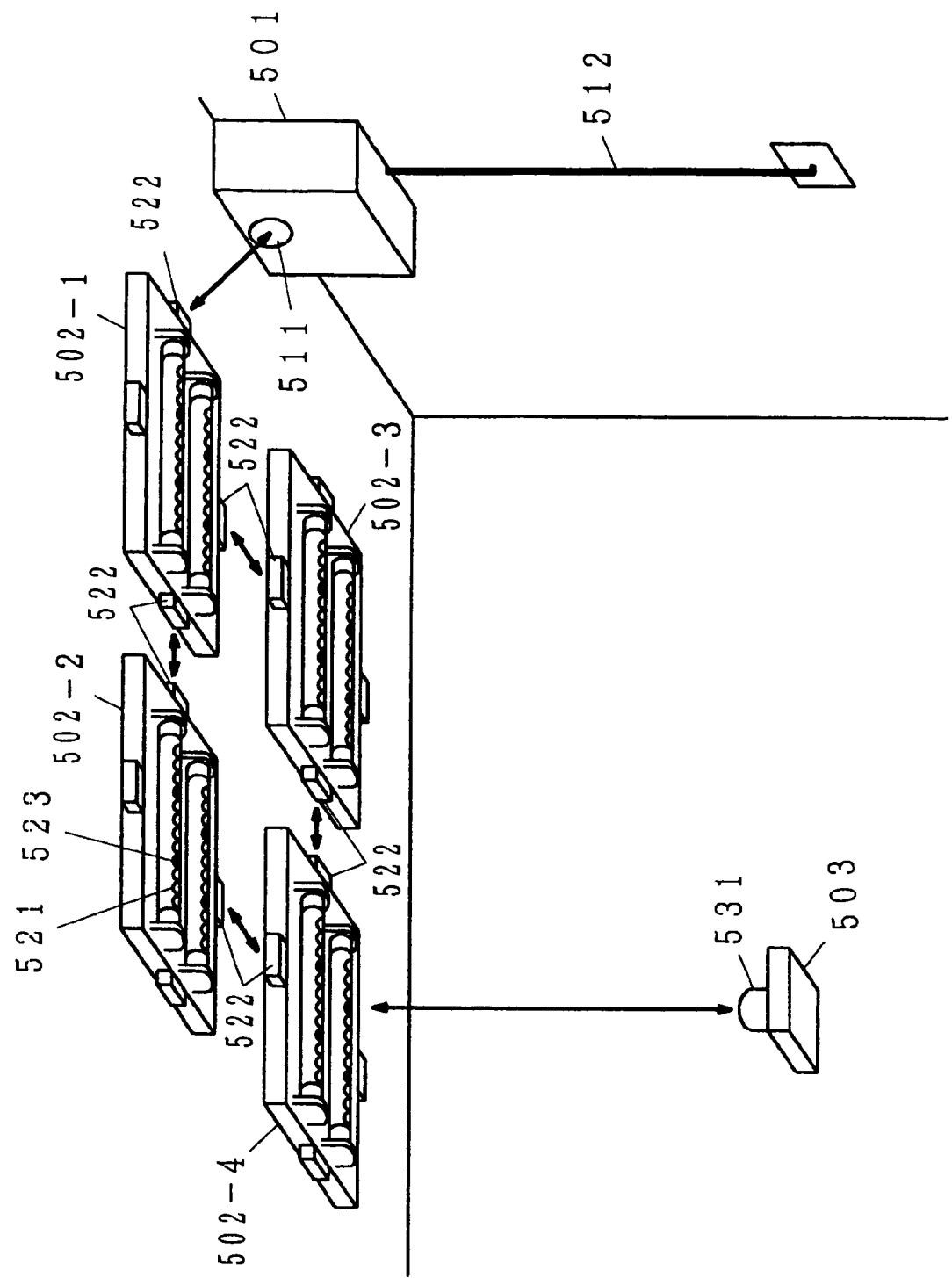
FIG. 34 is an explanatory diagram of an illuminative light communication system, according to a second embodiment of the fifth aspect of the present invention.
Figure 35:
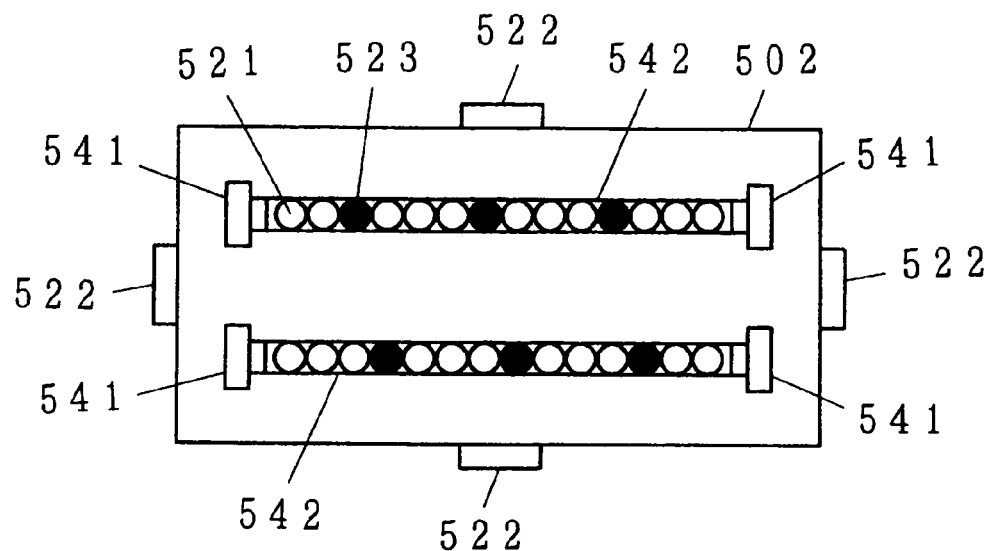
FIG. 35 is an aerial view of an exemplary lighting element in the illuminative light communication system, according to the second embodiment of the fifth aspect of the present invention.

FIG. 34 is an explanatory diagram of an illuminative light communication device, according to a second embodiment of the fifth aspect of the present invention. FIG. 35 is a planar view of an exemplary lighting element, according to the second embodiment of the fifth aspect of the present invention. In the drawings, the same symbols are given to the same parts as those in FIG. 33, and repetitive descriptions thereof are thus omitted. 502-1 through 502-4 denote lighting elements, 541 denotes sockets, and 542 denotes rod-shaped illuminative light sources. The aforementioned first embodiment gives an example where the lighting elements 502 receive modulated light from the optical communication device 501, respectively. On the other hand, the second embodiment shows a case of data transmission among the lighting elements 502-1 through 502-4. In addition, different from the example shown in FIG. 33, the light emitting devices 521 are arranged in the lighting elements 502-1 through 502-4 so as to form the same shape as typically used striplights. Note that the lighting elements 502-1 through 502-4 are identical lighting elements, which are referred to as lighting elements 502 when they are not being differentiated.

In the second embodiment, as shown in FIG. 35, light transmitting/receiving units 522 are provided on all four sides of the lighting elements 502, and allow communication among the lighting elements 502. In addition, only the light transmitting/receiving units 522 of any one or multiple lighting elements 502 communicate with the optical communication device 501. Other lighting elements 502, which do not communicate directly with the optical communication device 501, transmit/receive data by communicating with another lighting element 502.

In the example shown in FIG. 34, the lighting element 502-1 communicates directly with the optical communication device 501. The lighting elements 502-2 and 502-3 communicate with the lighting element 502-1 to receive/transmit data from/to the optical communication device 501. The lighting element 502-4 communicates with the lighting element 502-2 or 502-3 to receive/transmit data from/to the optical communication device 501. For example, data from the optical communication device 501 is transmitted to the lighting element 502-1, and that transmitted data is then transmitted to the lighting elements 502-2 and 502-3. The data is then transmitted from the lighting element 502-2 or 502-3 to the lighting element 502-4. As a result, the data from the optical communication device 501 is transmitted to the lighting elements 502-1 through 502-4, and the respective lighting elements 502-1 through 502-4 transmit data via illuminative light to the terminal device 503. On the other hand, when the lighting element 502-4 receives modulated light from the terminal device 503, the lighting element 502-4 transmits that data to the lighting element 502-2 or 502-3, the lighting element 502-2 or 502-3 transmits that data to the lighting element 502-1, the lighting element 502-1 transmits that data to the optical communication device 501, and the data is then transmitted to the network.

The light transmitting/receiving units 522 are used for optical communication among the respective lighting elements 502 through the air. This allows communication from the optical communication device 501 to the respective lighting elements 502 without providing a communication cable or an optical fiber. In addition, with the first embodiment, it can be considered that light intensity for communication among the optical communication device 501 and the lighting elements 502 attenuates if the lighting elements 502 are provided at a distance from the optical communication device 501. On the other hand, with the second embodiment, since the respective lighting elements 502 are provided at almost regular intervals, communication quality does not decrease due to locations of the lighting elements 502. Furthermore, since data is transmitted through communication among the lighting elements 502, even the lighting elements 502 provided within an area visible from the optical communication device 501 may be used for illuminative light communication, which is possible by communicating indirectly with the optical communication device 501 through communication with another lighting element 502.

The light transmitting/receiving units 522 allow bi-directional communication among the lighting elements 502 and among the lighting elements 502 and the optical communication device 501. Note that in the case of unidirectional communication as with a broadcast system, the light transmitting/receiving units 522 may be constituted by either light emitting devices or light reception devices, and light emitting devices and light reception devices of the respective lighting elements 502 for data communication should be provided facing one another.

In the second embodiment, the rod illuminative light sources 542 with the same shape as striplights as shown in FIG. 35 are used. One or several lines of light emitting devices 521 are arranged in the rod illuminative light sources 542, and light reception devices 523 are provided therebetween. To provide a new lighting element, the shape of illuminative light source is arbitrary and is determined based on illuminative light source and design. However, if an existing lighting element is used, it is desirable that the rod-shaped illuminative light sources 542 with the same shape as striplights are used. When the rod illuminative light sources 542 are inserted into the fluorescent sockets 541, electric power is supplied to the rod illuminative light sources 542, allowing lighting. In this case, a controller not shown in the drawing is provided in each of the rod illuminative light sources 542. In addition, the light transmitting/receiving units 522 should be provided surrounding the existing lighting elements and be electrically connected to the rod illuminative light sources 542. As a result, the lighting elements, according to the fifth aspect of the present invention, may be provided using existing lighting elements. Use of existing lighting elements allows illuminative light communication at lower cost than that for replacement with new lighting elements.

Needless to say, the shape of the illuminative light source is not limited to the same rod shape as striplights and may have a circular shape as with circular fluorescent lamps. Alternatively, an electric bulb-shaped illuminative light source is available, as described later.

Figure 36:
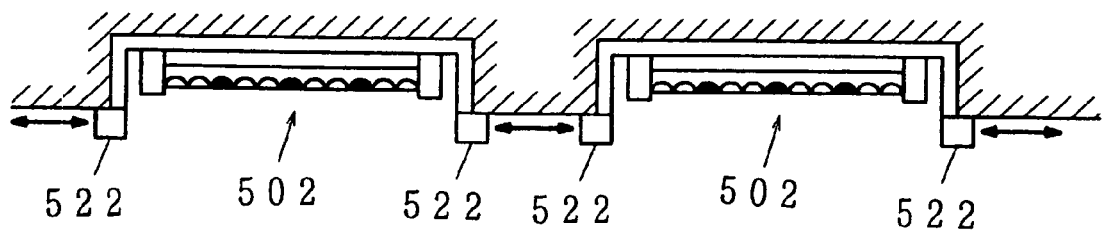
FIG. 36 is an explanatory diagram of a first modified example of the illuminative light communication device, according to the second embodiment of the fifth aspect of the present invention.
Figure 36:
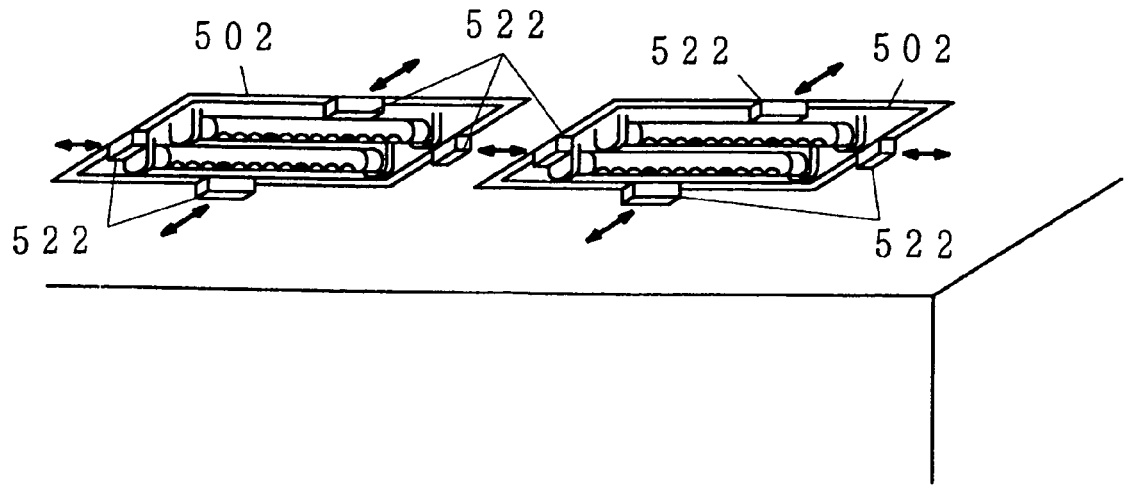

FIG. 36 is an explanatory diagram of a first modified example of the illuminative light communication system, according to the second embodiment of the fifth aspect of the present invention. In the example shown in FIG. 34, the lighting elements are provided on the ceiling. Alternatively, for example, the lighting elements 502 may be embedded in the ceiling as shown in FIG. 36. In such case, as shown in FIG. 36, for example, the light transmitting/receiving units 522 are provided protruding from the ceiling, allowing optical communication among the lighting elements 502.

Figure 37:
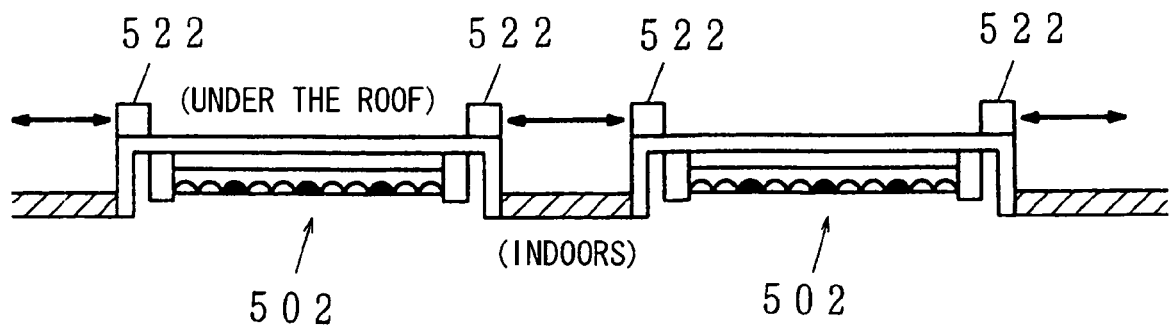
FIG. 37 is an explanatory diagram of a second modified example of the illuminative light communication system, according to the second embodiment of the fifth aspect of the present invention.

FIG. 37 is an explanatory diagram of a second modified example of the illuminative light communication system, according to the second embodiment of the fifth aspect of the present invention. In the example shown in FIG. 37, the lighting elements 502 are also embedded in the ceiling. When embedding the lighting elements 502 in the ceiling, there is space under the roof exceeding that needed for embedding the lighting elements 502. A structure that utilizes this space under the roof to provide the light transmitting/receiving units 522 under the roof for communication among the lighting elements 502 and among the lighting elements 502 and the optical communication device 501 is possible.

Figure 38:
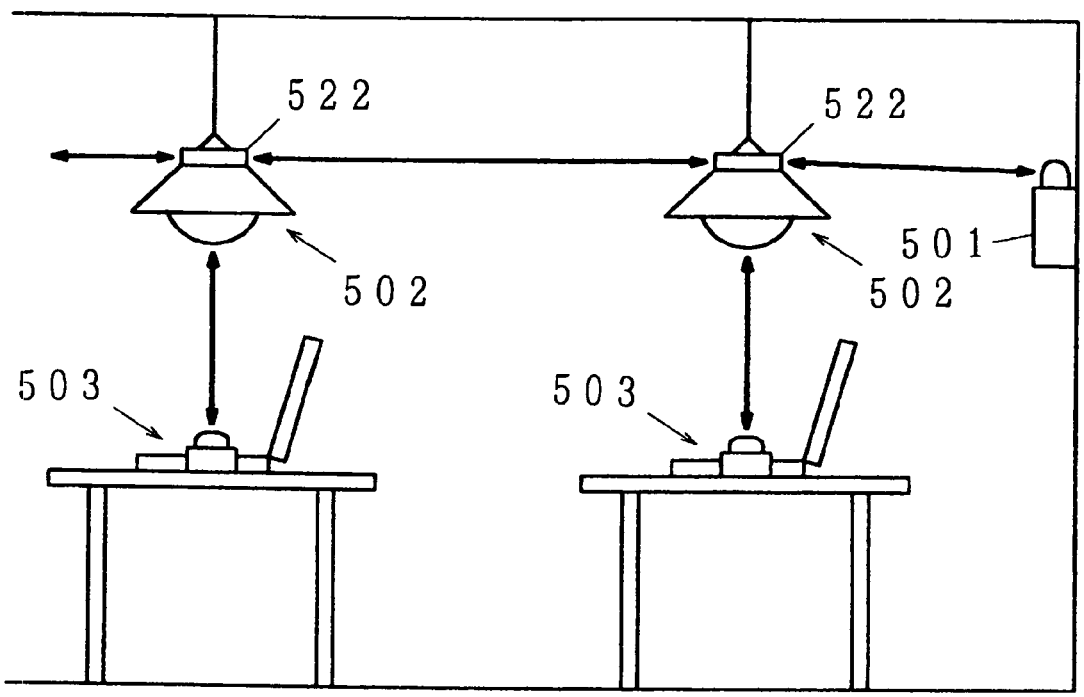
FIG. 38 is an explanatory diagram of a third modified example of the illuminative light communication system, according to the second embodiment of the fifth aspect of the present invention.

FIG. 38 is an explanatory diagram of a third modified example of the illuminative light communication system, according to the second embodiment of the fifth aspect of the present invention. The example shown in FIG. 38 shows a case of using suspended shades as the lighting elements 502. In the case of suspended lamps, electric bulbs are often used as the light sources. According to the fifth aspect of the present invention, electric bulb-shaped illuminative light sources are used. In addition, the light transmitting/receiving units 522 are provided at the upper part of underneath the shades of the lighting elements 502. Needless to say, the positions of the light transmitting/receiving units 522 may be arbitrary as long as communication with other lighting elements 502 and with the optical communication device 501 is possible.

For example, the suspended lighting elements 502 are often provided over each customer's seat in a store. The structure shown in FIG. 38 is useful for such application. For example, when opening an internet cafe, broadband communication may be provided merely through optical communication among the lighting elements 502 and among the lighting elements 502 and the optical communication device 501 without providing cables in the store.

Figure 39:
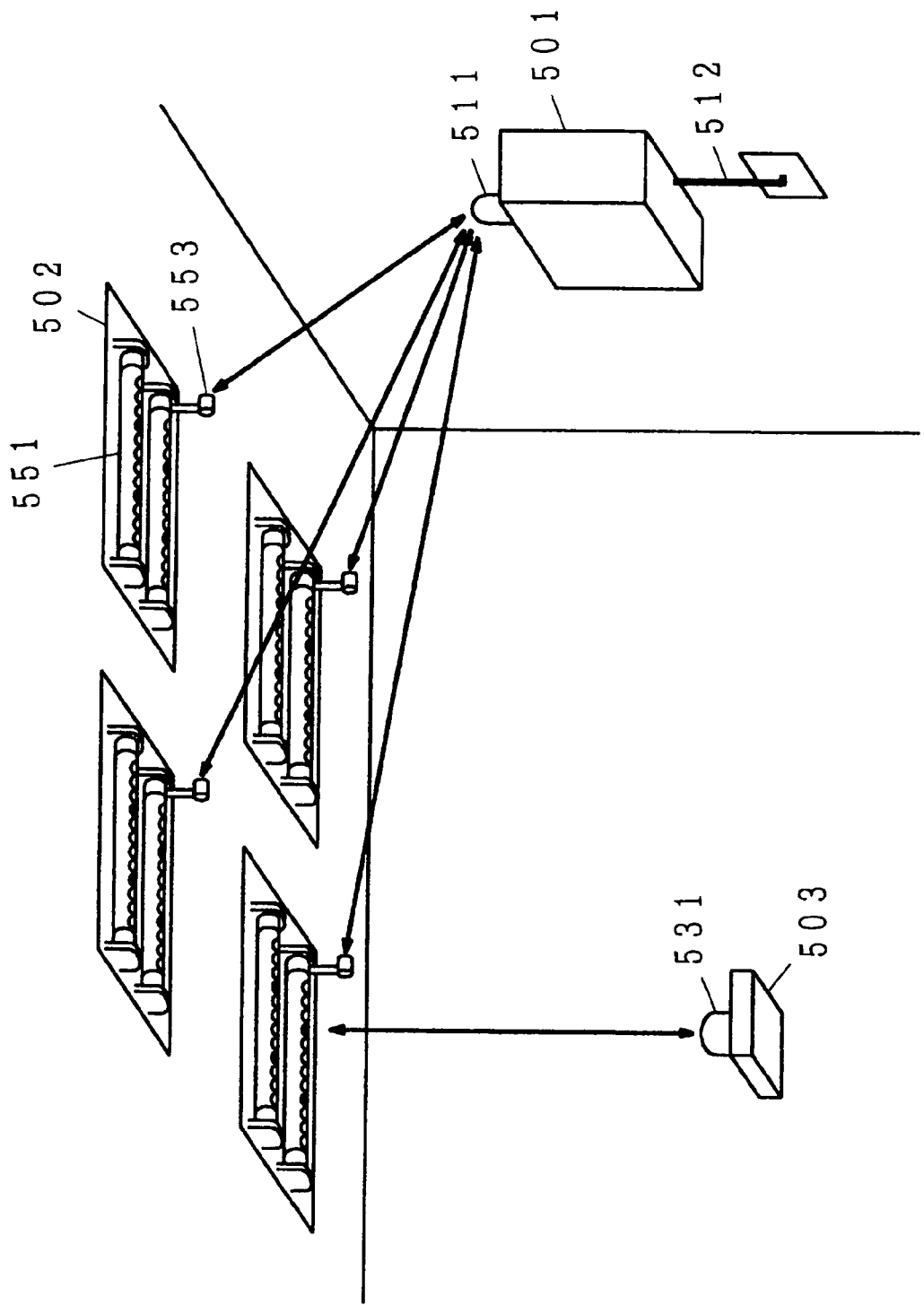
FIG. 39 is an explanatory diagram of an illuminative light communication system, according to a third embodiment of the fifth aspect of the present invention.
Figure 40:
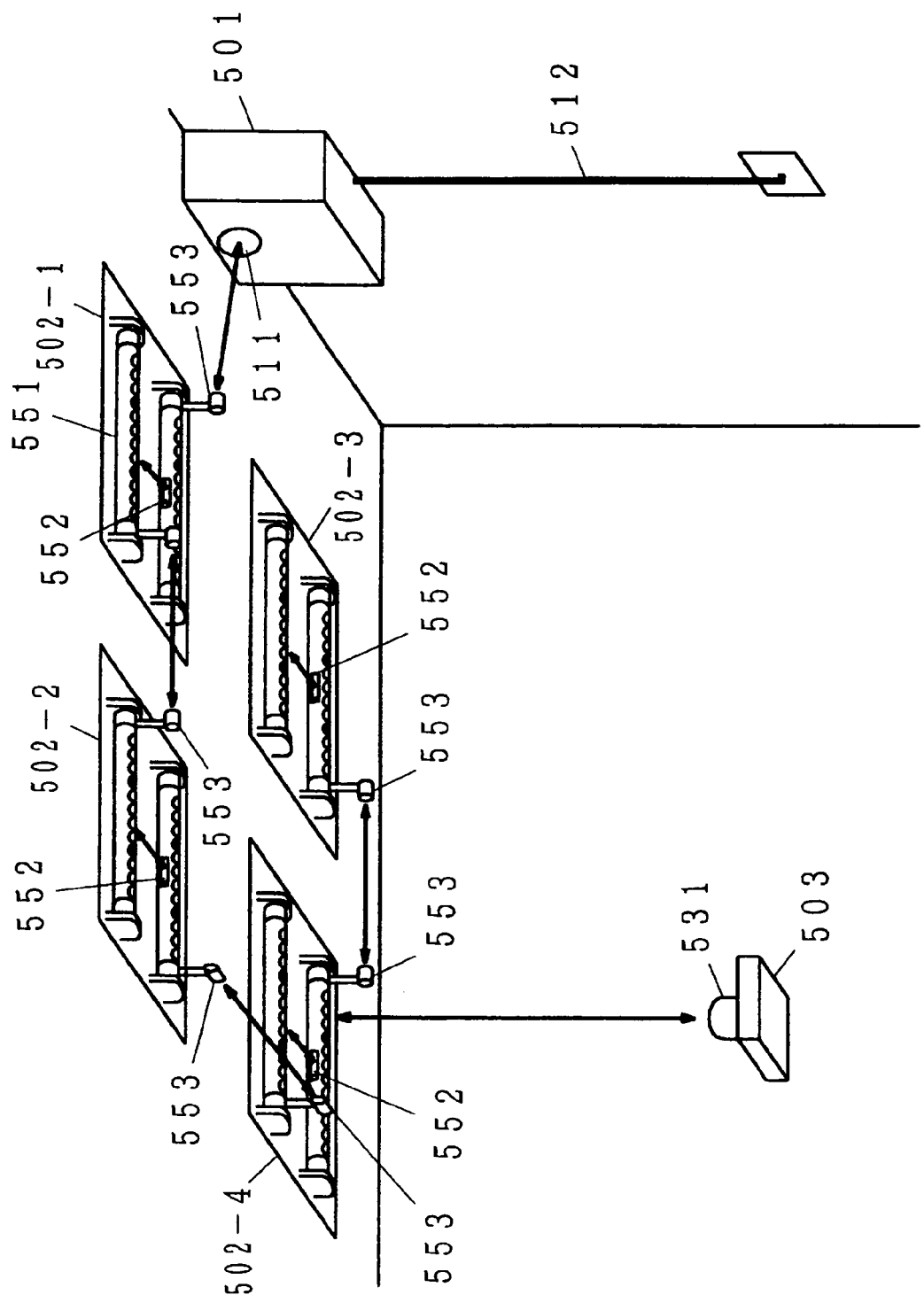
FIG. 40 is another explanatory diagram of the illuminative light communication system, according to the third embodiment of the fifth aspect of the present invention.
Figure 41:
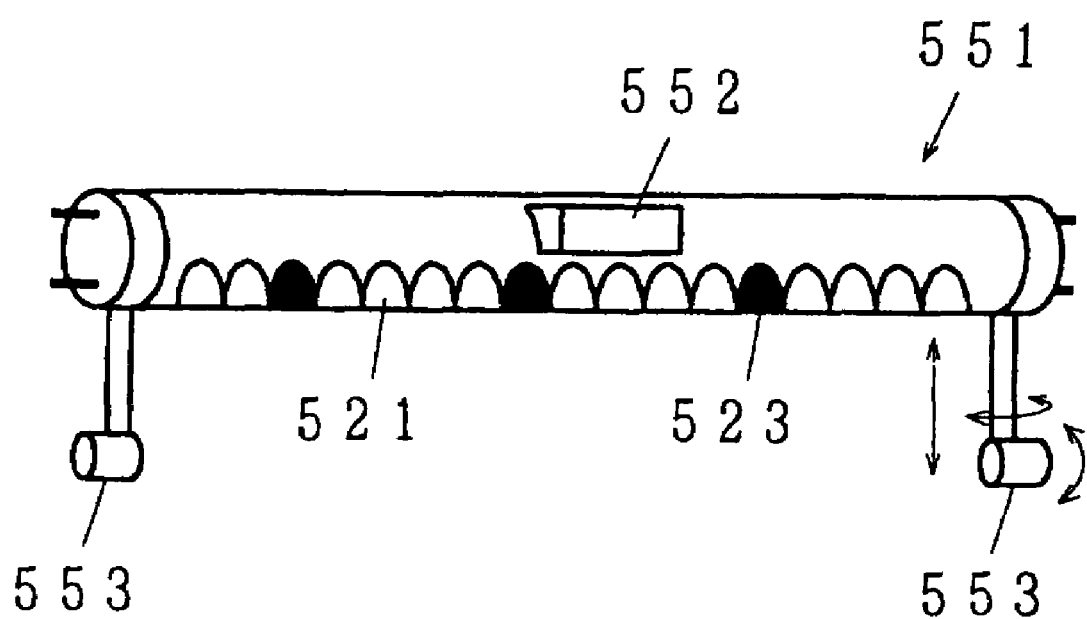
FIG. 41 is an explanatory diagram describing an exemplary illuminative light source in the illuminative light communication system, according to the third embodiment of the fifth aspect of the present invention.

FIGS. 39 and 40 are explanatory diagrams of an illuminative light communication system, according to a third embodiment of the fifth aspect of the present invention. FIG. 41 is a diagram describing an exemplary illuminative light source, according to the third embodiment of the fifth aspect of the present invention. In the drawing, 551 denotes illuminative light sources, 552 denotes inter-adjacent light source light transmitting/receiving units, and 553 denotes inter-lighting element light transmitting/receiving units. In the aforementioned example shown in FIG. 35, the light transmitting/receiving units 522 must be provided in addition to the illuminative light sources even when using the existing lighting elements. The third embodiment shows an exemplary structure where the illuminative light sources and the light transmitting/receiving units 522 are integrated.

In the example shown in FIG. 41, for example, the shape of the illuminative light sources 551, according to the fifth embodiment of the present invention, is the same rod shape as striplights as with the example shown in FIG. 35. The illuminative light sources 551 each comprises light emitting devices 521, light reception devices 523, and a controller not shown in the drawing. In addition, the inter-adjacent light source light transmitting/receiving units 552 are provided on the tube and are used for communication between adjacent illuminative light sources 551 when the illuminative light sources 551 are positioned so as to provide multiple fluorescent lamps in parallel. Note that assuming the case of providing three or more of illuminative light sources 551, the inter-adjacent light source light transmitting/receiving units 552 should be provided on both sides of the tube.

In addition, the inter-lighting element light transmitting/receiving units 553 are provided for communicating with illuminative light sources 551 other than the adjacent illuminative light sources 551 and the optical communication device 501. The inter-lighting element light transmitting/receiving units 553 should be formed such that the length and orientation thereof are adjustable to accommodate various lighting elements. Note that in FIG. 41, the inter-lighting element light transmitting/receiving units 553 are provided at both ends; alternatively they may be provided at either end.

Such illuminative light sources 551 are fixed replacing the existing fluorescent lamps of the lighting elements. In this case, the illuminative light sources 551 should be attached directly to the sockets to which fluorescent lamps are inserted. As a result, electric power may be supplied to the illuminative light sources 551 from the sockets of the lighting elements. Illuminative light data transmission is possible by regulating the length and orientation of the inter-lighting element light transmitting/receiving units 553.

The example shown in FIG. 39 shows an application to the first embodiment according to the fifth aspect of the present invention shown in FIG. 33. In this case, the inter-lighting element light transmitting/receiving units 553 attached to the respective illuminative light sources 551 should face the optical communication device 501. In this case, the inter-lighting element light transmitting/receiving units 553 may be provided in a single illuminative light source 551 of the respective lighting elements, and the inter-adjacent light source light transmitting/receiving units 552 may be used for data communication for the other illuminative light sources.

The example shown in FIG. 40 shows an application to the second embodiment according to the fifth aspect of the present invention shown in FIG. 34. In this case, the optical communication device 501 communicates with the inter-lighting element light transmitting/receiving units 553 provided in a certain illuminative light source 551 and communicates with the inter-adjacent light source light transmitting/receiving units 552 or the inter-lighting element light transmitting/receiving units 553 for the other illuminative light sources 551. When at least a single stroke communication route is prepared, illuminative light communication for all illuminative light sources 551 is possible. Needless to say, multiple communication routes may be specified.

Note that FIGS. 39 and 40 show a case of attaching the illuminative light sources 551 to the lighting elements embedded in the ceiling. In such case, it is effective that the inter-lighting element light transmitting/receiving units 553 are provided protruding downward as shown in the drawings. Similarly, according to the lighting elements to which the illuminative light sources 551 are attached, surrounding shades extend below the illuminative light sources 551. In such cases, it is also effective that the inter-lighting element light transmitting/receiving units 553 are provided protruding downward.

Figure 42:
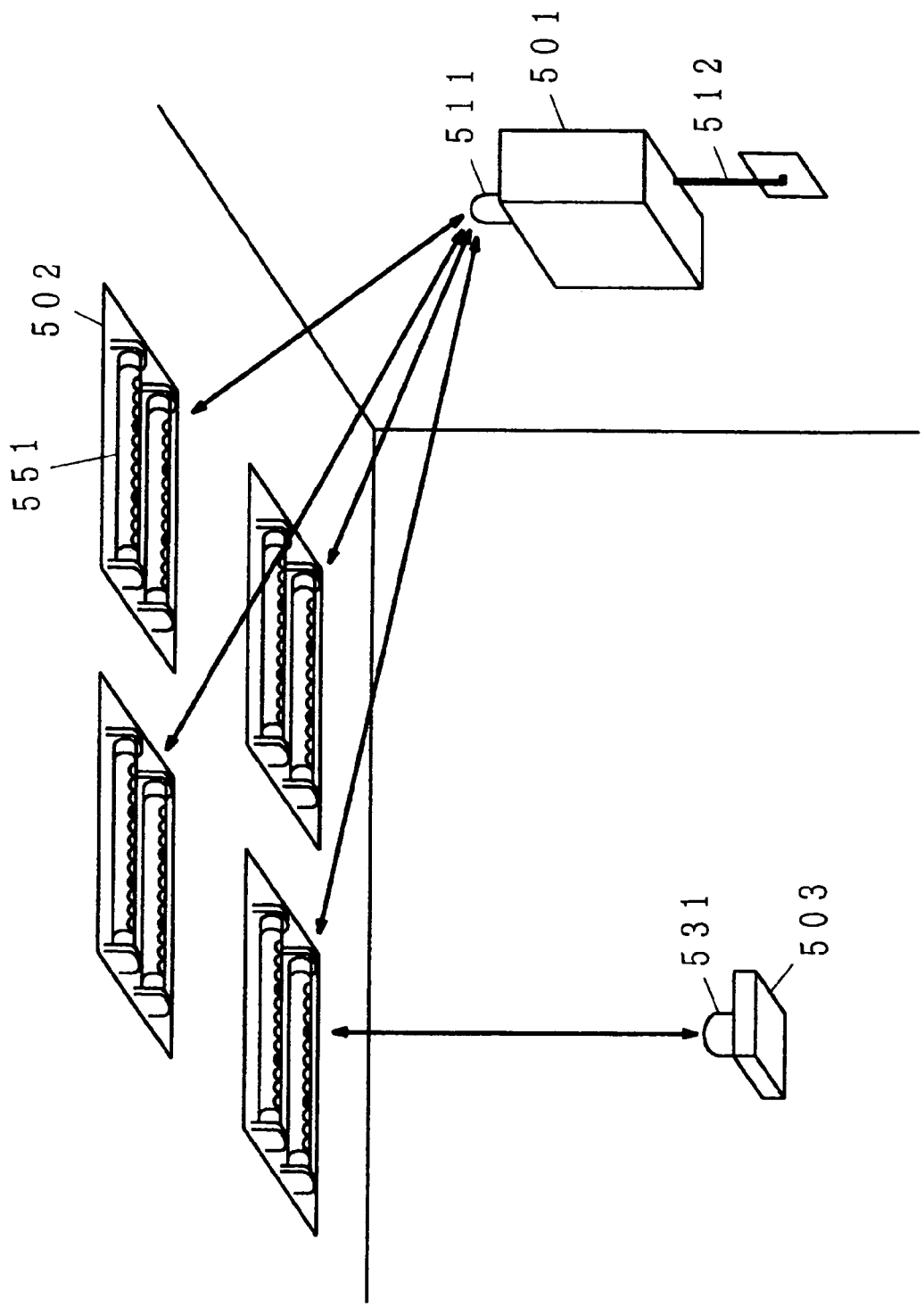
FIG. 42 is an explanatory diagram of an illuminative light communication system, according to a fourth embodiment of the fifth aspect of the present invention.
Figure 43:
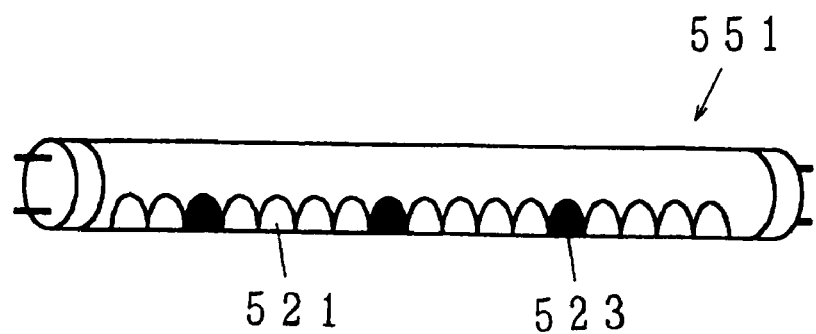
FIG. 43 is an explanatory diagram describing an exemplary illuminative light source in the illuminative light communication system, according to the fourth embodiment of the fifth aspect of the present invention.

FIG. 42 is an explanatory diagram of an illuminative light communication system, according to a fourth embodiment of the fifth aspect of the present invention. FIG. 43 is a diagram describing an exemplary illuminative light source, according to the fourth embodiment of the fifth aspect of the present invention. In the fourth embodiment, the light transmitting/receiving units 522 are not provided in the illuminative light sources 551 or in the lighting elements 502, and the light emitting devices 521 and the light reception devices 523 are alternatively used. In this case, the illuminative light sources 551, which comprise the light emitting devices 521 and the light reception devices 523 as shown in FIG. 43, are used and attached to the existing lighting elements, thereby constituting the illuminative light communication system. As can be understood through comparison with the illuminative light sources 551 shown in FIG. 41, the inter-adjacent lighting source light transmitting/receiving units 552 and the inter-lighting element light transmitting/receiving units 553 are not provided in the exemplary illuminative light sources 551 shown in FIG. 43.

The light reception devices 523 receive light (visible light or infrared light) emitted from the light transmitting/receiving unit 511 of the optical communication device 501, thereby receiving data from the optical communication device 501. Light emitted from the light emitting devices 521 is modulated in accordance with the received data, and the resulting modulated illuminative light is emitted. The terminal device 503 then receives and demodulates the modulated illuminative light, allowing the terminal device 503 to receive data.

On the other hand, in the case of transmitting data from the terminal device 503, the light reception devices 523 in the illuminative light sources 551 receive and demodulate modulated light emitted from the terminal device 503, and then data from the terminal device 503 is transmitted to the illuminative light sources 551. Light emitted from the light emitting devices 521 is modulated in accordance with the received data, and the resulting modulated illuminative light is emitted. If the light transmitting/receiving unit 511 of the optical communication device 501 receives and demodulates the modulated illuminative light, data is transmitted from the terminal device 503 to the optical communication device 501.

In this manner, in the fourth embodiment, both the optical communication device 501 and the terminal device 503 emit light to the illuminative light sources 551, and receive illuminative light emitted from the illuminative light sources 551. This allows use of illuminative light having large electric power and reduction in influences of shadowing since the lighting elements are provided in the ceiling where shadows are difficult to generate, thereby providing favorable communication rather than the case of direct optical communication between the optical communication device 501 and the terminal device 503. Needless to say, it is unnecessary to extend a communication cable or an optical cable to the lighting elements 502.

Note that in the example shown in FIG. 42, dedicated illuminative light sources 551 as shown in FIG. 43 are used. Similarly, the light transmitting/receiving units 522 may not be provided in the lighting elements 502 in the case of using dedicated lighting elements as shown in FIG. 33.

Figure 44:
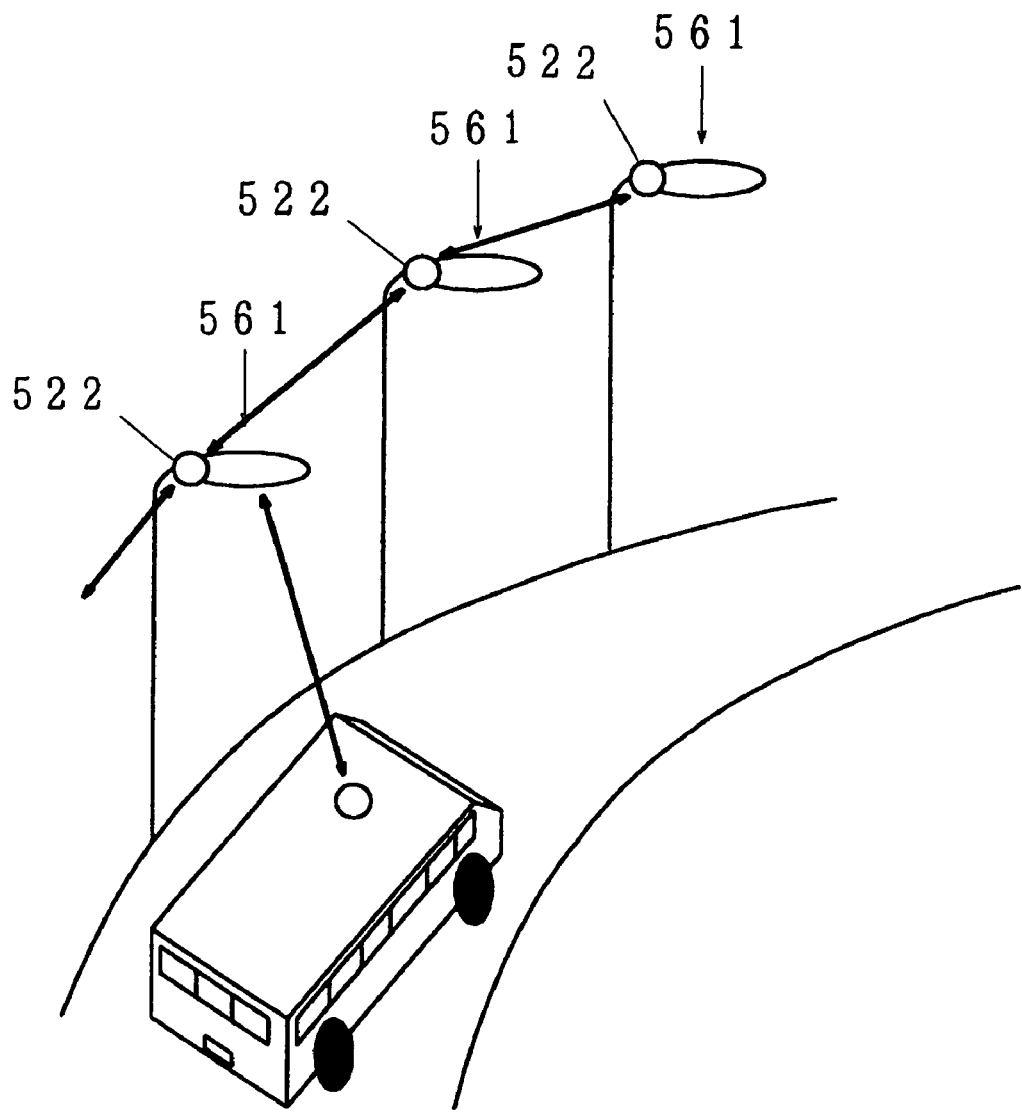
FIG. 44 is an explanatory diagram of an illuminative light communication system, according to a fifth embodiment of the fifth aspect of the present invention.

FIG. 44 is an explanatory diagram of an illuminative light communication system, according to a fifth embodiment of the fifth aspect of the present invention. In the drawing, 561 denotes street lights. Currently, a mercury lamp, a sodium lamp, or a fluorescent lamp is mainly used as the street lights 561 on a road. Alternatively, a semiconductor light emitting device such as an LED may be applied. When a semiconductor light emitting device is used as the illuminative light source of the street lights 561, various pieces of data may be transmitted through illuminative light to moving vehicles and pedestrians. In this case, it is costly to provide a communication cable or an optical cable to transmit data to the respective street lights 561.

According to the fifth aspect of the present invention, the light transmitting/receiving units 522 are provided in the street lights 561, and optical data communication among the street lights 561 is provided through the air as with the aforementioned second embodiment. This allows data transmission to the respective street lights 561 and illuminative light data transmission by the street lights 561. Such structure is economical since only electrical work for the respective street lights 561 is necessary without providing a communication cable or an optical fiber.

Note that the intervals between the street lights 561, for example, of approximately 30 m on an expressway are longer than in the aforementioned case of indoors. However, optical communication is sufficiently possible. In addition, due to the present topology or structure of the road, the orientation of the light transmitting/ receiving units 522 must be regulated so as for those units to face adjacent street lights. This is not very difficult as long as they have typical intervals between adjacent street lights. Furthermore, a problem that the field of vision may be obstructed by mist is expected. However, this is not a significant problem since the intervals are approximately 30 m.

An example of optical communication among the street lights provided on the road is shown as an outdoor network herein, and an application according to the fifth aspect of the present invention is not limited to this. For example, it is applicable to taxiway lights for air crafts or illumination lamps in event halls.

Several embodiments and modified examples according to the fifth aspect of the present invention have been described above. In the aforementioned description, data is transmitted from the optical communication device 501 to the lighting elements 502, the illuminative light sources 551, or the street lights 561 (referred to as lighting elements and the like). It is unnecessary for the respective lighting elements and the like to transmit received data as is through illuminative light. For example, a structure such that an address or an ID is attached to a header of data to be transmitted and that the lighting elements and the like select data in accordance with that header and transmit the selected data via illuminative light is possible. In addition, the lighting elements and the like, which function as a relay or a router and are not used for illuminative light data communication, may be provided.

As described above, according to the fifth aspect of the present invention, when each of lighting elements and illuminative light sources are used for optical communication, data is transmitted thereto through the air. Therefore, electrical work for providing a communication cable or an optical fiber is unnecessary, allowing constituting an illuminative light communication system at low cost. In this case, the system may be structured using existing lighting elements, allowing further reduction in cost. In addition, different from power line communication, optical communication prevents problems such as constraints on bandwidth, radio wave radiation, and superimposition of noise from developing, allowing high-quality data communication.

(Sixth Aspect of the Present Invention)

Next, several applications of illuminative light communication are described.

The sixth aspect of the present invention is described forthwith. The sixth aspect of the present invention shows a case where various lighting, such as home electric appliances and decorative illumination, are used for communication.

Figure 54:
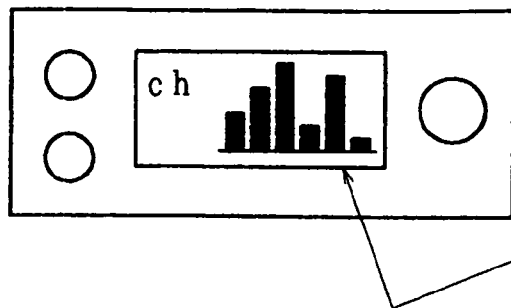
FIG. 54 is a diagram describing another example of using LEDs for display in an electrical apparatus.
Figure 54:
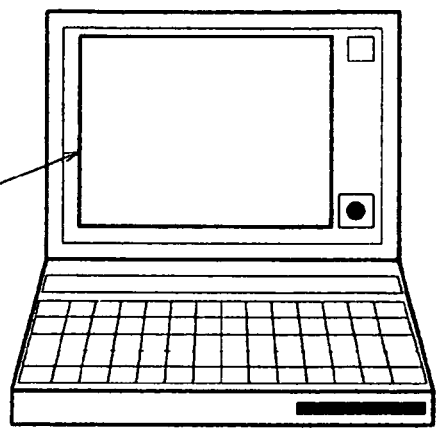
Figure 54:
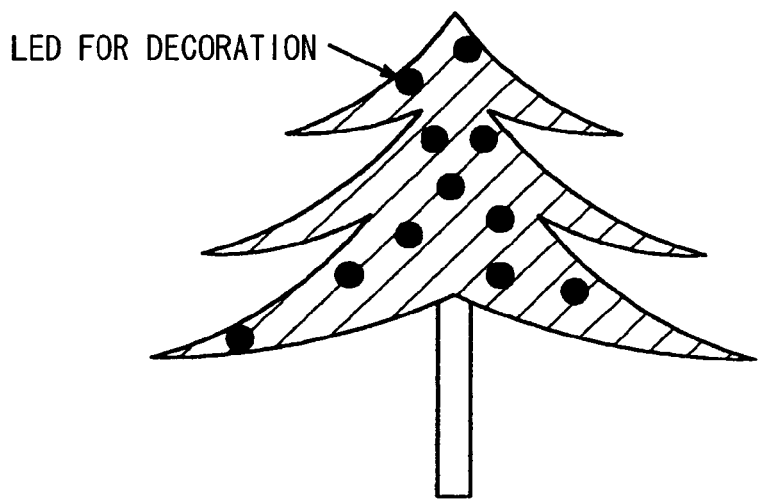

Semiconductor light emitting devices such as light emitting diodes (LEDs) have been conventionally used for display in various electrical apparatus. FIGS. 53 and 54 are diagrams describing an example of using LEDs for display in electrical apparatus. FIG. 53(A) shows an example of a television set in which LEDs are provided for indicating whether the power is on or off, whether the power is in display mode or in standby mode, and the statuses of input ports. In addition, FIG. 53(B) shows an example of an audio device in which LEDs are provided for indicating whether the power is on or off. Furthermore, in the example shown in FIG. 53(C), LEDs are provided in respective indicators in a measuring instrument for indicating the operating statuses of the respective indicators and values to which the respective indicators point.

The semiconductor light emitting devices such as LEDs are used not only for transmitting displayed contents to a user by emitting light, but also displaying text and picture data. For example, FIG. 54(A) shows an example of an apparatus which has a liquid crystal panel. LEDs are widely used for such liquid crystal panels as a backlight. Similarly, FIG. 54(B) shows an example of a notebook computer, which has a backlight equipped liquid crystal panel as a display. LEDs are also used as the backlight in this case. In addition, a display means such as an electric bulletin board in which a great number of LEDs are arranged has been developed and used.

Furthermore, in addition to an application for a user to obtain data by visually recognizing emitted light as described above, semiconductor light emitting devices such as LEDs have also been widely used for decoration, for example. In the example shown in FIG. 54(C), LEDs are used for decorative illumination for a christmas tree. Similarly, they are used for advertising signs and interior decoration. Semiconductor light emitting devices such as LEDs are also used for various electrical apparatus other than the above.

The semiconductor light emitting devices such as LEDs provided in electrical apparatus are capable of directly showing light for a person, transmitting data, and presenting an aesthetic sense. They have conventionally been used only for the aforementioned applications and never used for other applications.

Figure 45:
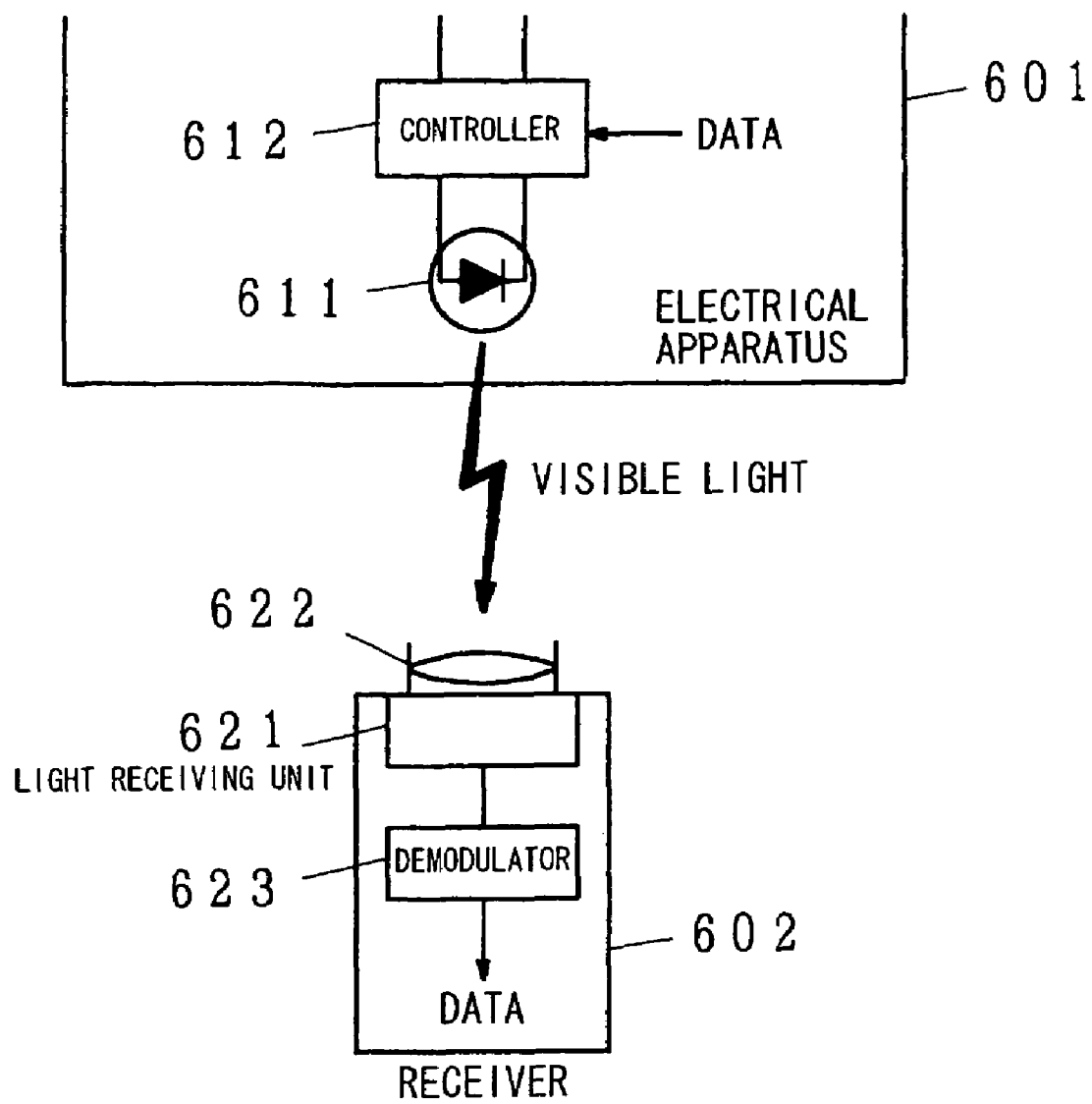
FIG. 45 is a block diagram of an electrical apparatus, according to an embodiment of a sixth aspect of the present invention.

FIG. 45 is a block diagram of an electrical apparatus, according to an embodiment of a sixth aspect of the present invention. In the drawing, 601 denotes an electrical apparatus, 602 denotes a receiver, 611 denotes an LED, 612 denotes a controller, 621 denotes a light receiving unit, 622 denotes an optical system, and 623 denotes a demodulator. In this exemplary structure, the LED 611 is used as an example of a semiconductor light emitting device. Other semiconductor light emitting devices, such as a laser diode, an EL device, and a plasma display device are also available.

The LED 611 is an LED light source for display, which has conventionally been provided in an electrical apparatus and used for displaying statuses of apparatus such as a power supply in this case. Note that the LED 611 may be constituted by a single device or multiple devices. Furthermore, various device structures such as a single device having a multiple color light emitting area are possible.

The controller 612 controls blinking or light intensity of the LED 611 in accordance with data, thereby modulating light emitted from the LED 611, and then transmits the data. Since the LED 611 has a feature of very fast response speed as described above, data may be transmitted by allowing it to blink at a high speed or change light intensity in accordance with data. In addition, since high-speed changes in light intensity and high-speed blinking are unperceivable to the human eye, it is visually recognized as if the LEDs are continuously on. As a result, data may be transmitted while the conventional LED 611 is kept on. Note that any modulation system such as a various digital or an analog modulation system can be used for modulation.

With such structure, use of the LED 611, which has conventionally been provided in an electrical apparatus for display, allows data transmission while maintaining its display function. Many functions are required for electrical apparatus, and at the same time embedding increased functionality in a limited, simply designed area is also required. Therefore, use of the conventionally provided LED 611 allows addition of data transmission capability without increasing the apparatus size.

The receiver 602 receives modulated light emitted from the LED 611 in the electrical apparatus 601, thereby receiving data. The receiver 602 comprises the light receiving unit 621 which receives and converts light to an electrical signal, and the demodulator 623 which demodulates the electrical signal and captures data. The light receiving unit 621 receives light from the aforementioned electrical apparatus 601, and the demodulator 623 then captures data, thereby transmitting data from the electrical apparatus 601 to the receiver 602.

In addition, the optical system 622 such as a lens may be provided on the light receiving unit 621. Provision of this optical system 622 allows specifying a light source from which light is received, in other words, pin-point data reception. As a result, even if similar electrical apparatus are arranged, data from a specified electrical apparatus may be received without data communication being interfered with the other electrical apparatus.

Figure 46:
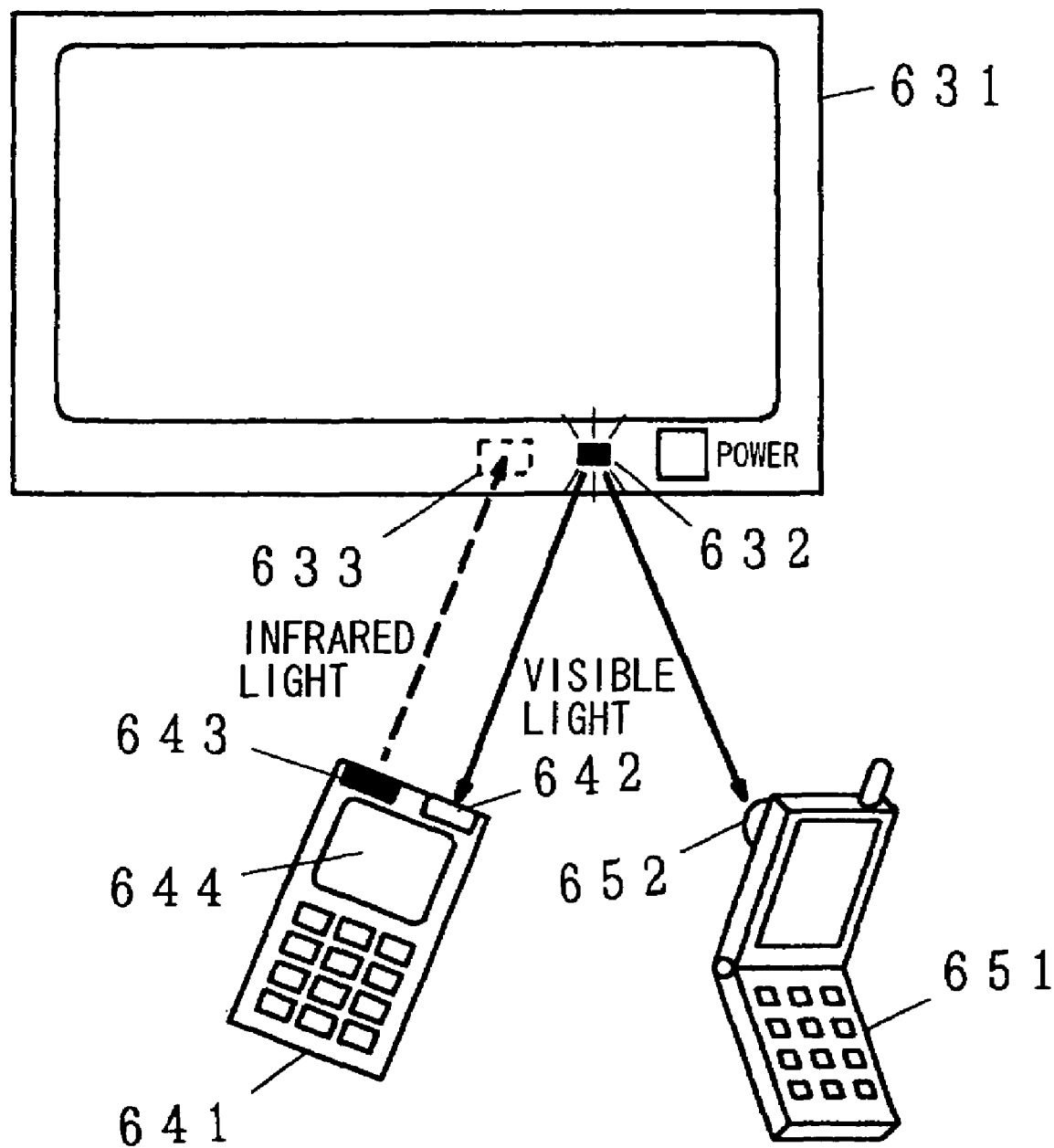
FIG. 46 is a schematic diagram of a first application of the electrical apparatus, according to the embodiment of the sixth aspect of the present invention.

FIG. 46 is a schematic diagram of a first application of the electrical apparatus, according to the embodiment of the sixth aspect of the present invention. In the drawing, 631 denotes a television set, 632 denotes an LED, 633 denotes an infrared light receiving unit, 641 denotes a remote control, 642 denotes a light receiving unit, 643 denotes an infrared light transmitting unit, 644 denotes a display, 651 denotes a portable terminal, and 652 denotes a camera. In the example shown in FIG. 46, the sixth aspect of the present invention is applied to the television set.

The television set 631 is conventionally remotely controlled by the remote control 641. Infrared rays are generally used for data communication from the remote control 641 to the television set 631. In the example shown in FIG. 46, the infrared light transmitting unit 643 is provided in the remote control 641, and the infrared light receiving unit 633 is provided in the television set 631. With such structure, when a user manipulates the remote control 641, data corresponding to the manipulation is transmitted via infrared light to the television set 631. For example, when a channel is selected via the remote control 641, data of the selected channel is transmitted via infrared light from the infrared light transmitting unit 643 to the television set 631, and is then received by the infrared light receiving unit 633 in the television set 631, allowing switching to the selected channel. Note that the ordinary television set 631 only allows unidirectional communication from the remote control 641 to the television set 631.

Typically, one or more LEDs 632 for displaying whether the power is on or off and whether the power is in display mode or in standby mode are provided in the television set 631. According to the sixth aspect of the present invention, this LED 632 is used as the LED 611 shown in FIG. 45 for data communication. In other words, the LED 632 may display information of whether the power is on or off, operating statuses or the like as from before, and at the same time, may be controlled to modulate in accordance with data, thereby emitting modulated visible light or outputting the data.

The light receiving unit 642 for receiving modulated light emitted from the television set 631 is provided in the remote control 641. The light receiving unit 642 receives visible modulated light emitted from the television set 631, and demodulates the light internally, thereby receiving data transmitted from the television set 631.

This allows data transfer from the television set 631 to the remote control 641. Bi-directional communication between the television set 631 and the remote control 641 is possible while only unidirectional communication therebetween has been conventionally possible. As a result, the remote control 641 may receive and then transmit the status of the television set 631 to a user. This allows, for example, the television set 631 to transmit operating instructions for the television set 631 and program reservation information to the remote control 641, and allows the remote control 641 to receive, display, and confirm them on the display 644. In addition, various manipulations are possible while confirming the status of the television set 631 on the display 644 of the remote control 641.

FIG. 46 also shows an exemplary portable terminal 651 with the camera 652. Data to be transmitted using the LEDs 632 in the television set 631 may be received by various visible light receivable devices, instead of a dedicated device such as the remote control 641. In recent years, a cellular phone with a camera and a PDA with a camera have been widely used. By using them as the portable terminal 651, data transmitted from the television set 631 can be received. In addition, an apparatus which originally has an imaging function, such as a digital camera or a digital video recorder, may also be used for communication.

In both the remote control 641 and the portable terminal 651, for example, program contents received by the television set 631 may be transmitted therefrom to the portable terminal 651, which then displays the program contents on the display unit or has a speaker outputting voice for the same. For example, programs other than a program presently displayed on the television set 631 (counterprogram) or teletext broadcasting may be displayed and viewed on the display in the remote control 641 or display unit in the portable terminal 651 without displaying them on the screen of the television set 631.

Such visible light data communication is possible while the LEDs 632 are on, allowing communication even in standby mode in which the television set is not being viewed. In addition, since the light receiving unit 642 in the remote control 641 having an optical system, such as a lens, or the camera 652 of the portable terminal 651 can selectively receive light from the light sources, data can be selectively received from a specific television set even when multiple television sets are arranged.

Figure 47:
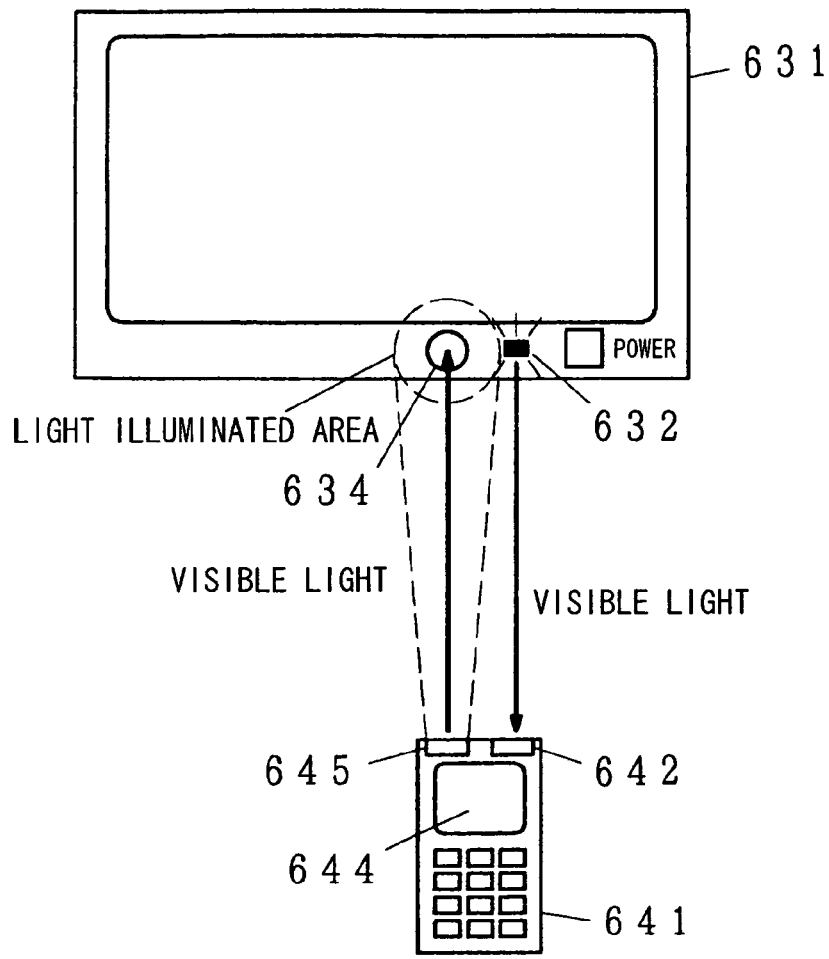
FIG. 47 is a schematic diagram of a modified example of the first application of the electrical apparatus, according to the embodiment of the sixth aspect of the present invention.

FIG. 47 is a schematic diagram of a modified example of the first application of the electrical apparatus according to the embodiment of the sixth aspect of the present invention. In the drawing, the same symbols are given to the same parts as those in FIG. 46, and repetitive descriptions thereof are thus omitted. 634 denotes a light receiving unit, and 645 denotes a light emitting unit. In the example shown in FIG. 46, infrared data communication from the remote control 641 to the television set 631 is provided. According to the modified example shown in FIG. 47, visible light data communication from the remote control 641 to the television set 631 is provided. Note that visible light data communication from the television set 631 to the remote control 641 is provided in the same manner as described above.

The light emitting unit 645 is provided in the remote control 641 while the light receiving unit 634 is provided in the television set 631 for visible light data communication from the remote control 641 to the television set 631. Those units correspond to the infrared light transmitting unit 643 and the infrared light receiving unit 633 shown in FIG. 46, respectively.

In the case of transmitting data from the remote control 641, the light emitting unit 645 should be controlled to emit light in accordance with a signal that is modulated in accordance with data. The light receiving unit 634 in the television set 631 receives and demodulates the modulated light, thereby receiving data transmitted from the remote control 641.

The light emitting unit 645 in the remote control 641 should be structured with an optical system such as a mirror or a lens such that a modulated light beam emitted from the light emitting unit 645 can be narrowed. As a result, modulated light can efficiently be transmitted to the television set 631. In addition, since visible light is used for this optical communication, when the narrowed light beam reaches the television set 631, the surface of the television set 631 is brightly illuminated as shown in FIG. 47 in the same manner as a flashlight, for example. As a result, an area illuminated by light emitted from the remote control 641 can be visually recognized. For example, even when there are multiple television sets 631, a single target television set to which data is to be transmitted can be reliably specified and confirmed, and the data can be surely transmitted thereto.

Since infrared light is invisible, a data transmission destination cannot be identified. Moreover, when there are multiple television sets, manipulation of the remote control for changing the ID or the like is a must. On the other hand, according to the sixth aspect of the present invention, such manipulation is unnecessary. Instead, after visually determining that light is hitting a target TV set that an operator desires to control, mere manipulation of the remote control should be carried out. Therefore, such manipulation is easier and more reliable.

Note that the remote control 641 is used for not only television sets, but also video tape recorders, DVD players, audio devices, air conditioners, or other various apparatus, and the aforementioned first application is applicable to those apparatus in the same manner.

In addition, the present invention herein is applicable to all apparatus which can display power status and apparatus status using a semiconductor light emitting device such as an LED. Next, an application to a measuring device is described.

Figure 48:
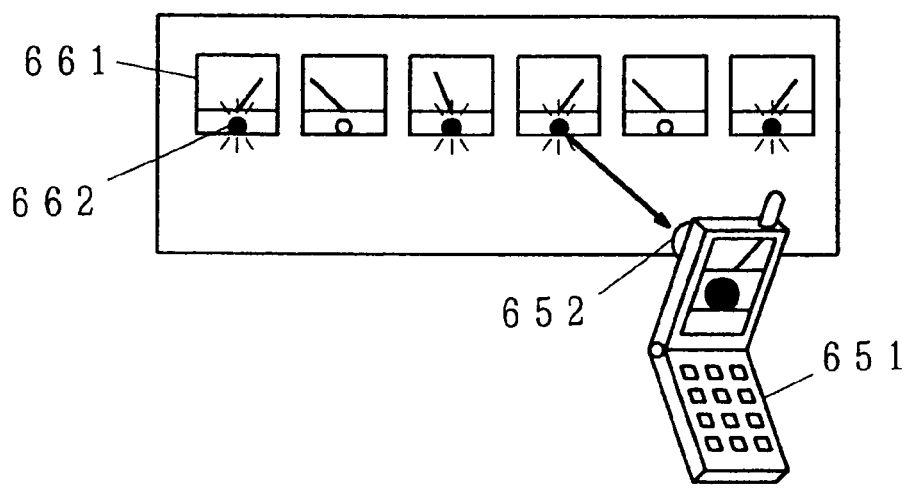
FIG. 48 is a schematic diagram of a second application of the electrical apparatus, according to the embodiment of the sixth aspect of the present invention.

FIG. 48 is a schematic diagram of a second application of the electrical apparatus, according to the embodiment of the sixth aspect of the present invention. In the drawing, 661 denotes gauges, and 662 denotes LED indicators. Note that a portable terminal 651 is the same as that shown in FIG. 46, which includes a camera 652.

As shown in FIG. 48, various gauges 661 are arranged in an airplane cockpit, or control panel at a plant or the like. In addition, the respective gauges 661 often have LED indicators 662, respectively, which display whether or not apparatus corresponding to the respective gauges 661 are operating, or statuses thereof. The LED indicators 662 are used as the LEDs 611 shown in FIG. 45 for data transmission. In other words, the LED indicators 662 display operating statuses of apparatus as conventionally, and at the same time, can be controlled to modulate in accordance with data, thereby emitting modulated visible light or outputting the data. For example, various data, such as the statuses of apparatus corresponding to the respective gauges 661, values indicated by the gauges 661, and on-line manuals for measuring devices or control devices in which the gauges 661 are installed, may be transmitted.

In this manner, modulated light emitted from the LED indicators 662 provided in the gauges 661 may be received by the portable terminal 651 with the camera 652. More specifically, when multiple gauges 661 are provided as shown in FIG. 48, the camera 652 selectively picks up an image of an LED indicator 662 in a gauge 661, allowing data reception from the LED indicator 662 in that specified gauge 661. For example, when the detailed status or an on-line manual for the fourth gauge 661 from the left wants to be known or read, only an image of the LED indicator 662 in the fourth gauge 661 from the left should be picked up. This allows selective reception of only data transmitted from the LED indicator 662 in the fourth gauge 661 from the left. In this case, if a user acquires the position of the LED indicator 662 while viewing the image taken by the camera 652, desired data may be correctly and reliably captured.

If such data is transmitted through radio wave communication, since a radio wave disperses, pin-point reception is impossible, resulting in reception of data from another gauge.

Alternatively, data must be transmitted by changing frequency, time, or code, and troublesome manipulation and confirmation, such as selection of a radio wave from a specified gauge, are needed for the receiver. The advantage of visible light communication is that only one of multiple apparatus provided in a narrow space can be correctly and directly selected.

Through sequential communication with the aforementioned gauges 661, data from the gauges 661 are accumulated in the portable terminal 651. This accumulated data may be transferred to the portable terminal 651, other terminals, or a host system, and then processed. It is applicable to reading of, for example, an electric power meter, a water meter, or a gas meter.

Figure 49:
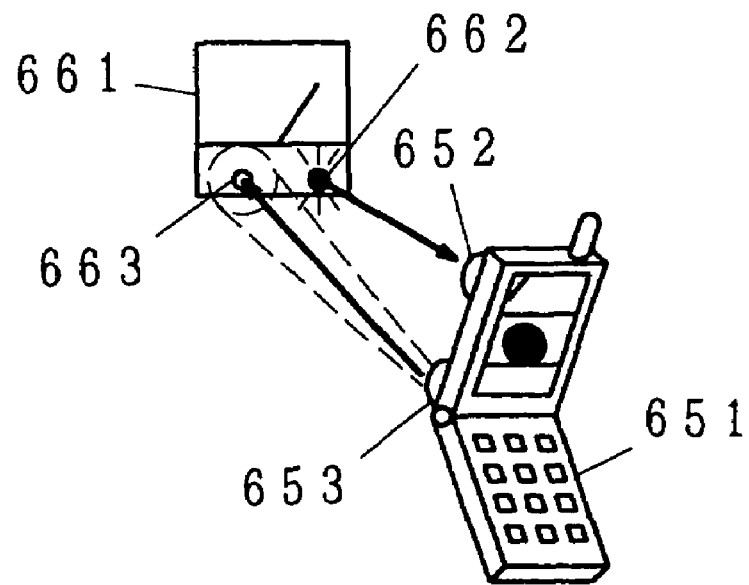
FIG. 49 is a schematic diagram of a modified example of the second application of the electrical apparatus, according to the embodiment of the sixth aspect of the present invention.

FIG. 49 is a schematic diagram of a modified example of the second application of the electrical apparatus, according to the embodiment of the sixth aspect of the present invention. In the drawing, 653 denotes a light emitting unit, and 663 denotes a light receiving unit. As with the aforementioned examples shown in FIGS. 46 and 47, a structure such that a light receiving unit 663 for receiving visible light or infrared light is provided in the gauge 661 and that a light emitting unit 653 for emitting visible light or infrared light is provided in the portable terminal 651, allowing communication from the portable terminal 651 to the gauge 661 or bi-directional communication is possible. In this manner, since bi-directional communication is made possible, reliable communication such that an confirmation request or a data transfer request is transmitted to the gauge 661 from the portable terminal 651, or confirmation after data transfer is returned to the gauge 661 is possible.

Furthermore, when a handshake is performed between such gauge 661 and the portable terminal 651, it is possible to display the status such as communication being available or communication in progress by the same LED indicator 662 in the gauge 661 blinking or changing color, which can be recognized by the user. As a result, a user can reliably select and communicate with a target gauge 661 without accidentally selecting another gauge.

Note that as described with FIG. 47, provision of an optical system on the light emitting unit 653 in the portable terminal 651 to narrow light beams allows pin-point data transmission to a specified gauge 661. In addition, a target gauge 661 to which data is transmitted may be found and visibly confirmed by the spotlight illuminating the gauge 661.

As described above, the sixth aspect of the present invention is applicable to not only home electric appliances, but also industrial apparatus, such as measuring instruments, and control panels at a plant. In addition, it is applicable to various applications such as office equipment, and transportation such as automobiles and airplanes.

Figure 50:
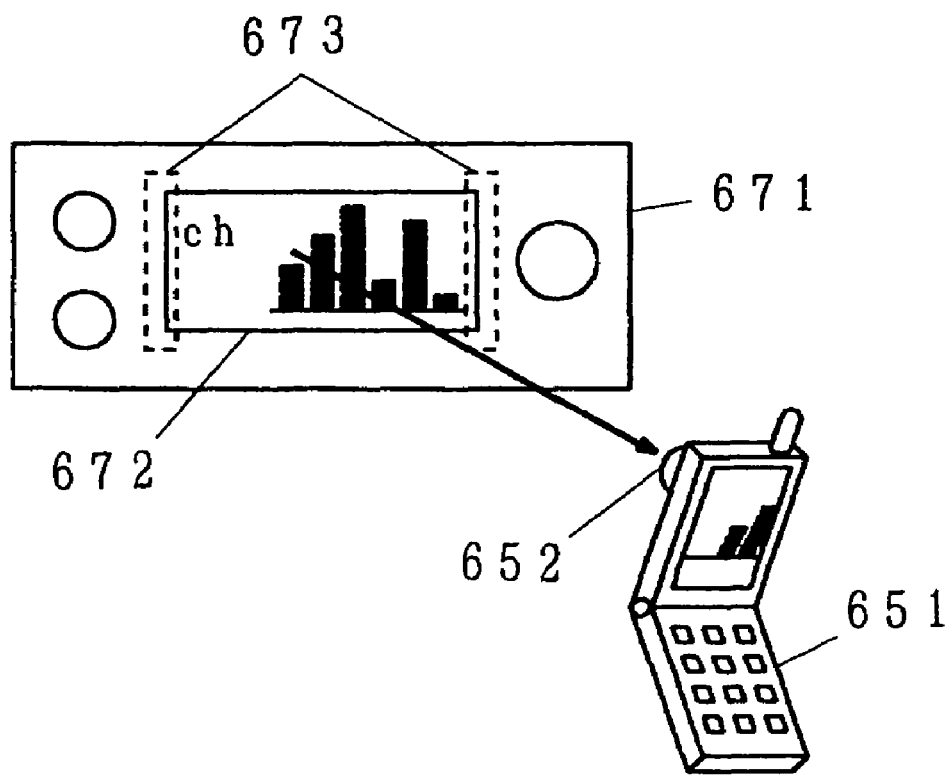
FIG. 50 is a schematic diagram of a third application of the electrical apparatus, according to the embodiment of the sixth aspect of the present invention.

FIG. 50 is a schematic diagram of a third application of the electrical apparatus, according to the embodiment of the sixth aspect of the present invention. In the drawing, 671 denotes an audio device, 672 denotes a liquid crystal panel, and 673 denotes backlight LEDs. In the aforementioned first and the second application, only the LEDs are used for displaying the power statuses of the apparatus and the apparatus statuses. However, the sixth aspect of the present invention is not limited to those applications. In this third application, a semiconductor light emitting device such as an LED embedded in a display unit is used for communication. Note that a portable terminal 651 is the same as that shown in FIGS. 46, 48, and 49, which comprises at least a camera 652.

In this example, the audio device 671 is shown as a working example. The recent audio device 671 has the liquid crystal panel 672 for displaying various pieces of data. LEDs are widely used for such liquid crystal panel 672 as backlights. The backlight LEDs 673 are used as the LEDs 611 shown in FIG. 45 for data transmission. In other words, data is displayed on the liquid crystal panel 672, and a user can see images displayed on the liquid crystal panel 672. The backlight LEDs 673 are controlled to modulate in accordance with data to be transmitted, allowing optical data transmission via the light of the backlights. The portable terminal 651 receives and demodulates the light of the backlights, thereby receiving data.

In addition, as with the aforementioned first application, the modified example thereof, and the modified example of the second application, in the case of bi-directional communication, a light reception device or a light receiving layer should be provided near the backlight LEDs 673 of the liquid crystal panel 672, or on the back of a liquid crystal layer of the liquid crystal panel 672 to receive visible light or infrared light. As long as the light of the backlight LEDs 673 passes through the liquid crystal layer, external light may also pass through the liquid crystal layer. As a result, a structure such that a light receiving unit is provided in the liquid crystal panel 672 is possible. In addition, a visible light or infrared light emitting device is provided in the portable terminal 651 to emit visible light or infrared light modulated in accordance with data to be transmitted, which should be received and demodulated by the light receiving unit in the liquid crystal panel 672. As a result, data may be transmitted from the portable terminal 651 to the audio device 671, allowing bi-directional communication.

Needless to say, if the audio device 671 may be controlled by a remote control, visible light communication using the backlight LEDs 673 is possible even in the case of using a remote control as the first application described above. In addition, in this example, the audio device 671 is shown as a working example but is not limited to this. The sixth aspect of the present invention is applicable to various display embedded apparatus using LEDs as a light source. For example, it is applicable to various apparatus, which include a liquid crystal display unit using LEDs as backlights, such as a display of home electric appliances, a radio, a notebook computer, a liquid crystal display, a liquid crystal television, a liquid crystal display of an automobile instrument panel, and a car navigation system. In addition, communication is possible in the same manner with the aforementioned portable terminal using LEDs for lighting, which constitute the display.

Furthermore, it is applicable to various display units which use semiconductor light emitting devices other than LEDs as the light source, and is not limited to the liquid crystal display units. Visible light communication is possible in the same manner even for another type of display unit using devices having a very fast response characteristic.

Figure 51:
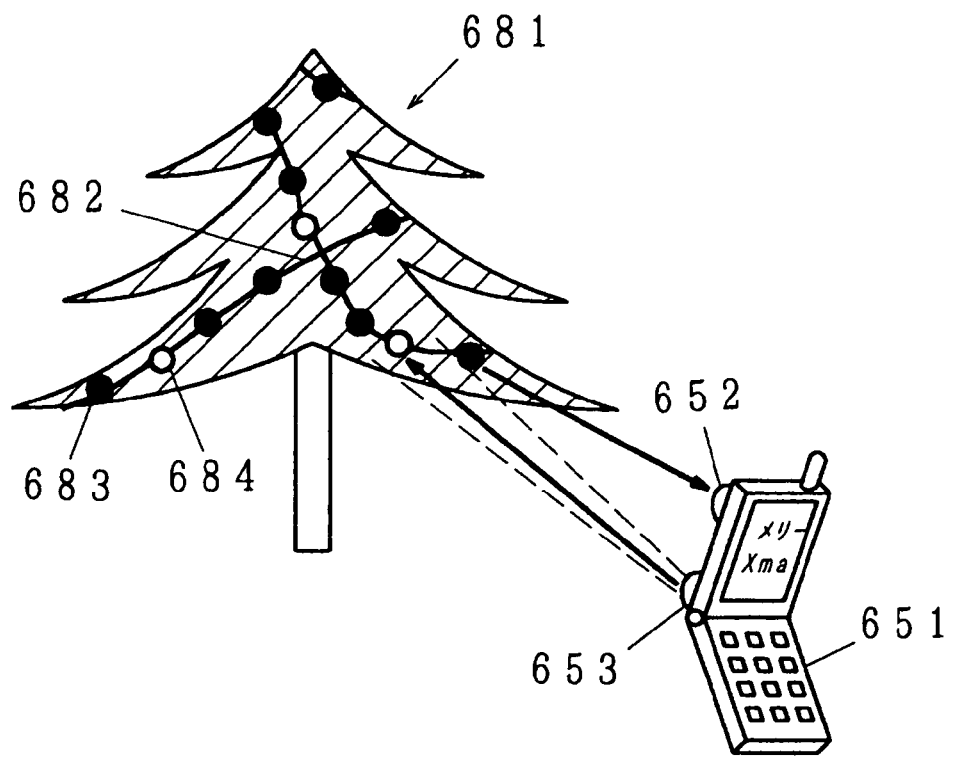
FIG. 51 is a schematic diagram of a fourth application of the electrical apparatus, according to the embodiment of the sixth aspect of the present invention.

FIG. 51 is a schematic diagram of a fourth application of the electrical apparatus, according to the embodiment of the sixth aspect of the present invention.

In the drawing, 681 denotes a christmas tree, 682 denotes illumination lamps, 683 denotes LEDs, and 684 denotes light reception devices. In the fourth application, LEDs are used for decoration. A case of the christmas tree 681 is given as an example. Note that a portable terminal 651 is the same as that shown in FIGS. 46, 48, 49, and 50, which comprises at least a camera 652.

The christmas tree 681 is elaborately decorated using the illumination lamps 682, for example. The illumination lamps 682 have light sources at appropriate intervals along an electric wire and are hung on the christmas tree 681 for optical decoration through blinking the light sources.

In recent years, the LEDs 683 provided in the illumination lamps 682 have been developed. The LEDs 683 are used as the LEDs 611 shown in FIG. 45 for data transmission. In other words, by controlling the LEDs 683 to modulate in accordance with data while they are on, modulated visible light may be emitted. The portable terminal 651 receives and demodulates this modulated light, thereby receiving data. In this manner, when a pedestrian looks at, for example, the christmas tree 681 and then turns the portable terminal 651 toward it, various pieces of data such as message, image, and voice transmitted therefrom may be received.

In addition, since there are many areas where the LEDs 683 are not deployed, light reception devices 684 for receiving visible light or infrared light may be provided in those areas. In addition, a visible light or infrared emitting device is provided in the portable terminal 651 to emit visible light or infrared light modulated in accordance with data to be transmitted, which should be received and demodulated by the light reception devices 684. As a result, data may be transmitted from the portable terminal 651 to the christmas tree 681, allowing bi-directional communication. Needless to say, the light reception devices 684 may be arranged with other decorative trims, independently from the illumination lamps 682.

With the fourth application, an example of illumination lamps for a christmas tree is given. Alternatively, semiconductor light emitting devices such as LEDs, which have been employed for various decorations, may be used for visible light communication. For example, the semiconductor light emitting devices such as LEDs used for various decorations, such as a costume with decorative illumination, illumination for a parade float, decor for home furnishings, decorative illumination for a shop-front or a building, may be used for visible light communication.

Figure 52:
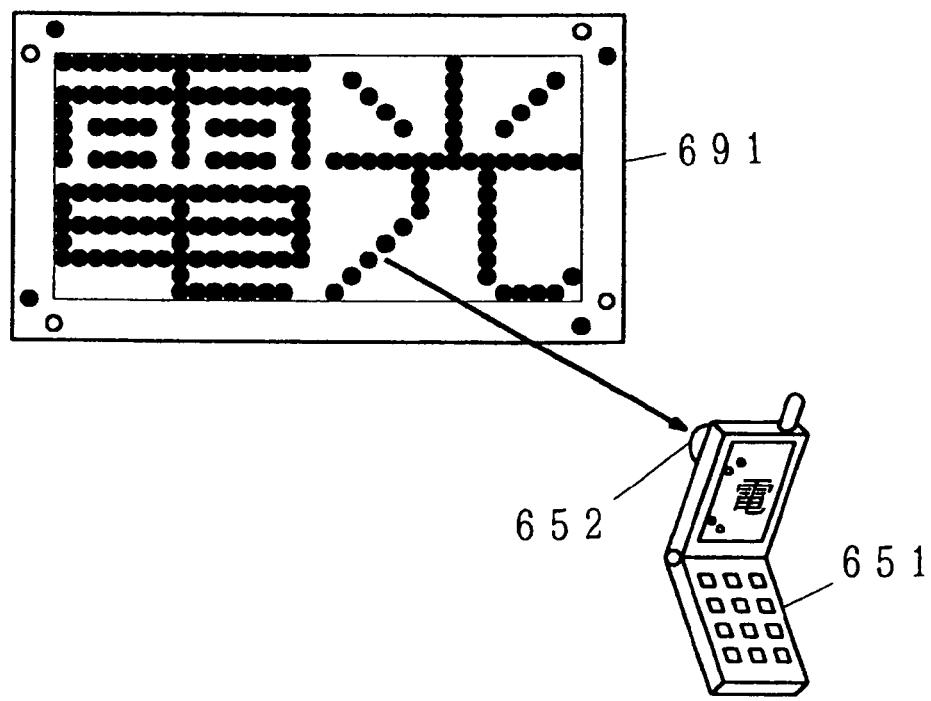
FIG. 52 is a schematic diagram of a fifth application of the electrical apparatus, according to the embodiment of the sixth aspect of the present invention.

FIG. 52 is a schematic diagram of a fifth application of the electrical apparatus, according to the embodiment of the sixth aspect of the present invention. In the drawing, 691 denotes an electric bulletin board. In recent years, the electric bulletin board 691 in which a great number of light sources are provided has been widely used, and LEDs have been widely used as the light sources. In addition, LEDs for decoration may be provided in the electric bulletin board 691 other than LEDs for a data displaying area. Such LEDs for displaying data and those for decoration are used as the LEDs 611 shown in FIG. 45, allowing data transmission. For example, when a pedestrian turns the portable terminal 651 with a camera toward the electric bulletin board 691, various pieces of data such as message, image, and voice transmitted therefrom may be received.

Needless to say, provision of light reception devices for receiving visible light or infrared light in the electric bulletin board 691 allows bi-directional communication with the portable terminal 651, which is provided a visible light or an infrared light emitting device.

The electric bulletin board 691 is used for displaying news on the street, used as an advertising display at a store, or used for displaying various applications such as a destination indicator, a type indicator, and a fee indicator for a train or a bus. The sixth aspect of the present invention is applicable to electric bulletin boards which are used for various applications. In addition, with the various applications using semiconductor light emitting devices, such as an instruction light during construction work, a guidance light for a guide, or a beacon light provided on the road or road surface, visible light communication is possible by using the semiconductor light emitting devices for communication.

In this manner, according to the sixth aspect of the present invention, semiconductor light emitting devices such as LEDs, which function as a displaying means for directly showing light for a person, transmitting data or presenting an aesthetic sense, may be used for visible light communication through control of the LEDs to modulate in accordance with data while maintaining the function of a displaying means. In this manner, use of existing semiconductor light emitting devices allows communication without providing an additional transmitting means. As a result, increase in system size and change in design are unnecessary.

In addition, in the case of a conventional electrical apparatus using a remote control, it is possible to receive data transmitted from the electrical apparatus by providing a light receiving means in the remote control. Other than the remote control, a portable terminal with a camera may receive data. In this case, if the portable terminal has an optical system like a camera to narrow a received light beam, a data transmission source or a light source can be specified, allowing pin-point reception.

Furthermore, if visible light or infrared light transmission is possible, bi-directional communication with an electrical apparatus is possible. Note that when a remote control has a visible light transmission capability, lighting a destination area with a light beam, which is also used for transmission, allows a person to surely recognize and identify a transmission destination apparatus, providing easy data communication with a specified transmission destination.

(Seventh Aspect of the Present Invention)

Next, a second exemplary application, according to a seventh aspect of the present invention is described. The seventh aspect of the present invention is an exemplary application to emergency lights.

of various display apparatus, emergency lights semi-permanently continue to illuminate and are hardly ever switched off once they are switched on. As a provision against accidents such as a fire or a disaster, many emergency lights are deployed in plain view, such as in a building, a theater, a film theater, a hospital, an airport, and a station. The majority of present emergency lights uses a fluorescent lamp as a light source. Since it is expected that external electric power may be turned off when a disaster occurs, an internal battery is used to supply electric power to emergency lights to illuminate while in an emergency. Fluorescent lamps having better electric power efficiency than incandescent bulbs are used for effective utilization of limited electric power. Meanwhile, reduction in maintenance cost using a light source having further excellent electric power efficiency and a long-lived light source has been required. As described above, LEDs have excellent electric power efficiency and a long operating life, but they have not been considered to be used as emergency lights. As merely disclosed in Japanese Patent Application Laid-Open No. Hei 9-19084, there is a case that LEDs are used as a secondary light source to display a state of charge, for example. However, LEDs have never been used as a main light source for emergency lights.

In addition, ordinary emergency lights deployed in place merely provide visual information of where emergency exits and emergency staircases are located. There is relevant information disclosed in, for example, Japanese Patent Application Laid-Open No. Hei 8-299475 in which a voice guiding mechanism is provided and Japanese Patent Application Laid-Open No. Hei 8-67203 in which radio broadcasting is used. However, large electric power is needed for voice output. Therefore, a large-capacity battery must be embedded for visual indication of the emergency exits, which is the first principle for the emergency lights, and for voice output, thereby developing problems of increase in cost and system size.

On the other hand, since LEDs have a high-speed response characteristic and can be modulated at a high speed, use of LEDs for optical data communication has been studied. The idea of using these features and carrying out illumination and communication at the same time has been well-known. However, ordinary lighting elements are switched off when power supply stops due to a disaster. Therefore, those devices cannot be used while in an emergency, and there has been no communication system established assuming an emergency.

In order to solve such problems, the seventh aspect of the present invention shows an exemplary application of light emitted from emergency lights for communication.

Figure 55:
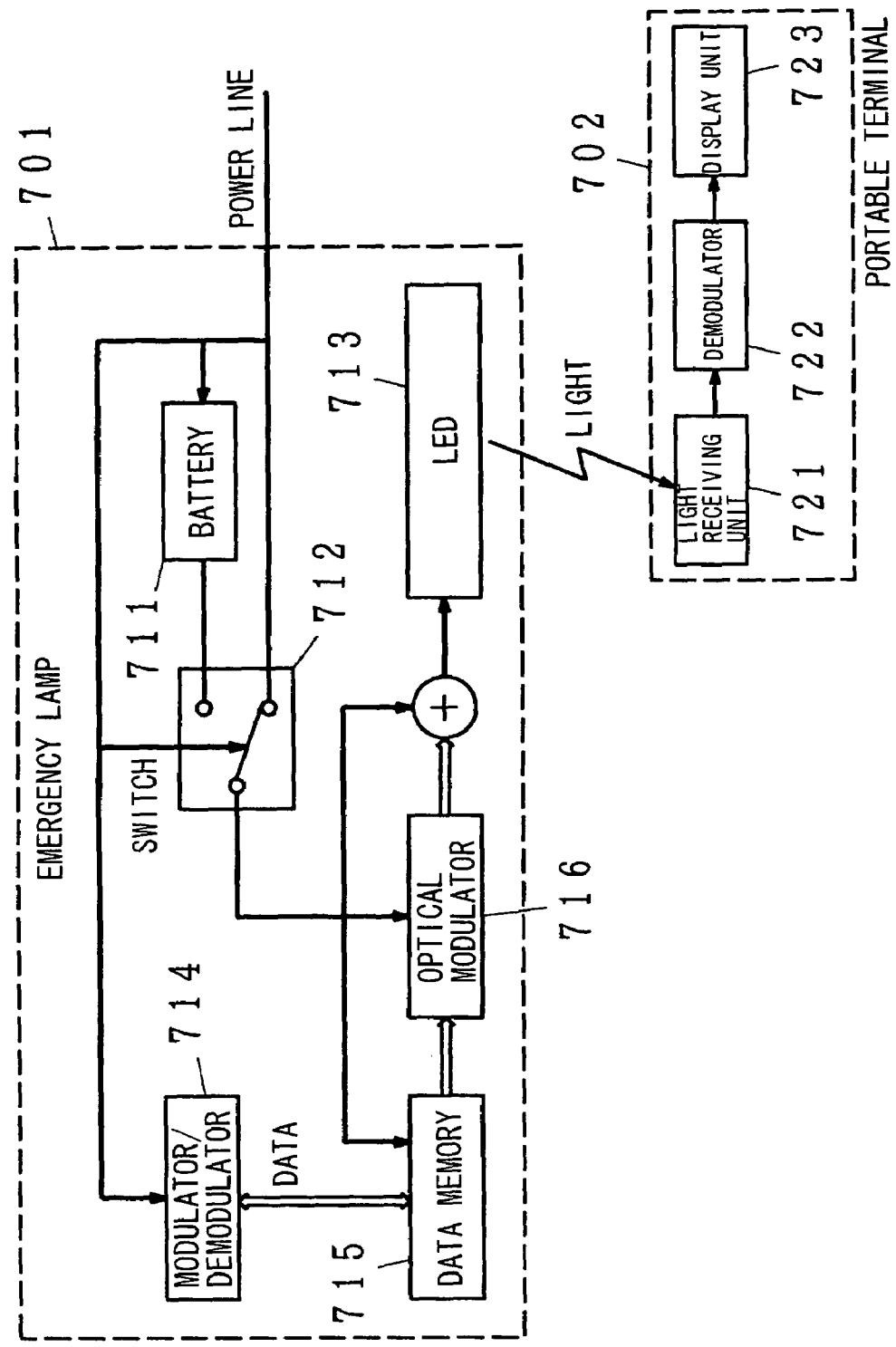
FIG. 55 is a block diagram of an emergency light and a wireless emergency light data communication system, according to an embodiment of a seventh aspect of the present invention.
Figure 56:
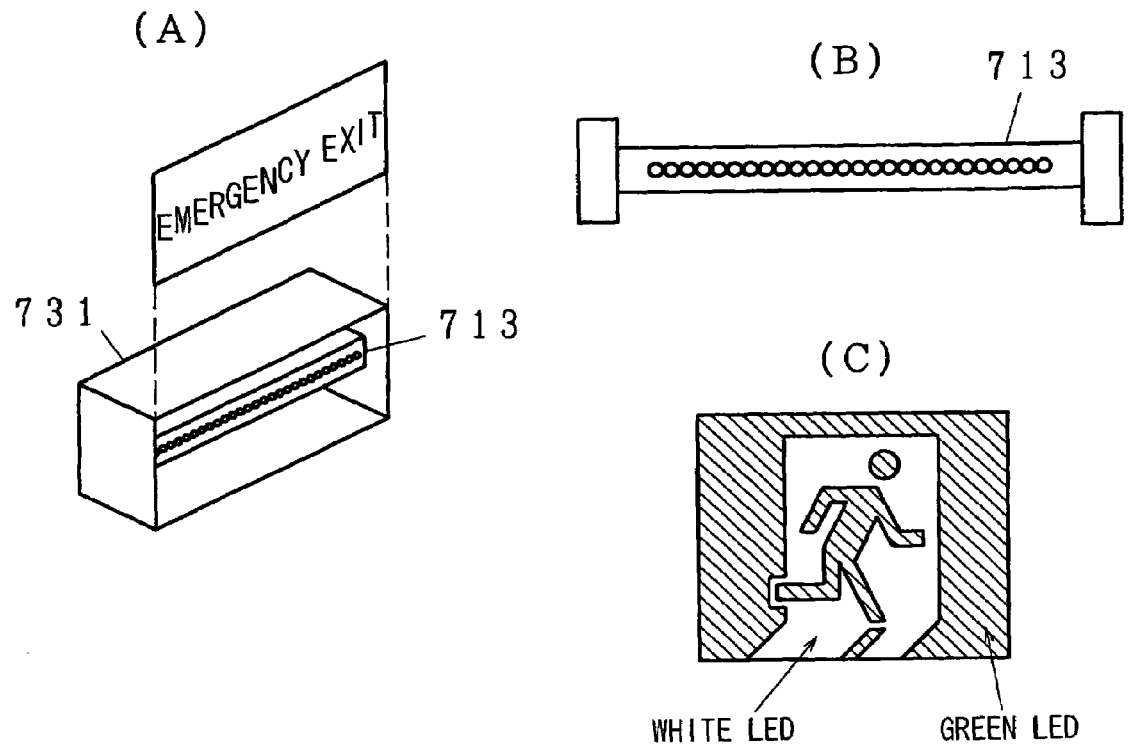
FIG. 56 shows an exemplary LED array used as a light source.

FIG. 55 is a block diagram of an emergency light and a wireless emergency light data communication system, according to an embodiment of the seventh aspect of the present invention. FIG. 56 is a diagram describing an exemplary LED array used as a light source. In the drawings, 701 denotes an emergency light, 702 denotes a portable terminal, 711 denotes a battery, 712 denotes a switch, 713 denotes an LED array, 714 denotes a modulator/demodulator, 715 denotes data memory, 716 denotes an optical modulator, 721 denotes a light receiving unit, 722 denotes a demodulator, 723 denotes a display unit, and 731 denotes a cover. The emergency light 701 has the battery 711 as a power source in addition to an external power source, as with typical conventional emergency lights, and the switch 712 to switch a power supply source from the external power source to the battery 711 when power supply from the external power source stops.

In the seventh aspect of the present invention, the LED array 713, instead of a conventional fluorescent light, is used as the illuminative light source. FIG. 56 shows an exemplary shape of the LED array 713. In the example shown in FIG. 56(A), as with typical emergency lights, the LED array 713 is provided in the cover 731 on which a pictorial mark is displayed. When using it in such a manner, the rod-shaped LED array 713 similar to a fluorescent lamp is used, as shown in FIG. 56(B). For example, LED devices should be arranged in one or more rows. In addition, such LED array 713 may be used as a substitute for a DC lighting fluorescent lamp. Accordingly, the emergency light, according to the seventh aspect of the present invention, may be structured only by replacing a fluorescent light in the conventionally available emergency light with the LED array 713 as shown in FIG. 56(B). In this case, when AC electric power is supplied from a power line, the emergency light should be driven by DC electric power, which is provided through conversion by an AC-DC converter. Moreover, with an emergency light using AC lighting fluorescent light, a DC-AC converter should be embedded in the LED array 713 and used while being driven by the battery 711. Note that use of this such-shaped LED array 713, which can be substituted for a fluorescent lamp, allows provision of the emergency light with the same shape as that of the conventional emergency light in appearance.

In addition to the structure using the LED array as a substitute for the conventional fluorescent lamp, the LED array 713 may directly display a pictorial mark, which has been put on the cover 731, as shown in FIG. 56(C). In the case of a pictorial mark indicating emergency exits, since the pictorial mark is typically designed in white and green, it can be displayed by arranging white and green LEDs in place. Needless to say, a pictorial mark may be displayed by arranging LEDs in the same manner as a color display apparatus. Note that in such cases, a transparent material should be used as the cover 731.

Use of an LED array as a light source for the emergency light 701 in this manner and an advantage of LEDs having low power consumption allows provision of the same lighting time with a small-capacity battery as that by prior art, reduction in size of the battery 711, reduction in size and weight of the emergency light 701, and reduction in cost. On the other hand, if the battery has the same capacity as that of the prior art, the emergency light may be on over a long period of time, allowing an escape guiding display to be displayed for a long time when a disaster occurs. Moreover, a feature of long-lived LEDs allows extension of maintenance intervals, such as replacement of a light source, and decrease in man-hour for maintenance work, resulting in reduction in maintenance cost. Needless to say, it is desirable that maintenance for keeping performance, such as checking stains and battery life, and checking whether lighting is possible against a disaster, should be continued. Furthermore, since LEDs are highly crashproof, it can be expected that a light source will not be damaged and will continue to illuminate even when a devastating disaster occurs.

The emergency light 701 according to the seventh aspect of the present invention shown in FIG. 55 further includes the modulator/demodulator 714, the data memory 715, and the optical modulator 716. A communication method using a power line for supplying electric power from the external power source is used for transmitting data to the emergency light 701. The modulator/demodulator 714 separates and demodulates modulated data which is superimposed on a voltage from the external power source, and then stores the resulting demodulated data in the data memory 715. For example, data to be transmitted from the emergency light 701 while in an emergency can be transmitted from a computer via a power line. Accordingly, data may be distributed to the emergency light 701 via an external power source while not in an emergency, which allows easy storage of data in the data memory 715. In addition, various pieces of data, such as data stored in the data memory 715 or the status of the emergency light 701, may be modulated and then transmitted via the power line. This allows remote confirmation of rewritten data and remote determination of the operation of the emergency light 701. Note that in the case of not carrying out bi-directional communication, the modulator/demodulator 714 may be structured to function as a mere demodulator. In the case of data to be transmitted while in an emergency being pre-stored in the data memory 715, the modulator/demodulator 714 is unnecessary.

Data to be transmitted while in an emergency may be stored in the data memory 715. It is desirable that the power consumption of the data memory 715 is minimal. In addition, it is necessary to prevent stored data from being accidentally erased while changing over the power source. For example, rewritable ROM or nonvolatile RAM should be used.

Upon detection of an emergency, such as an event of the switch 712 having changed over from the external power source to the battery 711, the optical modulator 716 reads out data to be transmitted while in an emergency from the data memory 715, modulates it, and then superimposes the resulting modulated data on an electric power waveform that is supplied to the LED array 713. This allows control of blinking or light intensity of light emitted from the LED array 713 in accordance with data modulated by the optical modulator 716. This allows optical data communication. Needless to say, even while not in an emergency, data communication is possible by modulating data stored in the data memory 715 and providing the resulting modulated data to the LED array 713. In this case, data may differ from that to be transmitted while in an emergency.

The portable terminal 702, which includes the light receiving unit 721, the demodulator 722, and the display unit 723, may be, for example, a PDA with a camera or a cellular phone with a camera. The light receiving unit 721, which may be structured with a camera or a photodiode, receives and converts light emitted from the LED array 713 in the emergency light 701 to an electric signal.

The demodulator 722 extracts a modulated data signal from an electric signal transmitted from the light receiving unit 721, demodulates it, and then captures data. The captured data is available for various applications. In this working example, the captured data is displayed on the display unit 723. As a result, data optically transmitted from the emergency light 701 while in an emergency is displayed on the display unit 723. Text and picture data, such as a map regarding emergency exits or escape routes for evacuees on a floor, may be displayed on the display unit 723. Moreover, voice data may be transmitted, and if a speaker is embedded like a cellular phone, voice data can be easily captured.

An exemplary operation and an application of the emergency light and the wireless emergency light data communication system, according to the embodiment of the seventh aspect of the present invention, is described forthwith. Data to be transmitted to the data memory 715 while in an emergency should be pre-stored in the emergency light 701. According to a certain method, power line communication is used for transmitting modulated data, as described above, which is superimposed on an external power source waveform, to the emergency light 701, which then receives and demodulates modulated data transmitted from the external power source, thereby capturing data. Alternatively, data is pre-stored in external ROM, and the external ROM may be fixed, as the data memory 715, to the emergency light 701. For example, a memory card may be fixed thereto.

While in an emergency, the optical modulator 716 reads out data from the data memory 715, modulates it, and then superimposes the resulting modulated data on an electric power source waveform to be supplied to the LED array 713. When the electric power on which modulated data is superimposed is supplied to the LED array 713, the LED array 713 then emits light, and light intensity or blinking is controlled allowing optical data transmission.

Moreover, a possessor of the portable terminal 702 can receive data optically transmitted from the emergency light 701 by facing the possessed portable terminal 702 to the emergency light 701 while in an emergency. While in an emergency, people often get lost, and even while evacuating according to emergency lights, they may feel anxious about no information as to how long it takes to evacuate. However, according to the seventh aspect of the present invention, further detailed various pieces of visual data (or voice data), such as building names, a map of staircases and floors, escape routes for evacuees, and a remaining distance in meters from emergency exits, which the conventional emergency light cannot provide, can be obtained from the emergency light 701. This eases anxiety to a certain extent, allowing more rapid evacuation.

Typically, since the portable terminal 702 may often be driven by a battery, it may be effectively used while in an emergency. Accordingly, use of the emergency light, which emits light without an external power source while in an emergency, and the portable terminal 702, which does not need the external power source, together allows smooth escape guidance while in an emergency, in particular, even when the external power source is cut off.

Moreover, the emergency light 701, according to the seventh aspect of the present invention, needs electric power to be supplied to the optical modulator 716 or related units. However, necessary electric power for such electronic circuits to operate is much less than electric power for emitting light. Therefore, even when including such optical data communication capability, reinforcement of the battery 711 for the emergency light 701 is almost unnecessary. Moreover, there is no need to deploy an additional means for significantly suppressing power consumption and transmitting data, as compared to a structure for transmitting radio wave, voice and the like as well as light. For example, in the case of infrared rays, similar power consumption is unavoidable, and an additional transmitter must be provided. In view of reduction in power consumption and simplification of a device, optical data communication using an LED light source is advantageous.

Needless to say, the LED array 713 in the emergency light 701 emits light to display guidance to emergency exits and escape routes for evacuees as with the typical emergency light, and is effective for people who do not have the portable terminal 702 while in an emergency. Even when light intensity and/or blinking is controlled for data communication, such change in light intensity is unperceivable to the human eye. Therefore, the functionality as the emergency light will not be lost. In addition to this, utilization of the features of LEDs provides further enhanced functionality as an emergency light than that of the conventional emergency light.

Moreover, data communication by the emergency light 701 is not limited to an emergency. For example, data stored in the data memory 715 may always be optically transmitted. Alternatively, it is possible to transmit information of surrounding shops and news to the portable terminal 702 by pre-storing non-emergency data as well as emergency data in the data memory 715 and changing over between those pieces of data according to whether or not it is an emergency by the optical modulator 716. Once the emergency light 701 is switched on, it is never switched off and is always on day and night. Therefore, a user of the portable terminal 702 can always capture data from the emergency light 701. In addition, since the content of the data memory can be updated as needed through power line communication as described above, real time distribution of data to the portable terminal 702 while not in an emergency is possible.

The case of capturing data through power line communication and case of storing data in the data memory 715 in advance have been described above. However, the present invention is not limited to those cases, and various methods for transmitting data to the emergency light 701 are available.

Figure 57:
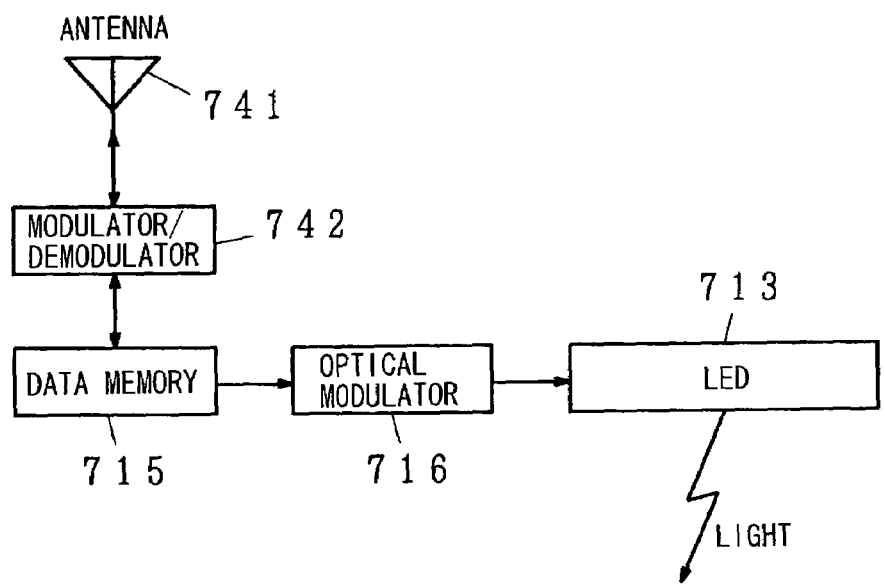
FIG. 57 is a block diagram of an emergency light and a wireless emergency light data communication system, according to an embodiment of the seventh aspect of the present invention.

FIG. 57 is a block diagram of an emergency light and a wireless emergency light data communication system, according to another embodiment of the seventh aspect of the present invention. In the drawing, 741 denotes an antenna, and 742 denotes a modulator/demodulator. In the example shown in FIG. 57, the emergency light 701 receives data transmitted from the outside via radio wave and then stores it in the data memory 715. Data received by the antenna 741 is demodulated by the modulator/demodulator 742, and the resulting demodulated data is then stored in the data memory 715. Such data reception should be carried out while not in an emergency. Since electric power can be supplied from the external power source while in an emergency, such radio wave data reception is possible. Needless to say, in the case of broadcasting data, mere demodulating capability is required to the modulator/demodulator 742.

Furthermore, other than radio waves as shown in FIG. 57, a communication line, such as an optical cable or a communication cable, except for a power line may be utilized to receive data in advance. Note that use of power line communication shown in FIG. 55 develops an advantage that data reception is possible without deploying an antenna or an additional cable.

In this manner, according to the seventh aspect of the present invention, use of LEDs as a light source allows suppression of battery consumption due to high electric power efficiency of LEDs, reduction in device size due to a reduced battery size, and an extended light emitting time. Moreover, since LEDs have a long operating life, maintenance intervals such as light source replacement intervals can be longer, allowing reduction in maintenance cost. Furthermore, since LEDs are highly crashproof, provision of an emergency light that will not be damaged and be available even when a devastating disaster occurs is possible.

In addition, since LEDs have excellent response characteristics, they may be used as an optical data transmission source by controlling blinking or light intensity thereof. The emergency light includes a battery, allowing continuous light emission even when the electric power supply is cut off due to a disaster. Various pieces of emergency data, such as positional data for emergency exits and emergency staircases, and data for escape routes for evacuees to the emergency exits, which have been pre-stored, can be transmitted using this emitted light. Since provision of such data transmission capability is not costly and does not consume much electric power as compared to the case of providing an additional radio wave or an additional infrared ray transmission system, the capability of emitting light as an emergency light while in an emergency is not lost.

Furthermore, once the emergency light is switched on, it is not switched off semi-permanently and is not influenced by weather and seasons. Therefore, it is generally provided in plain view. Moreover, transmission of not only emergency data, but also general data, such as surrounding advertisements or guidance, is possible. Accordingly, it is expected that the emergency light will be frequently used even while not in an emergency, allowing increase in added value of the emergency light.

(Eighth Aspect of the Present Invention)

Next, a third application, according to an eighth aspect of the present invention, is described. While the eighth aspect of the present invention is somewhat described as an exemplary application of the aforementioned aspects of the present invention, it shows a case of controlling illumination lamps provided on a road and carrying out communication using them.

The purpose of road lighting is to secure safe and comfortable traffic of vehicles and pedestrians and prevent crime by lighting the road. Typically, fluorescent lamps, halogen lamps, or sodium lamps are used for lighting the road. In addition, in recent years, use of semiconductor light emitting devices for lighting, such as light emitting diodes (LEDs) having further longer operating life, has been studied and they have been actually deployed. Those devices are adopted in view of electric power efficiency, brightness, visibility, and operating life and deployed at fixed intervals of several tens of meters on the road, such as an open road and an expressway, based on properties of respective lighting elements.

Typically, once such lighting elements are switched on, many of them are capable of continuously illuminating without frequent blinking. For example, it is switched on after dark, while it is switched off when it becomes light. Moreover, it can be used over an extended period of time day and night in a place such as a tunnel.

On the other hand, traffic lights have been developed regardless of road lighting. The purpose thereof is to control the traffic of vehicles and people on the road. There are various types of traffic lights, such as a type fixed at intersections or crossings or a transportable type for road construction. Different from road lighting, these traffic lights change color such as from red to blue or from blue to yellow, and/or blink. Therefore, incandescent bulbs have been conventionally used, while LEDs are also used recently. Features such as easily blinking, excellent electric power efficiency, and long operating life are required for a light source to be used as a traffic light. Incandescent bulbs as a light source have worse electric power efficiency than other light sources. However, they have been employed due to their blinking capability. Recently, they are being replaced with LEDs capable of blinking and having electric power efficiency and a longer operating life.

Fluorescent lamps, halogen lamps, or sodium lamps conventionally employed for road lighting and incandescent bulbs employed for traffic lights have been selected for use according to properties of respective light sources. Since these devices have been used in such a manner, no idea of using both road lighting and traffic lights has developed.

Numerous accidents on the road have been reported every year, and post-processing is important. This is for preventing further accidents and traffic jams. Traffic lights are deployed at intersections and crossings for traffic control in those provided areas as described above. However, even when an irregular event such as a traffic accident occurs on the road, the traffic lights cannot control traffic for that event. Therefore, conventionally, immediately after the traffic accident, trailing vehicle drivers must be cautious. Briefly after occurrence of the traffic accident is notified, a policeman will arrive at the traffic accident site, carrying out traffic control. However, since individuals must take care of their own safety, there is a high possibility of a recurring traffic accident, such as collision with a car involved in a traffic accident, or collision at the tail of a traffic jam due to a traffic accident.

When a traffic accident occurs, parties concerned generally use a smoke marker to inform and alert trailing vehicle drivers of the traffic accident. However, in reality, the smoke marker is not frequently used. In addition, since the smoke marker makes fire and smoke, it is dangerous near a combustible material, and smoke may block the drivers' view. Furthermore, since fire is made at a low position, it cannot be seen from distance. Moreover, remote control is impossible.

A reflector plate is often placed behind a car involved in a traffic accident instead of using the smoke marker. However, there is a problem that since the reflector plate may be often put near a car involved in the traffic accident at a low position, it cannot be seen from a distance, and occurrence of the traffic accident cannot be recognized until just before approaching the accident site. In addition, there is another problem that since the reflector plate is manually positioned, remote control is impossible.

Use of hazard indicators of vehicles is a simple method for informing and alerting trailing vehicle drivers of an occurrence of a traffic accident. However, the hazard indicators may not be available due to the vehicle damaged by the traffic accident. Moreover, since it is positioned within the range of the vehicle body, it can be recognized by several trailing and surrounding vehicle drivers, but is impossible to be recognized from a distance or behind a big car. In addition, since the hazard indicators are manually operated in respective vehicles, remote control is also impossible.

When a police officer arrives at the accident site, he/she carries out traffic control with hand signals or after positioning a simplified traffic light apparatus. However, since the simplified traffic light apparatus needs to be carried from a police station after a traffic accident has occurred, there is no adaptability for the accident. Moreover, such a simplified type cannot be remotely controlled.

Along expressways and main roads, data display panels for displaying traffic accident information and traffic jam information are deployed allowing users to visually receive data. Data to be displayed is often transmitted to the data display panels through remote control. However, since such data display panels should be deployed independently of the aforementioned illumination lamps and traffic lights, it is costly, and the number of the deployed panels is much less than that of the illumination lamps and traffic lights. This develops a problem that a chance of receiving data from data display panels is very low.

Illuminative light communication has not yet been considered for application to the traffic control system as described above. However, the eighth aspect of the present invention shows an application thereto.

Figure 58:
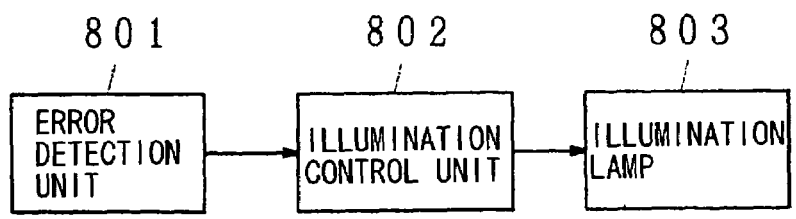
FIG. 58 is a block diagram of a road lighting control system, according to a first embodiment of an eighth aspect of the present invention.

FIG. 58 is a block diagram of a road lighting control system, according to a first embodiment of the eighth aspect of the present invention. In the drawing, 801 denotes an abnormality detection unit, 802 denotes an lighting control unit, and 803 denotes an illumination lamp. The abnormality detection unit 801 detects an abnormality on the road. For example, an emergency call box may be provided along an expressway, and when a user has used the emergency call box, such a user's action may be detected as an abnormality. At this time, an operator at a road monitoring center having answered that call may designate occurrence of an abnormality. Similarly, occurrence of an abnormality may be designated when a call is made to a police station. Alternatively, a road monitoring device may be structured to detect an abnormality.

Multiple illumination lamps 803 are defined as an illumination lamp group or divided into several illumination lamp groups. The lighting control unit 802 selects an illumination lamp group therefrom, which will be controlled in response to an abnormality detection result provided by the abnormality detection unit 801, and controls the selected illumination lamp group to operate. For example, blinking or light intensity of the illumination lamps 803 may be controlled. Moreover, if the illumination lamps 803 are capable of changing an emitted color of light, the emitted color of light may be controlled. Arbitrary illumination lamps 803 may constitute an illumination lamp group. For example, when a single illumination lamp 803 is defined to constitute an illumination lamp group, lighting is controlled for every illumination lamp 803. It is not always necessary to structure an illumination lamp group from contiguous illumination lamps 803. Alternatively, an illumination lamp group may be structured from even or odd illumination lamps 803. Needless to say, the number and the positions of the illumination lamps 803 in each illumination lamp group may be different from one another, and may be changed based on a position where an abnormality occurs or scale of the abnormality. Note that when all illumination lamps 803 are controlled in the same manner, in other words, when only a single illumination lamp group exists, selecting an illumination lamp group is unnecessary.

Multiple illumination lamps 803 are deployed along the road as with the typical illumination lamps, lighting the road when it is dark. In addition, they are structured such that blinking, light intensity, or colors of lights thereof can be controlled in conformity with an instruction from the lighting control unit 802. Different from the conventional mercury lamps, light sources having a response speed of several seconds or less to a request for a change in blinking or light intensity are used. For example, semiconductor light emitting devices such as LEDs or laser diodes (LDs) are desirable as a light source. For example, when using a structure of emitting white light, which is provided by mixing together three different color lights from LEDs, as a light source, emitted color of light can be easily changed.

Figure 59:
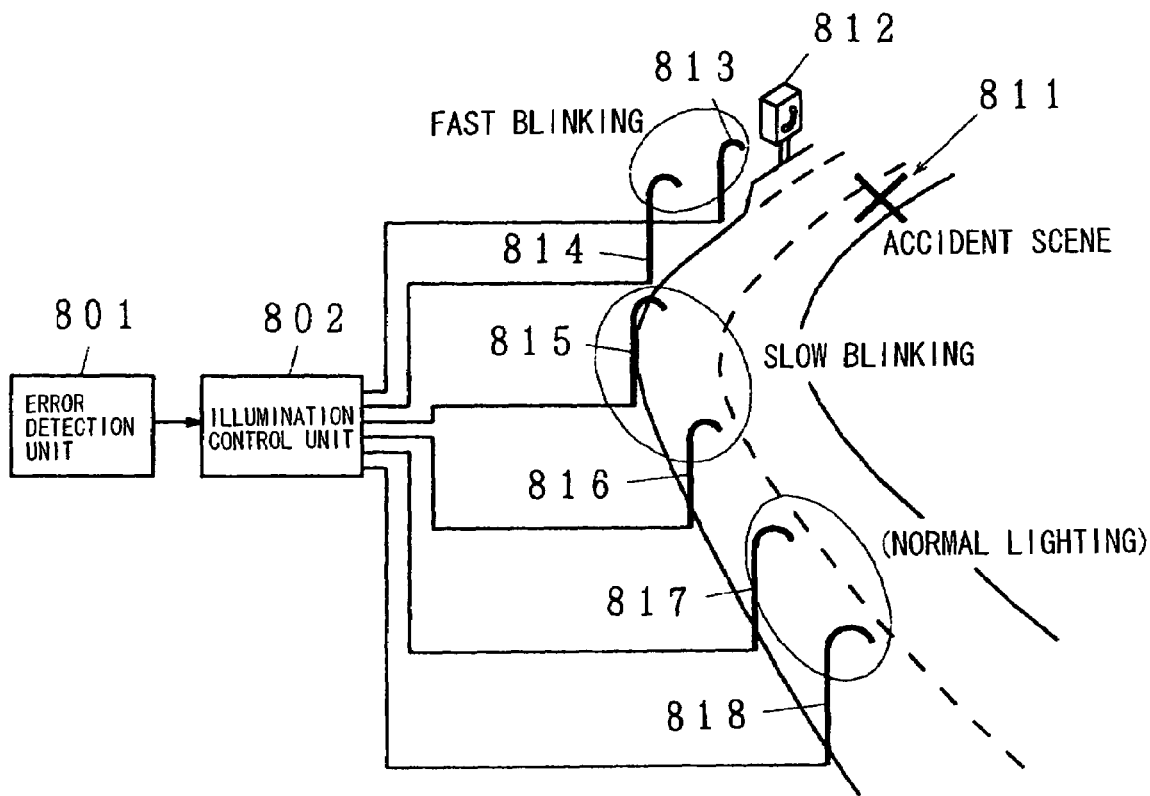
FIG. 59 is a diagram describing exemplary lighting by illumination lamps when an abnormality occurs.

FIG. 59 is a diagram describing exemplary lighting by illumination lamps when an abnormality occurs. 811 denotes a traffic accident site, 812 denotes an emergency call box, and 813 through 818 denote illumination lamps. FIG. 59 shows a case where a traffic accident has occurred along an expressway. The traffic accident site 811 is indicated by a symbol x. In this example, the road-side emergency call box 812 functions as the abnormality detection unit 801. When a concerned party in a traffic accident or a third party informs a road monitoring center of occurrence of the traffic accident from the emergency call box 812, information of the occurrence of the traffic accident is transmitted to the lighting control unit 802 from that emergency call box.

The lighting control unit 802 selects an illumination lamp group, which is to be controlled to operate, from the illumination lamps 813 through 818 (corresponding to the illumination lamp 803 in FIG. 58), which are positioned before the emergency call box 812 from which occurrence of a traffic accident is informed, and then controls the selected illumination lamp group to operate. For example, assuming that two illumination lamps are defined to constitute an illumination lamp group, an illumination lamp group that is made up of the illumination lamps 813 and 814 and positioned closest to the accident site 811 and an illumination lamp group that is made up of the illumination lamps 815 and 816 and positioned second closest to the accident site 811 are selected as illumination lamp groups to be controlled to operate. Lighting control of those illumination lamp groups is then carried out.

For example, the illumination lamps 813 and 814 that are positioned closest to the accident site 811 may be controlled to blink fast, notifying drivers that a traffic accident site 811 is near. The illumination lamps 815 and 816 may be controlled to blink slow, notifying drivers that there is a traffic accident site 811 up the street. Alternatively, in the case where the colors of lights of respective illumination lamps are controllable, the illumination lamps 813 and 814 that are positioned closest to the accident site 811 may be controlled to change the color of light to red, notifying drivers that a traffic accident site 811 is near. On the other hand, the illumination lamps 815 and 816 may be controlled to change the color of light to yellow, alerting drivers.

Such lighting control of illumination lamps allows alerting vehicle drivers who are approaching the accident site, in other words, those illumination lamps can function as a kind of traffic light. More specifically, since illumination lamps are deployed on the road at a high position, they can be recognized from a distance. Such lighting control is possible immediately after occurrence of a traffic accident, thereby alerting drivers and preventing a secondary traffic accident without waiting for arrival of a police officer. Moreover, illumination lamps are deployed in intervals of several tens of meters, thereby notifying road users, such as drivers, of detailed information of occurrence of an abnormality. Since illumination lamps are generally deployed on the road, it is unnecessary to deploy an additional displaying means for notifying drivers of occurrence of a traffic accident, allowing effective use of an existing infrastructure.

Note that lighting control is not limited to the aforementioned examples. For example, the number and the positions of illumination lamps constituting an illumination lamp group can be arbitrarily decided, and various lighting methods, such as changing of light intensity in addition to changing of blinking, or changing of color of light along with changing of blinking and/or light intensity, may be combined for use. It is particularly dangerous if sufficient light intensity cannot be maintained due to illumination lamps being switched off at night. In such a case, the light intensity along the road should be secured by controlling illumination lamps to alternately emit light or alternately blink.

While it has been described in the aforementioned example that illumination lamps are controllable through operating the emergency call box 812, they may be controlled to operate in conformity with an instruction from the road monitoring center after notifying the road monitoring center from the emergency call box 812. In addition to the emergency call box 812, an operator may recognize or determine occurrence of a traffic accident via a monitor camera. These cases are also processed in the same manner as described above. Furthermore, it is possible to determine the scale of a traffic accident based on information from a communicator or information from a monitoring camera, and then instruct to carry out lighting control for alerting drivers in the case of a minor traffic accident or a disabled car left behind.

Moreover, other than the aforementioned traffic accident, traffic accidents may frequently occur near the very end of the traffic jam. Accordingly, alerting drivers through controlling illumination lamps near that site is possible. Similarly, instead of deploying additional alerting lamps in construction zones, lighting control of illumination lamps so as to alert drivers is possible. Alternatively, using those alerting lamps together with illumination lamps and then controlling illumination lamps to operate, so as to alert drivers, is also possible.

Furthermore, lighting control of illumination lamps to operate, so as to guide an emergency vehicle, is possible when a crime, case of an emergency patient, or a disaster such as a fire occurs. In this case, in addition to controlling illumination lamps to operate near a site where such an accident occurs as with a traffic accident, controlling illumination lamps, which are deployed in front of a running emergency vehicle, to operate so as to notify public vehicles of the fact that the emergency vehicle is approaching is possible. For example, an illumination lamp group to be controlled to operate in conformity with radio waves from the emergency vehicle or guidance from the road monitoring center may be selected and then controlled to operate.

Figure 60:
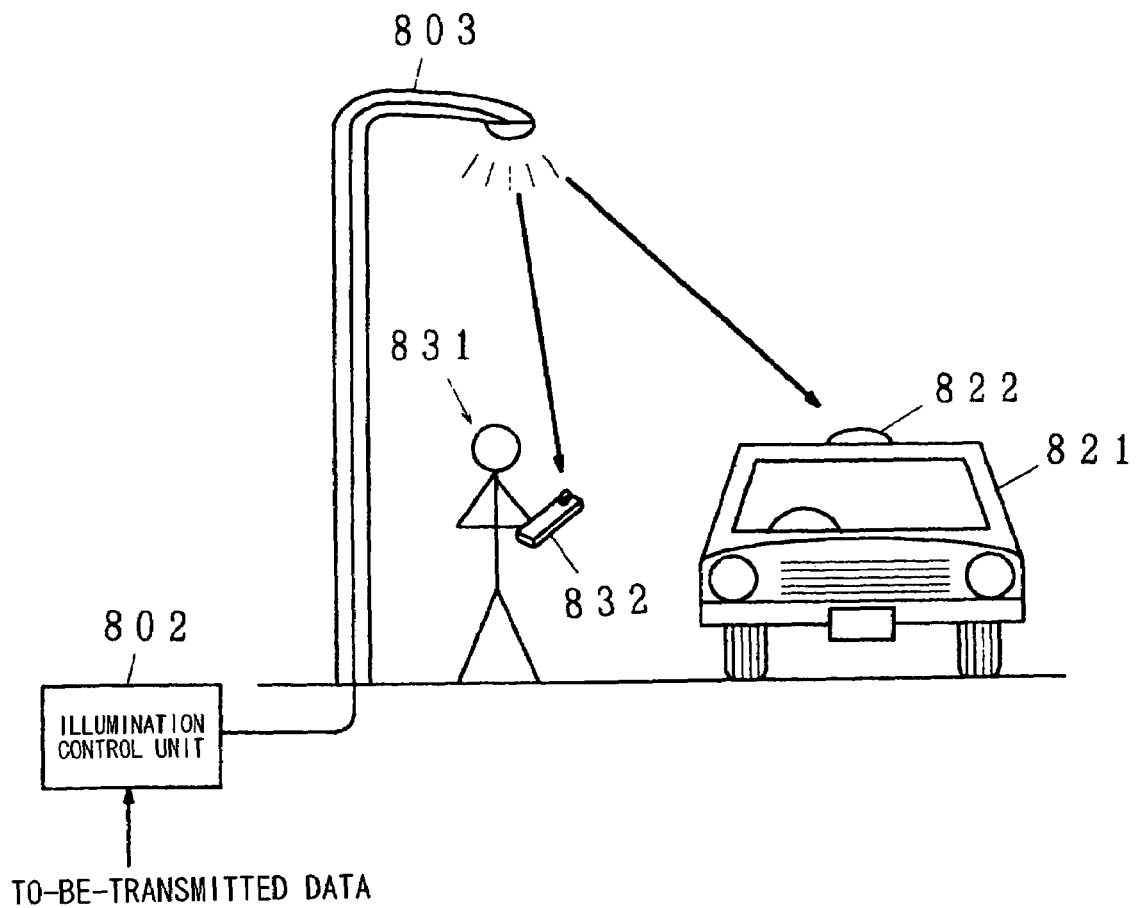
FIG. 60 is a schematic lock diagram of a road lighting control system, according to a second embodiment of the eighth aspect of the present invention.

FIG. 60 is a schematic block diagram of a road lighting control system, according to a second embodiment of the eighth aspect of the present invention. In the drawing, the same symbols are given to the same parts as those in FIG. 58, and repetitive descriptions thereof are thus omitted. 821 denotes a vehicle, 822 denotes a light receiving unit, 831 denotes a pedestrian, and 832 denotes a portable terminal. As with the aforementioned first embodiment, data for alerting drivers may be transmitted through control of the illumination lamp 803 to operate. By carrying out such a control at a high speed, illuminative light emitted from the illumination lamp 803 can be utilized for data communication. Since illuminative light has extremely large electric power, illuminative light data transmission allows reliable communication.

Use of semiconductor light emitting devices, such as LEDs or LDs, as a light emitting means in the illuminative lamp 803 allows control of blinking and/or light intensity at a high speed. When controlling blinking or light intensity at a certain speed or greater, changes in blinking and light intensity are imperceptible to the human eye. As a result, it seems as if the illumination lamp 803 continuously emits light, and thus the illumination lamp can sufficiently light the road. Note that use of light allows communication in a frequency range from a perceptible frequency to the human eye (several Hz or less) to several hundred MHz or greater.

In the second embodiment, data to be transmitted is provided to the lighting control unit 802. The lighting control unit 802 controls the illumination lamp 803 to blink, and change light intensity or color in accordance with the data to be transmitted, emitting illuminative light, which has been modulated in accordance with the data to be transmitted.

On the other hand, the light receiving unit 822 is provided in the vehicle 821 moving down the road, receives light emitted from the illumination lamp 803 and converts it to an electric signal, and then demodulates the electric signal, thereby reconstructing data transmitted from the illumination lamp 803. In general, the illumination lamp 803 is deployed such that the road does not become dark. Therefore, by transmitting the same data via illuminative light from multiple illumination lamps 803, even moving vehicle 821 can receive the data via the illuminative light from the different illumination lamps 803. For example, traffic information and program information such as news and music may be distributed.

Moreover, when the pedestrian 831 carries the portable terminal 832, which includes a light receiving unit such as a camera, data transmitted from the illumination lamp can be captured by receiving illuminative light from the illumination lamp 803 by the portable terminal 832. In the case of transmitting data for the pedestrian 831, an area lit by a single illumination lamp 803 is not so large. Therefore, communication to every relatively narrow area is possible by changing data to be transmitted for every illumination lamp group made up of one or more illumination lamps 803. Even while the pedestrian 831 is moving, since it takes time to move from a certain illumination lamp 803 to the next illumination lamp 803, communication can be normally carried out without interruption unless a very large amount of data is transmitted. For example, positional data for the illumination lamps 803, a surrounding map, information of neighboring stores and public offices or the like may be distributed. Needless to say, arbitrary data can be transmitted from the illumination lamp 803, and the present invention is not limited to those examples.

Note that provision of a light receiving unit in the illumination lamp 803 allows bi-directional optical communication as disclosed in Japanese Patent Application Laid-Open No. 2003-4560. By allowing bi-directional communication, the Internet may be accessed from the moving vehicle 821. Moreover, since reception of response from the vehicle 821 is possible, cooperation with a traffic control system or a traffic monitoring system is also possible.

In addition, carrying out at the same time, lighting control for alerting drivers as described in the first embodiment and lighting control for optically transmitting data as described in the second embodiment is possible, allowing further effective use of the illumination lamps 803.

Typically, light illuminated from the illumination lamp 803 decreases in light intensity as the light is being apart from the illumination lamp 803. In the case of ordinary road lighting, a certain degree of decrease in light intensity is tolerable as long as it does not adversely influence pedestrians and running vehicles. However, in the case of illuminative light communication as described in the aforementioned second embodiment, there is fear that decrease in light intensity may cause degradation in communication quality. Accordingly, a structure of preventing decrease in light intensity even in an area apart from the illumination lamp 803 is desired.

Figure 61:
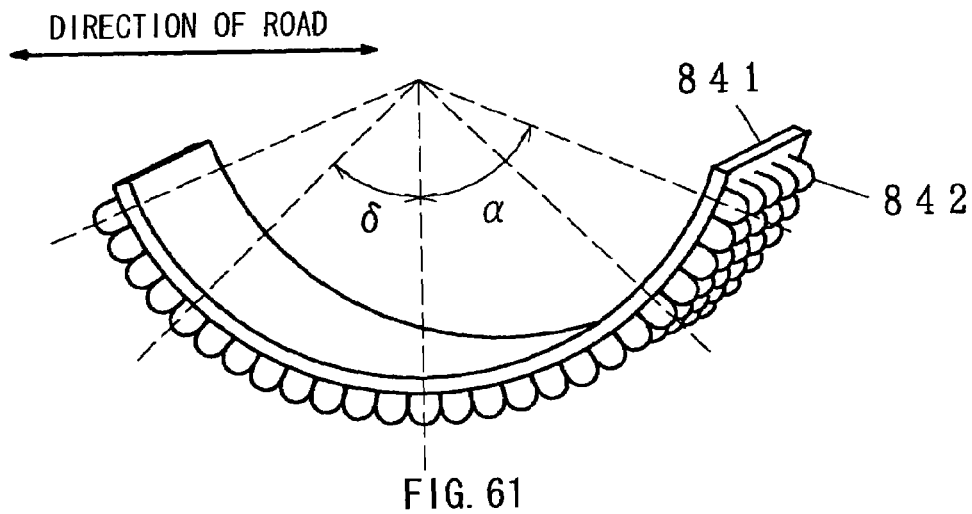
FIG. 61 is a schematic cross-sectional view of an exemplary shape of a substrate of a light emitting unit in an illumination lamp.

FIG. 61 is a schematic cross-sectional view of an exemplary shape of a substrate of a light emitting unit in the illumination lamp. In the drawing, 841 denotes a substrate, and 842 denotes semiconductor light emitting devices. Typically, numerous semiconductor light emitting devices 842 are used for lighting. In this exemplary structure, it is assumed that numerous semiconductor light emitting devices 842 are attached to the substrate 841 and embedded in the illumination lamp 803. In this case, assuming that the base 841 is a flat surface, almost lights emitted from the semiconductor light emitting devices 842 travel in a direction orthogonal to the substrate 841. Accordingly, an area under the illumination lamp 803 is luminous while the light intensity decreases in an area apart from the illumination lamp 803.

To solve this problem, according to the eighth aspect of the present invention, the substrate 841 is bent as shown in FIG. 61. More specifically, it should be bent extending along the road or the like. When the substrate 841 is bent as described above, the semiconductor light emitting devices 842 attached thereto face in different radial directions. Therefore, lights from the semiconductor light emitting devices 842 directly hit not only under the illumination lamp 803, but also in surrounding area thereof, preventing decrease in light intensity in an area apart from the illumination lamp 803.

Furthermore, in an area apart from the illumination lamp 803, the distance from the semiconductor light emitting devices 842 or the light sources to the road surface is long, resulting in decrease in light intensity. In order to prevent such decrease in light intensity due to distance, a structure should be provided such that the closer to the end of the substrate, the lower the directivity. This structure prevents diffusion of light emitted from the semiconductor light emitting devices 842, thereby transmitting light as far away as possible. In short, the directivity of light emitted from the semiconductor light emitting devices 842, which are arranged on part of the substrate 841 with an angle from directly below the illumination lamp 803 exceeding ±δ degrees, should be narrowed. Needless to say, a structure is possible such that the directivity gradually decreases as the angle from directly below the illumination lamp 803 increases.

With such a structure, light having low directivity is transmitted even to an area apart from the illumination lamp 803, thereby preventing decrease in light intensity. This allows high quality communication at a distant place from the illumination lamp 803 via light from the illumination lamp 803.

Note that the directivity may be controlled by changing a package for each semiconductor light emitting device 842, or introducing a lens system in a clear cover of the street lamp 3.

In this manner, according to the eighth aspect of the present invention, use of multiple illumination means provided along the road for applications other than lighting, such as control of blinking or light intensity or control of color of light of illumination lamps, allows alerting passers-by and drivers at a site of a traffic accident or traffic jam, or in a construction zone as soon as possible, and prevention of a traffic accident and provision of smooth traffic. In addition, control of blinking or light intensity or control of color of light of illumination lamps allows data transmission, thereby delivering various pieces of data to road users.

Furthermore, when numerous semiconductor light emitting devices are used as light sources of illumination lamps, by bending the substrate to which the semiconductor light emitting devices are attached, decrease in light intensity is prevented even in a distant area from the illumination lamps, and high quality communication is possible.

(Ninth Aspect of the Present Invention)

Next, a fourth application according to a ninth aspect of the present invention is described. According to the ninth aspect of the present invention, an exemplary case of optical communication between a mobile unit such as a train and a site on the ground is described.

Conventionally, radio wave communication has been available for communication between a mobile unit such as a train and a site on the ground. According to a typical method used for cellular phones, a base station is established to communicate with a mobile station. However, since radio waves are interrupted within a tunnel, communication therewithin is impossible. More specifically, a problem such as interruption of a call or disconnection of a data communication session may develop. Moreover, since radio waves attenuate depending on the distance from the base station, transmission speed is limited. Furthermore, communication quality is not very good due to adverse influences of phasing.

In the case of the Shinkansen (bullet train), a leaky coaxial cable (LCX) is deployed along or beside the rail track for public telephone communication. The leaky coaxial cable utilizes characteristics of radiation of electromagnetic waves developing while a high frequency current flows through the cable. Since the leaky coaxial cable is deployed very near to a running train, such as the Shinkansen, the amount of attenuation due to distance does not change much that high quality communication is possible. Moreover, communication even in a tunnel is possible as long as the leaky coaxial cable is deployed. However, there is a disadvantage in that communication in a tunnel is considerably influenced by multi-path phasing, which develops reflection of radio waves by inner walls of the tunnel, significantly deteriorating the communication reliability. In addition, since a transmission rate required for communication is approximately 2.6 Mbps, a further improved transmission rate has been in demand.

In recent years, as network technology advances, establishment of a 'ubiquitous network' so to speak, which allows communication at any place and time, has been proposed. Since the communication rate and communication quality of the aforementioned conventional communication means are insufficient for such a ubiquitous network, a further high speed and further high quality communication technology has been in demand.

On the other hand, an optical fiber is used for high speed and large volume communication between ground stations. Optical fiber technology is for suppressing transmission loss developed along ordinary optical fibers and has a focus on achievement of high optical transmission efficiency that allows optical fibers to reliably transmit received light to the light receiving side. Therefore, an optical fiber for communication is structured to suppress optical leakage as much as possible.

A leaky optical fiber that is different from the ordinary optical fibers for communication and allows optical leakage from the surface has been developed as disclosed in Japanese Patent Application Laid-Open No. 2001-133652, and a variety of related methods are under development. A case of using such a leaky optical fiber for guidance, decoration, or light guidance and also for communication has been disclosed in Japanese Patent Application Laid-Open No.2001-133652. However, how to use the leaky optical fiber for communication is never described therein. As described above, optical fibers are generally used between ground stations. However, if the leaky optical fiber is used in this manner, optical leakage causes transmission loss, resulting in degradation of communication quality. Therefore, the leaky optical fiber has never been available for conventional communication between ground stations, and there are no cases where the leaky optical fiber is actually used for communication.

Figure 62:
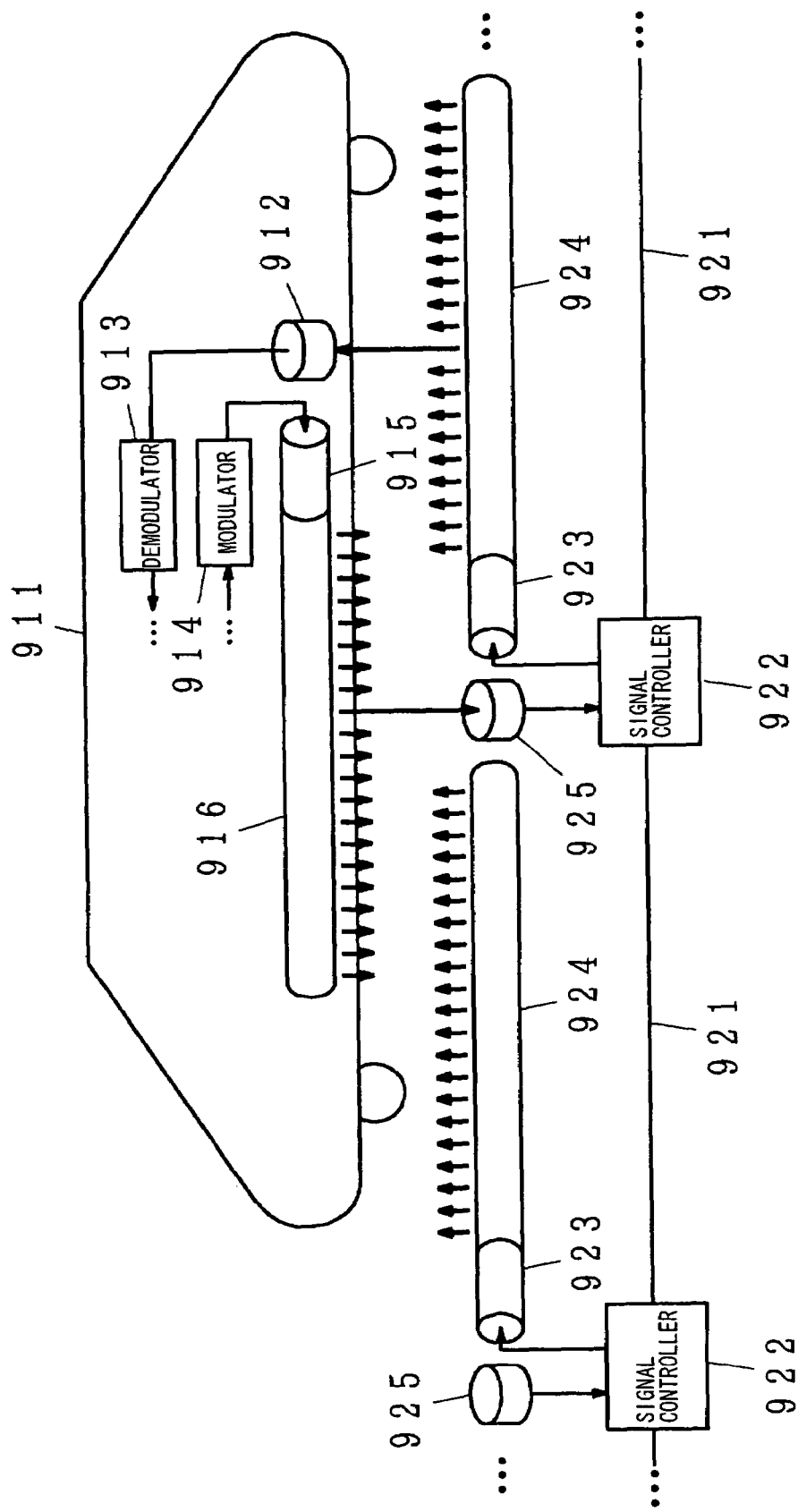
FIG. 62 is a schematic block diagram of an embodiment, according to a ninth aspect of the present invention.

FIG. 62 is a schematic block diagram of an embodiment according to a ninth aspect of the present invention. In the drawing, 911 denotes a mobile unit, 912 denotes a light receiving unit, 913 denotes a demodulator, 914 denotes a modulator, 915 denotes a light emitting unit, 916 denotes a leaky optical fiber, 921 denotes networks, 922 denotes signal controllers, 923 denotes light emitting units, 924 denotes leaky optical fibers, and 925 denotes light receiving units. The mobile unit 911 is movable along a specific route and may be a train or a transporter, for example. However, the ninth aspect of the present invention is not limited to them. It is assumed herein that the mobile unit 911 is a train as an example.

Appropriately long leaky optical fibers 924 are deployed along a route along which the mobile unit 911 moves. For example, they may be deployed between tracks or rails, beside rails, or on sidewalls such as soundproof walls. Alternatively, they may be deployed together with wires for trains.

The leaky optical fibers 924 may be those disclosed in the aforementioned Japanese Patent Application Laid-Open No. 2001-133652. Alternatively, they may be other types of optical fibers having optical leakage characteristics. The length of a single leaky optical fiber 924 should be several tens of meters or greater when the mobile unit 911 is a train. A per-unit length should be determined considering attenuation due to optical leakage. Note that the leaky optical fibers 924 may be deployed in a line, or may be deployed in an unbroken line so as to overlap part of light emitting zones.

The light emitting units 923 for transmitting optical signals to the leaky optical fibers 924 are deployed at one end of the respective leaky optical fibers 924, which are controlled by the signal controllers 922. Laser diodes (LDs) or light emitting diodes (LEDs) may be used as the light emitting units 923. In particular, since LDs have high directivity, they are preferred. In any case, since the light emitting devices have a high-speed response characteristic, high-speed control of turning on and off or high-speed control of light intensity thereof by the signal controllers 922 allows modulation and emission of light to the leaky optical fibers 924.

The signal controllers 922 control the light emitting units 923 to turn on and off in accordance with data to be transmitted from the network 921 to the mobile unit 911, and control the light emitting units 923 to transmit optical signals to the leaky optical fibers 924. In addition, the light receiving units 925 receive and demodulate light, and transmit the resulting data to the network 921. Note that in the case of transmitting data to the mobile unit 911, the mobile unit 911 may be controlled to operate when it falls within the leakage light illumination range by the leaky optical fibers 924. Moreover, the leaky optical fibers 924 may be switched in accordance with movement of the mobile unit 911 by communicating between the signal controllers 922 or by another control means.

Note that the network 921 may be structured from an arbitrary communication route, such as a wired communication cable. Needless to say, it may be connected to a backbone network such as the Internet via the communication cable.

The light receiving units 925, which are deployed to almost face the leaky optical fiber 916 deployed in the mobile unit 911, receive and convert light leaked out of the leaky optical fiber 916 to an electric signal, and transmit the resulting signal to the signal controllers 922. Light receiving devices such as photo diodes (PDs) may be used as the light receiving units 925.

On the other hand, the light receiving unit 912 and the demodulator 911 are deployed in the mobile unit 911 for receiving data, and the modulator 914, the light emitting unit 915, and the leaky optical fiber 916 are deployed for transmitting data. The light receiving unit 912, which is deployed to almost face the leaky optical fibers 924 deployed along a movement route, receives and converts light leaked out of the leaky optical fibers 924 to an electric signal. Light receiving devices such as PDs may be used as the light receiving unit 912 as with the aforementioned light receiving units 925.

The demodulator 913 demodulates electric signals, which have been received and then converted by the light receiving units 925, thereby reconstructing transmitted data. The demodulated data is transmitted to a computer in the mobile unit 911 or to the networks.

Data to be transmitted from the mobile unit 911 is transmitted to the modulator 914, which then controls the light emitting unit 915 to turn on and off, or change light intensity in accordance with data to be transmitted. The light emitting unit 915 may be structured with LDs or LEDs as with the aforementioned light emitting units 923, and transmits optical signals to the leaky optical fiber 916 under control by the modulator 914.

The leaky optical fiber 916 is similar to the aforementioned leaky optical fibers 924 and deployed in the direction in which the mobile unit 911 moves. Optical signals transmitted from the light emitting unit 915 leak out of the surface of the leaky optical fiber 916.

Figure 63:
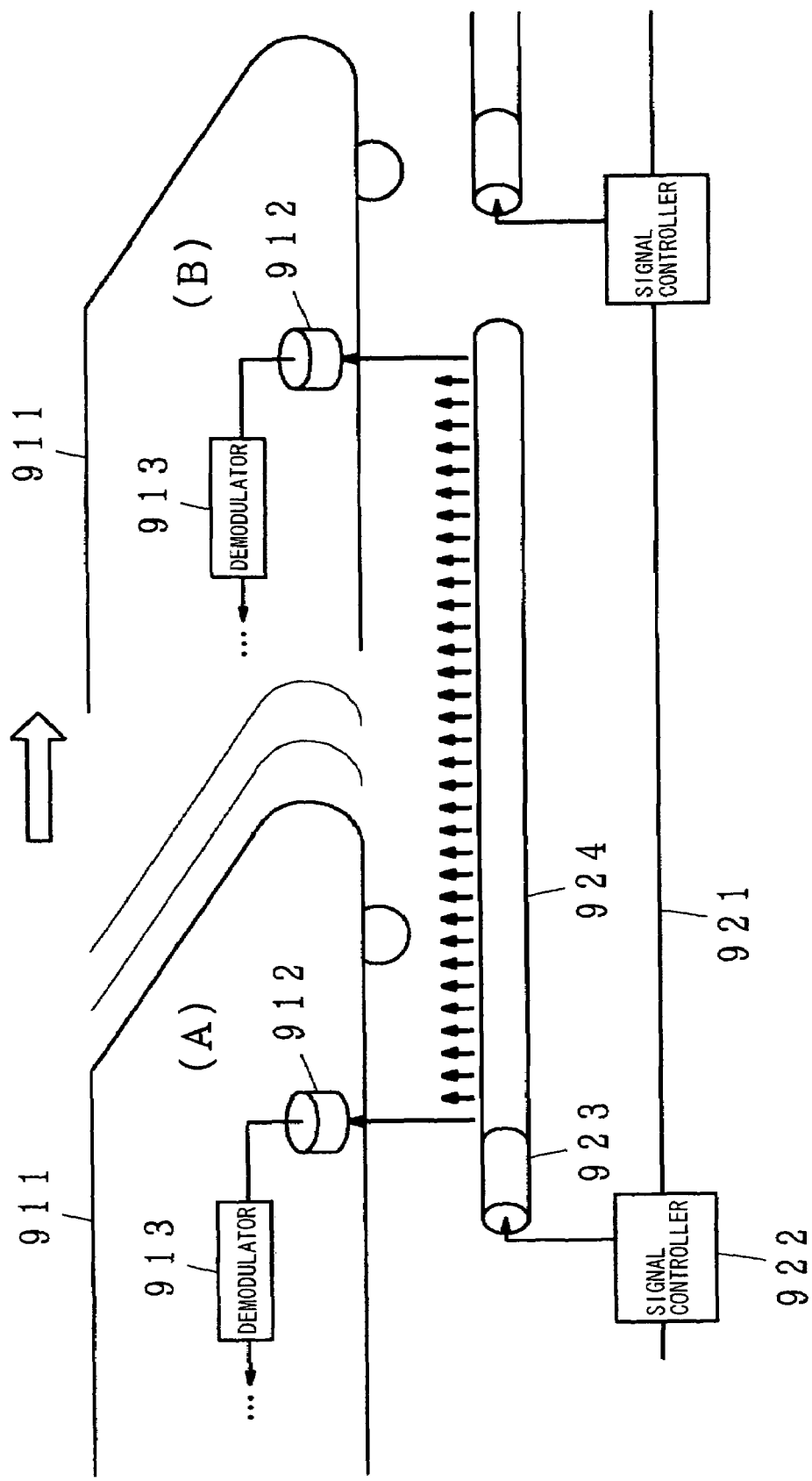
FIG. 63 is a diagram describing an exemplary operation of the embodiment according to the ninth aspect of the present invention through which data is transmitted to a mobile unit 11 (downlink)

FIG. 63 is a diagram describing an exemplary operation of an embodiment according to the ninth aspect of the present invention through which data is transmitted to the mobile unit 911 (downlink). When the mobile unit 911 reaches one of the leaky optical fibers 924, the corresponding signal controller 922 controls corresponding light emitting unit 923 to transmit modulated optical signals to that leaky optical fiber 924 in accordance with data to be transmitted to the mobile unit 911, which has been received from the networks 921 in advance.

The optical signals emitted from the light emitting unit 923 pass through the leaky optical fiber 924. However, part of those optical signals leak out from the surface of the leaky optical fiber 924. As shown in FIG. 63(A), when the light receiving unit 912 of the mobile unit 911 reaches the leaky optical fiber 924, the light receiving unit 912 receives optical signals leaked out of the leaky optical fiber 924 and converts them to electric signals. The demodulator 913 then demodulates optical signals, which have been converted to electric signals, by the light receiving unit 912, thereby reconstructing data.

For example, when the leaky optical fiber 924 is deployed along the tracks or rails, the light receiving unit 912 is deployed under the floor of the mobile unit 911. Typically, since peripheral light such as sunlight and street light illuminates on the tracks, optical signals leaked out of the leaky optical fiber 924 are easily influenced by such disturbance lights. On the other hand, when the mobile unit 911 such as a train exists, the mobile unit 911 will cover the tracks. Therefore, the leaky optical fiber 924 and the light receiving unit 912 in the mobile unit 911 are hidden behind the mobile unit 911, generating a very dark region. This allows remarkable decrease in influences of disturbance lights such as sunlight or street light, thereby providing high quality communication and an increased communication rate. Needless to say, even when the leaky optical fiber 924 is deployed along something other than rail tracks, optical signals can be detected by taking countermeasures against ordinary disturbances, such as receiving optical signals along with peripheral light by the light receiving unit 912 and then detecting the difference from the peripheral light through subsequent signal processing. Moreover, if the mobile unit 911 is a train, electromagnetic noise may frequently develop due to sparks. However, optical signals allow communication without being influenced by such electromagnetic noise. Furthermore, optical signals are not influenced by phasing even in a tunnel, allowing extremely high quality and high speed communication compared to the conventional radio wave communication.

The mobile unit 911 continues to move along the rail tracks. For example, it is assumed that the mobile unit moves from point (A) to point (B) in FIG. 63. At this time, as the mobile unit 911 moves, the light receiving unit 912 moves too. However, the distance from the leaky optical fiber 924, which extends in a direction in which the mobile unit 911 moves, does not change much. Moreover, since the leaky optical fiber 924 almost uniformly leaks incident light, the intensity of optical signals received by the light receiving unit 912 in the mobile unit 911 does not change much even while the mobile unit 911 is moving. This allows high quality and high speed communication even while the mobile unit 911 is moving.

The mobile unit 911 moves further and passes an end of one of the leaky optical fibers 924. In this case, by receiving light leaked out of the next leaky optical fiber 924, continuous data reception is possible. In this case, communication is never interrupted as long as the light leaked ranges of the adjacent leaky optical fibers 924 are overlapped, for example.

In this manner, data can be transmitted to the mobile unit 911 (downlink). Note that when multiple leaky optical fibers 924 are deployed as shown in FIG. 62, a target light emitting unit 923 to be controlled may be arbitrarily determined. For example, in the case of a train, driving control of the light emitting unit 923 should be started after it is detected that the train is near, in conjunction with or in the same manner as a control system deployed at a crossing, for example. Moreover, in the case of bi-directional communication with the mobile unit 911, driving control of the light emitting unit 923 may be started after it is detected that the light receiving unit 925 positioned one or more units before the moving mobile unit 911 is receiving optical signals from the mobile unit 911 shown in FIG. 62. Needless to say, the light emitting unit 923 may always be controlled in accordance with data.

Figure 64:
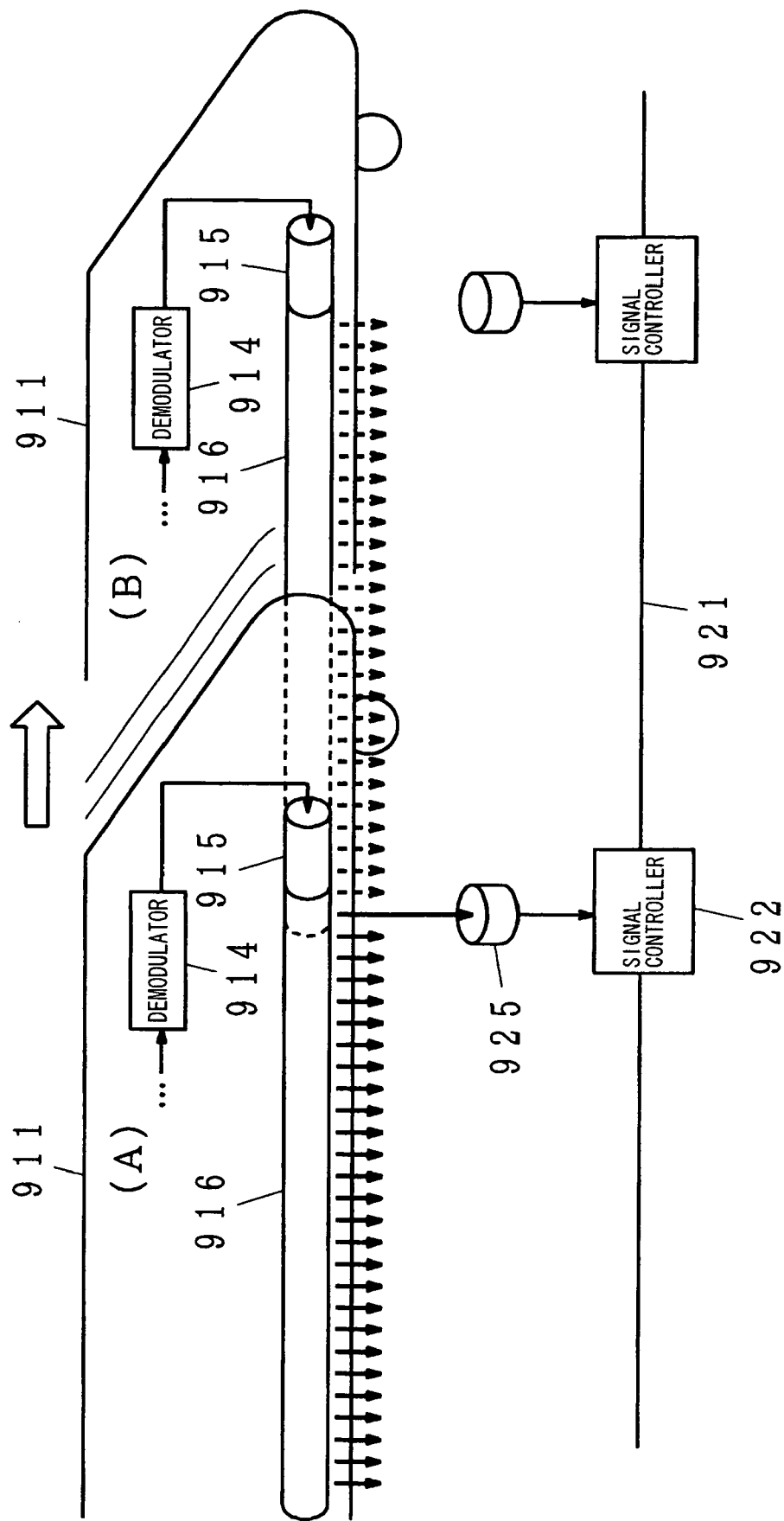
FIG. 64 is a diagram describing an exemplary operation of the embodiment according to the ninth aspect of the present invention through which data is transmitted from the mobile unit 11 (uplink).

FIG. 64 is a diagram describing an exemplary operation of the embodiment according to the ninth aspect of the present invention through which data is transmitted from the mobile unit 911 (uplink). In the case of an uplink or transmitting data from the mobile unit 911, communication is possible in the same manner as the aforementioned downlink. In the mobile unit 911, the modulator 914 modulates data to be transmitted. Driving control of the light emitting unit 915 is then carried out in accordance with the modulated data, and optical signals are output to the leaky optical fiber 916. The optical signals output from the light emitting unit 915 pass through the leaky optical fiber 916. However, part of those optical signals leak out from the surface of the leaky optical fiber 916.

As shown in FIG. 64(A), when a region of the leaky optical fiber 916 in the mobile unit 911 from which light leaks out reaches an external light receiving unit 925, the light receiving unit 925 then receives optical signals leaked out of the leaky optical fiber 916 and converts them to electric signals. The signal controller 922 then demodulates the optical signals, which have been converted to electric signals, thereby reconstructing data.

In the case of transmitting data from the mobile unit 911 (uplink), as with the aforementioned downlink, for example, when the leaky optical fiber 924 is deployed along the tracks or rails, communication can be carried out at a place hidden behind the mobile unit 911 itself, allowing reduction in influences of disturbance light. In addition, since there is less influence of electromagnetic noise and phasing, high quality and high speed communication is possible.

The mobile unit 911 continues to move along the tracks. For example, it is assumed that it moves from point (A) to point (B) in FIG. 64. In this case, contrary to the case of the aforementioned downlink, the leaky optical fiber 916 moves as the mobile unit 911 moves. However, the distance between the leaky optical fiber 916 in the mobile unit 911 and the external light receiving unit 925 does not change much. Moreover, since the leaky optical fiber 916 almost uniformly leaks incident light, the intensity of optical signals received by the external light receiving unit 925 does not change much even when the position of the leaky optical fiber 916 facing the light receiving unit 925 changes due to movement of the mobile unit 916. This allows high quality and high speed communication even while the mobile unit 911 is moving.

In this manner, data can be transmitted from the mobile unit 911 (uplink). Note that when the mobile unit 911 moves further, optical signals leaked out of the leaky optical fiber 916 in the mobile unit 911 should be received by the next one of the light receiving units 925 deployed at certain intervals. The light receiving unit 925 should be deployed at intervals equal to or shorter than the length of the leaky optical fiber 916 in the mobile unit 911.

Combination of downlink and uplink communications allows bi-directional communication with the mobile unit 911. Other than business applications such as traffic control for trains, users in the mobile unit 911 may access the networks 921 such as the Internet via a terminal device. Needless to say, a structure for unidirectional communication is possible. For example, a broadcast system, which establishes only a downlink or transmits data to the mobile unit 911, may be constructed to broadcast animation data to respective mobile units 911.

As described above, according to the ninth aspect of the present invention, the structures of the mobile unit 911 and the ground side are almost the same. In other words, the transmission side should be structured from a leaky optical fiber, a light emitting unit, and a unit that controls the light emitting unit while the reception side should be structured from a light receiving unit and a demodulator. Because of the same structure, communication rates for transmitting data to the mobile unit 911 and for transmitting data from the mobile unit 911 can be almost the same. The communication rate for both uplink and downlink can be 1 Gbps or greater, which is achieved by improving the leaky optical fiber. For example, when passengers in the mobile unit 911 access the external networks 921 as described above, a sufficient communication rate can be ensured even though 100 passengers start communication in 10 Mbps at the same time.

As described above, according to the ninth aspect of the present invention, since light is used as a wireless communication medium, adverse influences of phasing and electromagnetic noise may be suppressed due to the characteristics of light, thereby providing high quality and high speed mobile communication. In addition, since the structures for transmitting data to a mobile unit (downlink) and for transmitting data from a mobile unit (uplink) can be almost the same, bi-directional communication at the same communication rate is possible. Furthermore, in the case of communication under the floor of a train and along the rails, since communication in a dark place behind the train is possible, adverse influences of disturbance light reduce, thereby providing high quality communication. According to the ninth aspect of the present invention, various effects, which cannot be obtained through the conventional radio wave mobile communication, can be provided.

The first through the ninth aspect of the present invention have been described above. Needless to say, the present invention is not limited to those descriptions, and various modifications are possible.

What is claimed is:

1. A broadcast system, comprising:
   a semiconductor light-emitting source for lighting;
   a power line that supplies electric power to the semiconductor light-emitting source;
   a data modulator that modulates and multiplexes a plurality of pieces of data, superimposes the resulting plurality of pieces of data on an electric power waveform into a plurality of modulated pieces of data, and transmits the plurality of modulated pieces of data via the power line; and
   a selector that selects one or more pieces of data to be transmitted in the form of light out of the plurality of modulated pieces of data on the power line; and
   a superimposing means for superimposing a signal of the selected data onto a voltage to be applied to the semiconductor light-emitting source,
   wherein the data selected by the selector is transmitted based on changes in light intensity or blinking of the semiconductor light-emitting source.

2. The broadcast system according to claim 1, wherein the selector selects data to be transmitted based on changes in light intensity or blinking of the semiconductor light-emitting source in conformity with instruction data on the power line.

3. The broadcast system according to claim 1, wherein the data modulator frequency division multiplexes a plurality of pieces of data, and the selector selects one of a plurality of band pass filters with different frequency bandwidths and separates data.

4. The broadcast system according to claim 1, wherein:
   the data modulator time division multiplexes said plurality of pieces of data, adds tag data to the resulting divided data, and transmits the resulting data; and
   the selector identifies data based on the tag data, and selects data.

5. An electric bulb, which is adapted to be used in a broadcast system according to claim 1, and receives supplied electric power and emits light for lighting, comprising:
   a semiconductor light-emitting source for lighting;
   a selector that selects one or more of a plurality of pieces of modulated data to be transmitted in the form of light, which are superimposed on supplied electric power; and
   a superimposing means for superimposing a signal of the selected data onto a voltage to be applied to the semiconductor light-emitting source,
   wherein the data selected by the selector is transmitted based on changes in light intensity or blinking of the semiconductor light-emitting source.

6. The electric bulb according to claim 5, wherein:
   the electric power is AC power;
   the electric bulb comprises an AC-DC converter that converts AC power to DC power; and
   the superimposing means superimposes a data component selected by the selector on the DC power, which is provided by the AC-DC converter, and drives the semiconductor light-emitting source by the resulting superimposed DC power.

7. A lighting device, which is adapted to be used in a broadcast system according to claim 1, and receives supplied electric power and makes a semiconductor light-emitting source emit light for lighting, comprising:
   a selector that selects one or more of a plurality of pieces of modulated data to be transmitted in the form of light, which are superimposed on supplied electric power; and
   a superimposing means for superimposing a signal of the selected data onto a voltage to be applied to the semiconductor light-emitting source,
   wherein the data selected by the selector is transmitted based on changes in light Intensity or blinking of the semiconductor light-emitting source.

8. The lighting device according to claim 7, wherein:
   the electric power is AC power;
   the electric bulb comprises an AC-DC converter that converts AC power to DC power; and
   the superimposing means superimposes a data component selected by the selector on the DC power, which is provided by the AC-DC converter, and drives the semiconductor light-emitting source by the resulting superimposed DC power.

* * * * *